US008183516B2

(12) United States Patent
Augusto

(10) Patent No.: US 8,183,516 B2
(45) Date of Patent: *May 22, 2012

(54) LAYOUTS FOR THE MONOLITHIC INTEGRATION OF CMOS AND DEPOSITED PHOTONIC ACTIVE LAYERS

(75) Inventor: Carlos J. R. P. Augusto, San Jose, CA (US)

(73) Assignee: Quantum Semiconductor LLC, San Jose, CA (US)

( * ) Notice: Subject to any disclaimer, the term of this patent is extended or adjusted under 35 U.S.C. 154(b) by 681 days.

This patent is subject to a terminal disclaimer.

(21) Appl. No.: 11/572,525

(22) PCT Filed: Jul. 28, 2005

(86) PCT No.: PCT/EP2005/008182
§ 371 (c)(1),
(2), (4) Date: Jan. 23, 2007

(87) PCT Pub. No.: WO2006/010615
PCT Pub. Date: Feb. 2, 2006

(65) Prior Publication Data
US 2007/0194213 A1 Aug. 23, 2007

Related U.S. Application Data

(60) Provisional application No. 60/591,652, filed on Jul. 28, 2004.

(51) Int. Cl.
*H01L 31/00* (2006.01)
*H01L 31/107* (2006.01)

(52) U.S. Cl. ................................. 250/214.1; 257/438
(58) Field of Classification Search ............... 250/208.1, 250/214.1; 257/438, 431
See application file for complete search history.

(56) References Cited

U.S. PATENT DOCUMENTS

| 5,929,845 A * | 7/1999 | Wei et al. ................ 345/156 |
| 7,038,235 B2 * | 5/2006 | Seitz ....................... 257/40 |
| 2002/0149555 A1 * | 10/2002 | Kimura ..................... 345/97 |
| 2003/0020084 A1 * | 1/2003 | Fan et al. ................... 257/92 |

FOREIGN PATENT DOCUMENTS

| EP | 1246250 | 2/2002 |
| WO | WO 0233755 A2 * | 4/2002 |
| WO | WO2004027879 | 1/2004 |
| WO | WO2004054001 | 6/2004 |

* cited by examiner

*Primary Examiner* — Thanh X Luu
(74) *Attorney, Agent, or Firm* — Sturm & Fix LLP

(57) ABSTRACT

Several detailed layout designs are disclosed, for the monolithic integration of avalanche devices in large arrays, that can be operated as Avalanche Photo-Diodes (APDs) or Avalanche Light Emitting Diodes (ALEDs) depending only on the applied bias conditions, which can be software-controlled from peripheral circuitry. If the deposited films have direct bandgaps, then the devices can emit light even in the absence of avalanche operation. In particular, the layouts according to the invention comprise a sensor/emitter matrix achieved through the replication of basic Pixel/Lixel cells.

26 Claims, 63 Drawing Sheets

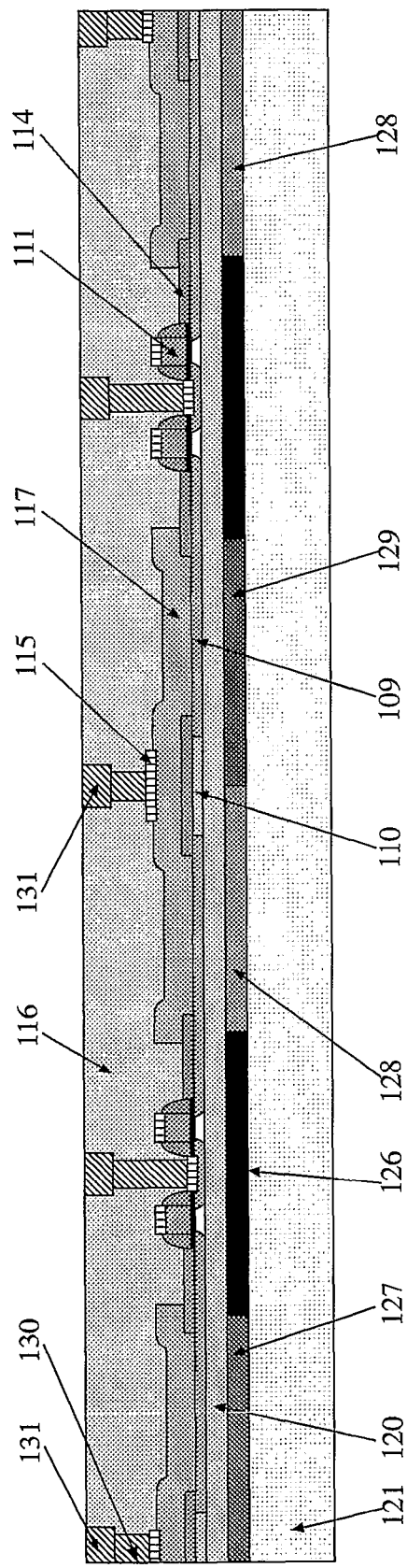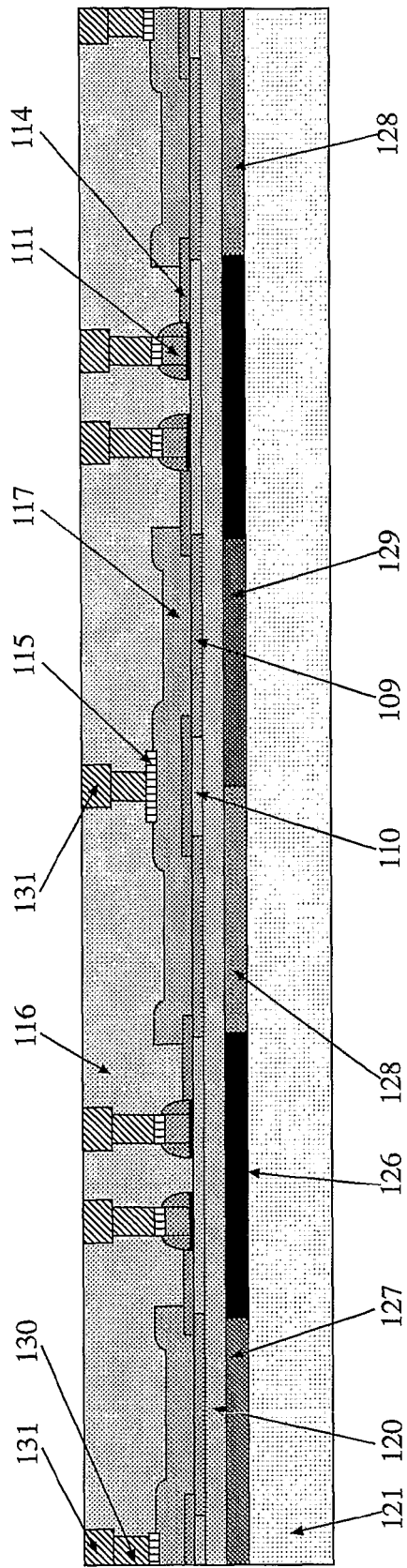
Figure 13A
Figure 13B

LAYOUTS FOR THE MONOLITHIC INTEGRATION OF CMOS AND DEPOSITED PHOTONIC ACTIVE LAYERS

BACKGROUND OF THE INVENTION

The present invention relates to the fabrication of CMOS-based light-sensing and light-emitting devices, and in particular to layouts for the fabrication of such devices.

Conventional CMOS image sensors use of the built-in pn-junction formed by the source/drain and potential-well regions (n-type or p-type) of MOSFETs as the photo-diode. For that reason many important characteristics of the photo-diode are coupled to the design of CMOS devices. CMOS image sensors enable "active pixels", in which one of more CMOS devices are used for the electronic amplification of the photo-generated signal. The readout process is non-destructive and consists in transferring the photo-generated charges to the gate of a MOSFET whose transconductance translates those charges into a voltage or current. The junction used as storage node must be reset before a subsequent image acquisition.

Other drawbacks of conventional CMOS image sensors include: (1) High source/drain junction capacitance tied to CMOS design, resulting in low "charge-to-voltage" conversion efficiency; (2) Crosstalk under STI, between adjacent pixels; (3) Time integration at the pixel of photo-generated signals does not favor "Time-Of-Flight" (TOF) measurements that enable 3-dimensional image sensing; (4) Conventional layouts and peripheral circuitry do not allow the aggregation of signals from several pixels to trade resolution versus signals strength or bandwidth.

In conventional CMOS image sensors the junction performing photo-detection is in the substrate bulk, cannot be run in the avalanche mode, and cannot be bandgap engineered. It has been known since the early times of semiconductor technology that indirect bandgap materials, such as silicon and germanium, can emit light when pn-junctions are operated in the avalanche mode. For a number of reasons, conventional CMOS and BiCMOS technologies have not lead to the practical use of such capability.

SUMMARY OF THE INVENTION

An object of the present invention is to provide imaging devices, that can be operated in the avalanche mode, and that are monolithically integrated with submicron or sub-100 nm CMOS technologies. Several detailed layout designs are disclosed, for the monolithic integration of avalanche devices in large arrays, that can be operated as Avalanche Photo-Diodes (APDs) or Avalanche Light Emitting Diodes (ALEDs) depending only on the applied bias conditions, which can be software-controlled from peripheral circuitry. If the deposited films have direct bandgaps, then the devices can emit light even in the absence of avalanche operation.

In particular, the layouts according to the invention comprise a sensor/emitter matrix achieved through the replication of basic Pixel/Lixel cells. In image sensors, the matrix element is known as a "Pixel". In the present disclosure the name "Lixel" will be used for a matrix element that emits light. Because the same physical structure in the layouts of this invention can be operated as a sensor or as an emitter, the matrix elements will be designated as Pixels/Lixels, to emphasize the dual functionality that can be selected through the voltage applied to the APD/ALED layers.

For sake of clarity, it should be noticed that, each "Pixel/Lixel" consists of one row-select transistor and one photonic device that can be operated as an Avalanche Photo-Diode (APD) or an Avalanche Light Emitting Diode (ALED), and that a "Pixel/Lixel Cell" may comprise, in particular geometric (layout) arrangements, 1, 2 or 4 Pixels/Lixels. Then at the metallization level, the interconnects can be arranged in such a way as to link separately and in parallel groups of "Pixel/Lixel Cells" to identical blocks of column circuitry, thereby increasing the bandwidth of communication between the sensor/emitter matrix and the peripheral circuitry.

All the layouts, for devices made on bulk and Thick-Film SOI substrates, are based on the same method of contacting the bottom electrode of the photonic device (APD/ALED), and all of them are also meant for an architecture in which the top electrode is electrically common to all photonic devices, while the bottom electrode is electrically separated for each individual Pixel/Lixel. There is also an exemplary layout for Thin-Film SOI or GOI substrates.

Another object of the present invention is a combination of a sensor/emitter matrix and mode of operation that enables the dynamic control through software, of the grouping of four Pixels/Lixels into a single output/input signal. This capability delivers a variable Pixel/Lixel size that can trade resolution for bandwidth (dynamic range and/or frame-rate).

Yet another object of the present invention is a color filter pattern that makes possible for four pixels of the same primary color to be adjacent to each other, and thus be grouped together as a single "Macro-Pixel" for one particular primary color, that is, this color filter pattern enables a variable pixel size.

Yet another object of the present invention is a design of layout of metal layers that enables the grouping, at a given metal level, of individual cells into groups of cells, in the same vertical column of Pixels/Lixels. Different groups of cells are electrically connected to separate metal lines, that carry in parallel signals from different groups of cells, from/to the column circuitry.

A separate international application entitled "Light Emitting Elements (Lixels) Monolithically Integrated with CMOS" covers the impact on the operation of these devices as light absorbers and light emitters, on whether the deposited photonic active layers have indirect, direct or pseudo-direct bandgaps.

BRIEF DESCRIPTION OF THE DRAWINGS

In FIG. 11A the horizontal cut is through a region in which the N-MOSFET gates are on active areas, while in FIG. 11B the horizontal cut is through a region in which the N-MOSFET gates are on field isolation areas.

In FIG. 12A the horizontal cut is through a region in which the N-MOSFET gates are on active areas, while in FIG. 12B the horizontal cut is through a region in which the N-MOSFET gates are on field isolation areas.

FIGS. 13A and 13B show cross section views of a third example of implant and epitaxial layer configuration of a 2-Pixel/Lixel cell, made on Thin-Film SOI or GOI substrates, with shared source contact at mid-distance between gates, such as those of Pixel/Lixel Design #2 and #3. In FIG. 13A the horizontal cut is through a region in which the N-MOSFET gates are on active areas, while in FIG. 13B the horizontal cut is through a region in which the N-MOSFET gates are on field isolation areas.

FIGS. 14A and 14B show color filter patterns. FIG. 14A shows a conventional color filter pattern, showing 4 primary colors: Red (R), Green (G), Blue (B) and Infra-Red (IR). The geometric arrangement is similar to that of the Bayer pattern, with an optional replacement of the second Green filter by an Infra-Red (IR) filter. FIG. 14B shows the new color filter pattern.

DETAILED DESCRIPTION OF THE INVENTION

Figure 1A:
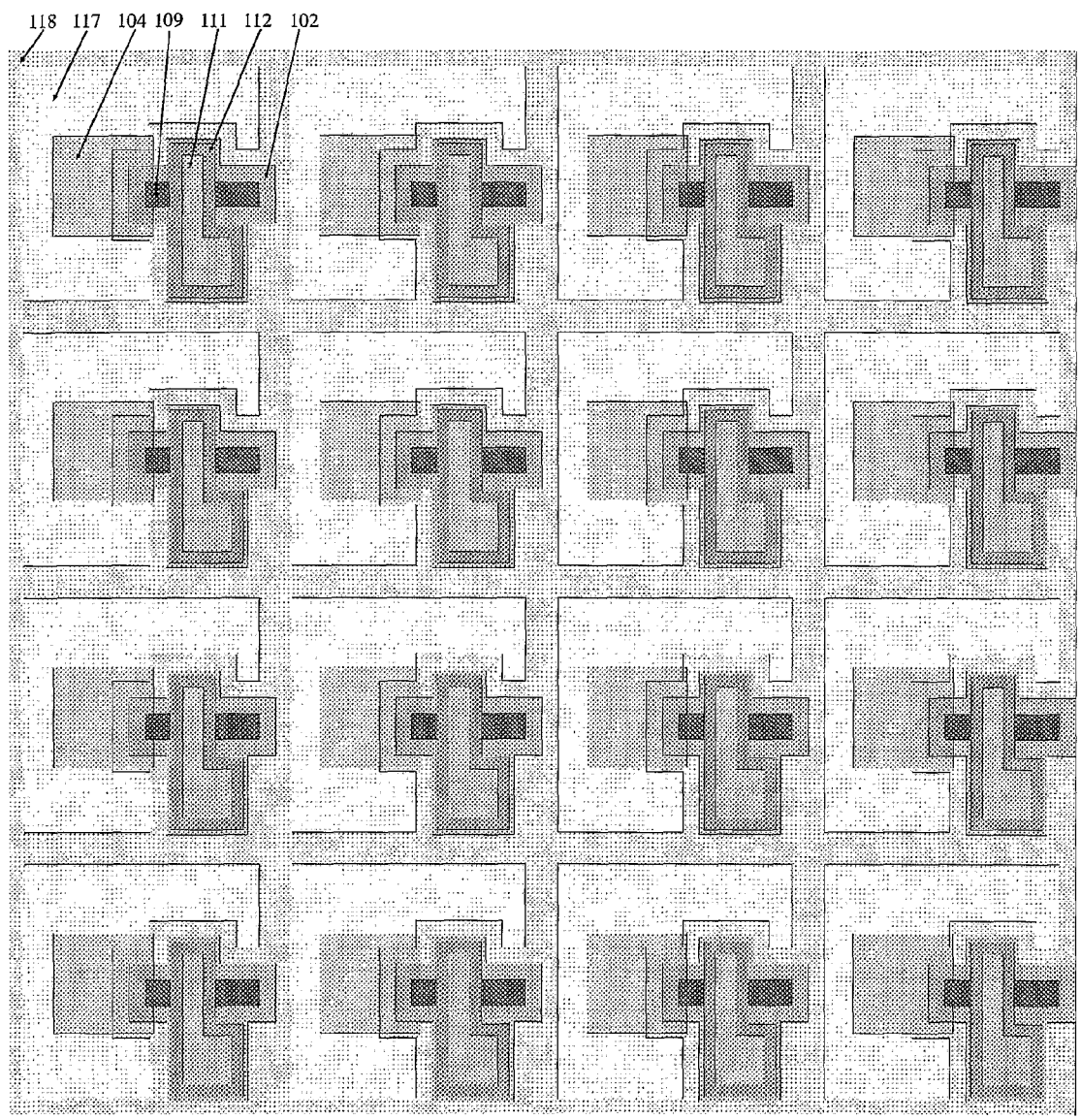
FIGS. 1A, 1B, 1C, 1D and 1E provide top views of the layout of Pixel/Lixel Design #1, made on bulk substrates, corresponding to the cross section of FIGS. 11A and 11B, at different stages of the fabrication. An exemplary matrix with 4 rows and 4 columns is shown.
Figure 1B:
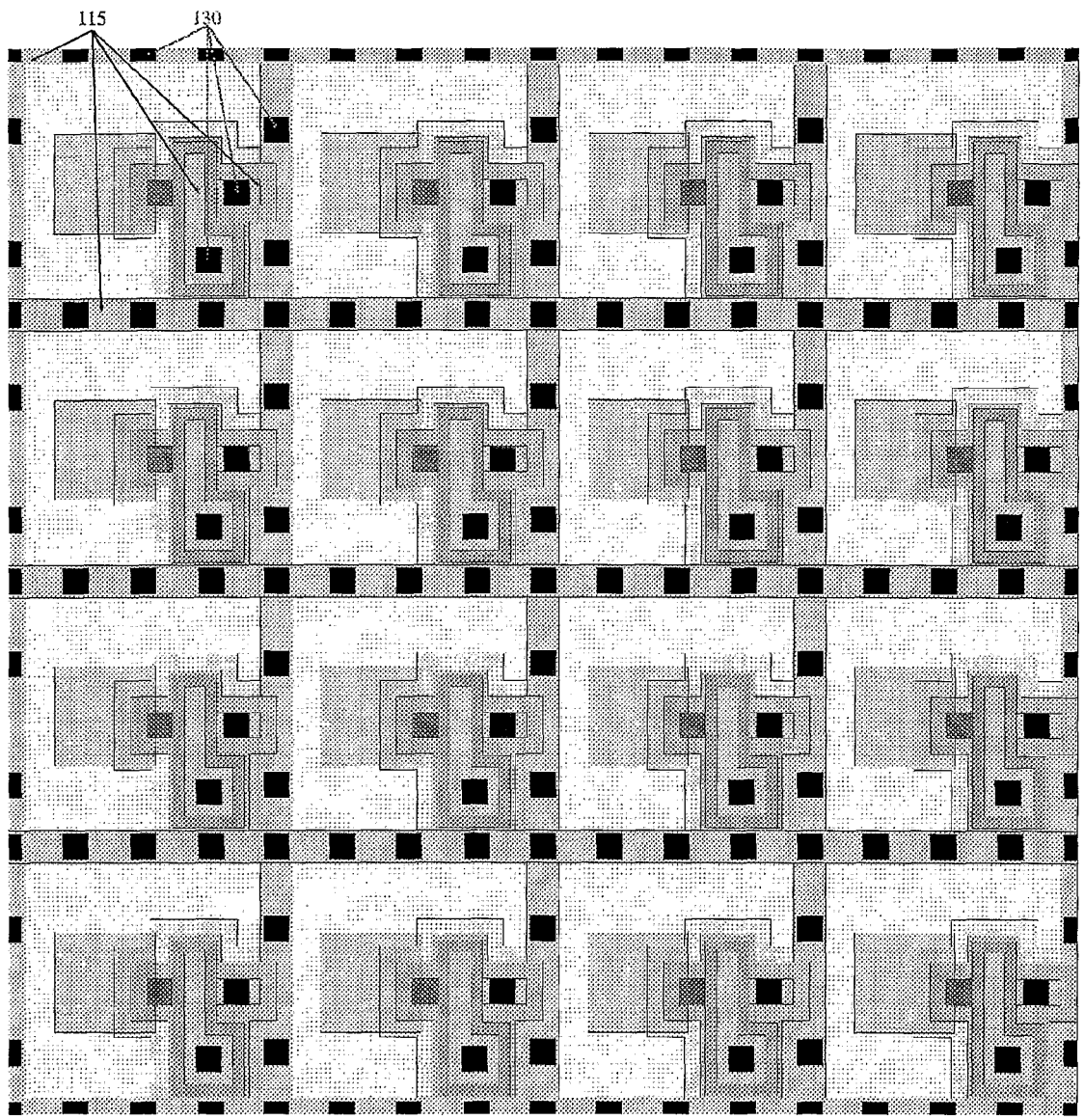

The present invention is based by the invention of WO 02/33755, which discloses a device and process architectures suitable for the monolithic integration of deep sub-micron CMOS technology, including sub-100 nm CMOS technology, with optoelectronic devices having active layers deposited on CMOS active areas. One example of such devices is an Avalanche Photo-Diode (APD) incorporating epitaxial SiGeC layers.

The device and process architectures disclosed in WO 02/33755 show how single-crystal p-type SiGe and/or SiGeC epitaxial films can be epitaxially deposited on n-type CMOS active areas, forming a pn-heterojunction that is separated, by shallow trench isolation (STI), from the neighboring CMOS devices. For this reason it can be run in the avalanche mode, unlike conventional CMOS junctions, thus unlike conventional CMOS photo-diodes. The p-type SiGe and/or SiGeC is the top electrode of the APD and the n-type CMOS active area is the bottom electrode of the APD. The top electrode of the APD can be contacted over a filed isolation area, and the bottom electrode of the APD can be made in a way similar to that of a contact to the n-Well of a conventional PMOS device, outside the active area of the APD itself.

The ability to have active layers with materials other than pure silicon, is brought by the deposition of said layers at a point in the process flow that is after all high temperature steps, and just before the typical steps for device interconnecting (silicide formation) are done.

The "insertion" point for these films in the process flow enables the incorporation of layers with a certain degree of strain, such as $Si_{1-x}Ge_x$, $Si_{1-y}C_y$, $Si_{1-x-y}Ge_xC_y$, $Ge_{1-y}C_y$, strained random alloys and/or superlattices, which are fully compatible with conventional CMOS processing, as it is proven by the availability of SiGeC BiCMOS as a mass production technology. It also allows the incorporation of films that, although presently not considered standard in CMOS technology, nonetheless from a pure technical standpoint are in fact compatible, or can be made compatible with minor adjustments to the CMOS flow. The key issue for the compatibility of some of these films with CMOS, is the thermal treatment after their deposition. As processing temperatures are lowered with each new CMOS generation, so grows the list of potential materials to be incorporated.

In particular, the present invention relates to the design of sensor/emitter matrix elements or cells, consisting of one Row-Select Transistor (RST) and one photonic device Avalanche Photo-Diode/Avalanche Light Emitting Diode (APD/ALED). In image sensors, the matrix element is known as a "Pixel". In the present disclosure the name "Lixel" will be used for a matrix element that emits light. Because the same physical structure can be operated as a sensor or as an emitter, the matrix elements will be designated as Pixels/Lixels, to emphasize the dual functionality that can be selected through the voltage applied to the APD/ALED layers.

For image sensing in the designs according to this invention, the photo-generated signal is amplified by the avalanche process and requires neither an in-pixel transistor for amplification, nor an in-pixel transistor for reset.

All the designs as disclosed, for bulk and Thick-Film SOI substrates, are based on the same method of contacting the bottom electrode of the photonic device (APD/ALED), and all of them are also meant for an architecture in which the top electrode is electrically common to all photonic devices (APD/ALED), while the bottom electrode is electrically separated for each individual pixel.

The designs are exemplified with an implementation in which the top electrode is a p-type SiGeC epitaxial layer, and the bottom electrode is contacted through a CMOS n-Well, which also provides the electrical contact to the drain of the NMOS row-select transistor. The present invention is equally valid for n-type SiGeC epitaxial layers, PMOS row-select transistors, and p-Well implants to form contacts between the PMOS device and the bottom electrode of the photonic device. The present invention is equally valid for photonic devices with deposited layers that may or may not be epitaxial, and with films of materials other than SiGeC.

The designs for bulk substrates and Thick-Film CMOS, are exemplified using typical technologies, featuring a p-type substrate and dual wells, and using in-situ p-type doped SiGe and/or SiGeC single crystal films epitaxially deposited on n-type doped CMOS active areas. Naturally the same Pixel/Lixel designs are also valid with n-type substrates and n-type doped SiGe and/or SiGeC single crystal films epitaxially deposited on p-type doped CMOS active areas.

The preferred implementation is with heterojunctions formed by the p-type SiGeC layer and the n-type silicon substrate, operated at voltages such that the junction can be operated in the avalanche mode. As a light-sensor, the operating voltage will be below the breakdown voltage of the junction, and this will be an Avalanche Photo-Diode, in which the avalanche effect multiplies the photo-generated carriers. As a light-emitter with an indirect bandgap semiconductor, such as p-type SiGeC random alloy with a triangular profile, the applied voltage brings the junction to a breakdown to trigger light emission.

The relative dimensions used in the exemplary drawings are not specific to a particular process technology, but can be considered "typical" for deep sub-micron CMOS generations using shallow trench isolation (STI), such as 0.18 μm CMOS on bulk silicon wafers.

All the layouts according to the invention on bulk substrates have the following common characteristics:
1. The APD/ALED is fabricated on an active area adjacent to, but separated from, the active area of the Row-Select NMOS transistor.
2. The APD/ALED consists of single crystal, in-situ p-type doped SiGeC film epitaxially deposited on a n-type doped CMOS active area formed on a p-type substrate.
3. The top electrode of each APD/ALED is the p-type doped SiGeC film.
4. The bottom electrode of each APD/ALED is the n-type doped CMOS active area, under the p-type doped SiGeC film.
5. In a sensor/emitter matrix, the top electrodes of all APDs/ALEDs are connected together to the same potential.
6. N-type bottom electrode of APD/ALED is connected, under the STI, through the N-Well implant, to the drain region of the in-Pixel/Lixel NMOS.
8. The bottom electrode of the APD/ALED, and the n-Well connecting it to the drain of the NMOS, are surrounded by p-type regions.

One sensor/emitter matrix design for implementation with Thick-Film SOI substrates, and one sensor/emitter matrix for implementation with Thin-Film SOI or GOI substrates, are also described.

The main difference between the implementation on bulk and Thick-Film SOI substrates, is that with the latter, the n-Well and p-Wells reach the buried oxide, and the isolation between adjacent Pixel/Lixel active areas can be accomplished with Deep Trench Isolation (DTI) reaching the buried oxide of the SOI substrate, rather than Shallow Trench Isolation on a p-type substrate.

The main difference between the implementation on Thin-Film SOI or GOI substrates, with respect to the designs for bulk substrates, is related to the contact to the bottom electrode of the APD/ALED, and the lack of potential wells (n-Well or p-Well). After the silicide formation step, it can be identical to any of the other designs. However should be noticed that Thin-Film SOI substrates enable back-side illumination (absorption and/or emission), and thus allow for dense interconnects on the front-side, including the situation in which metal lines can be paced over the active areas of the APDs/ALEDs.

The implementations with Thick-Film SOI or Thin-Film SOI (or GOI) can have any of the Pixel/Lixel cells, with 1, 2 or 4 Pixels/Lixels, described for the implementations on bulk substrates, can be identical to those using bulk substrates after the silicide formation step, and can have any of the variations in layout for metallization described for implementations with bulk substrates. For sake of simplicity and compactness, the figures for the implementations with Thick-Film SOI or Thin-Film SOI (or GOI) show only the most relevant differences with respect to the implementations on bulk substrates.

Even for the implementations with bulk substrates, the layouts shown do not form the complete set of masking layers required for the complete fabrication process, but only the most relevant ones showing the innovative features described in the present invention.

WO 2004/027879 discloses device and process architectures suitable for the monolithic integration of sub-100 nm CMOS technology made on Thin-Film Silicon-On-Insulator (SOI) or Thin-Film Germanium-On-Insulator (GOI) substrates, with optoelectronic devices having active layers deposited on CMOS active areas.

The following is a list of materials and/or layers shown in top view and cross section figures describing the different Pixel/Lixel designs:
(101)—P-type bulk substrate.
(102)—Shallow Trench Isolation (STI) region.
(103)—P-Well region.
(104)—N-Well region.
(105)—P-type doped regions, isolating adjacent photo-diode active areas.
(106)—N-type doped active area for epitaxial layers of APDs/ALEDs.
(107)—Gate insulator (oxide) of MOSFET
(108)—Light-doped drain (LDD) region of N-MOSFET.
(109)—Active region of N-MOSFET, with high n-type doping.
(110)—Field Isolation of Thin-Film SOI (not necessarily STI or LOCOS).
(111)—Gate of N-MOSFET
(112)—Spacer (silicon nitride) around gate of N-MOSFET
(113)—Deep Trench Isolation (DTI).
(114)—Hard mask (e.g., silicon nitride) for epitaxy on patterned regions.
(115)—Silicide
(116)—Pre-Metal Dielectric (PMD).
(117)—Single-crystalline material, epitaxially deposited over active areas of APD/ALED.
(118)—Amorphous/poly-crystalline material, epitaxially deposited over field isolation areas.
(119)—N-type implanted active areas of APDs/ALEDs
(120)—Buried oxide of SOI substrates.
(121)—SOI mechanical substrate.

(126)—Light-blocking layer.
(127)—Color filter for Red.
(128)—Color filter for Green.
(129)—Color filter for Blue.
(130)—Contact(s)
(131)—Metal-1
(132)—Via-1
(133)—Metal-2
(134)—Via-2
(135)—Metal-3
(136)—Via-3
(137)—Metal-4
(138)—Via-4
(139)—Metal-5

Pixel/Lixel Design #1:

The sensor/emitter matrix is formed by replicating a basic cell comprising a single Pixel/Lixel with the characteristics described above.

FIGS. 1A, 1B, 1C, 1D, and 1E, provide top views of the layout of Pixel/Lixel Design #1, at different stages of the fabrication. An exemplary matrix with 4 rows and 4 columns is shown.

Figure 1C:
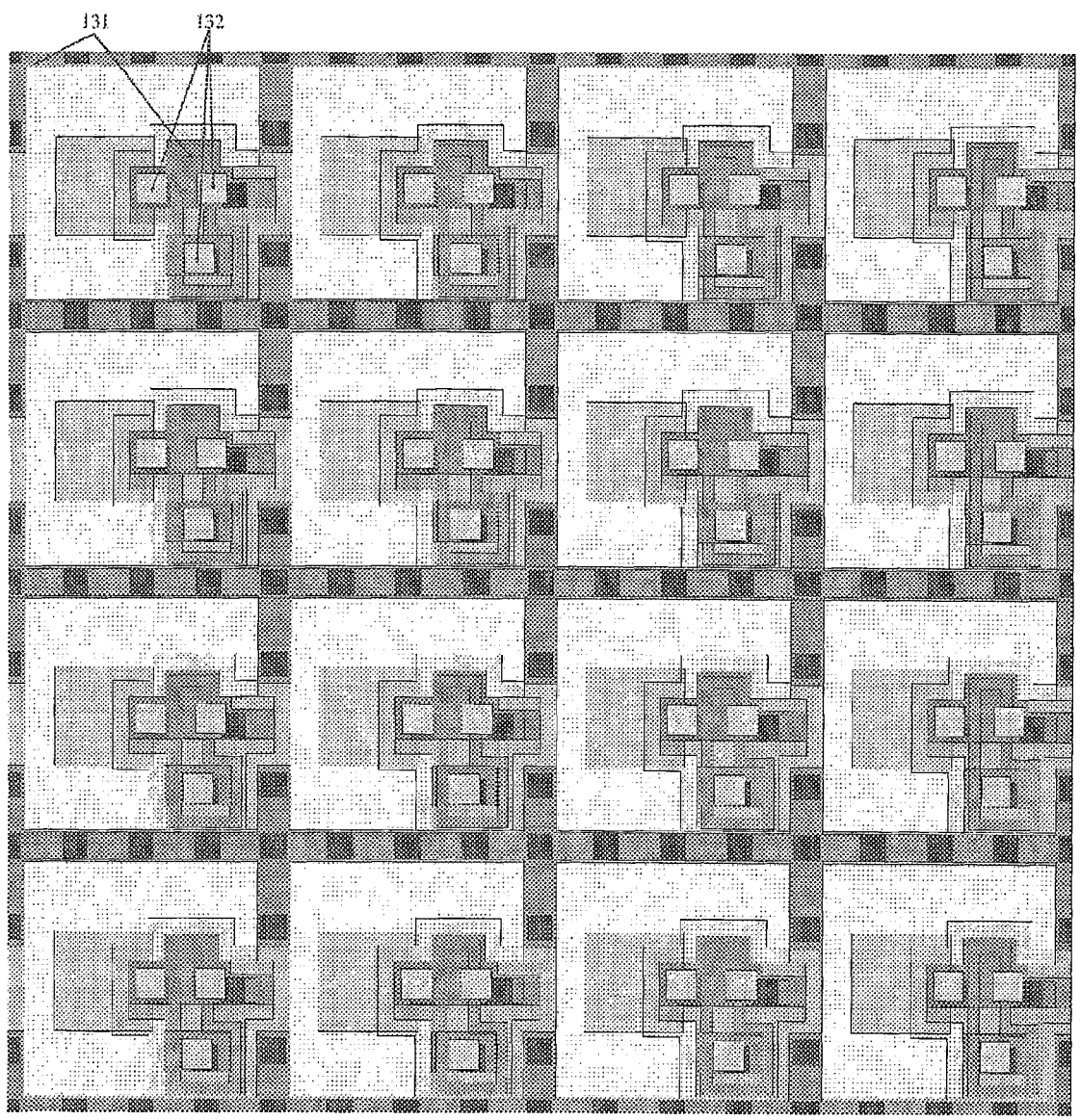
Figure 1D:
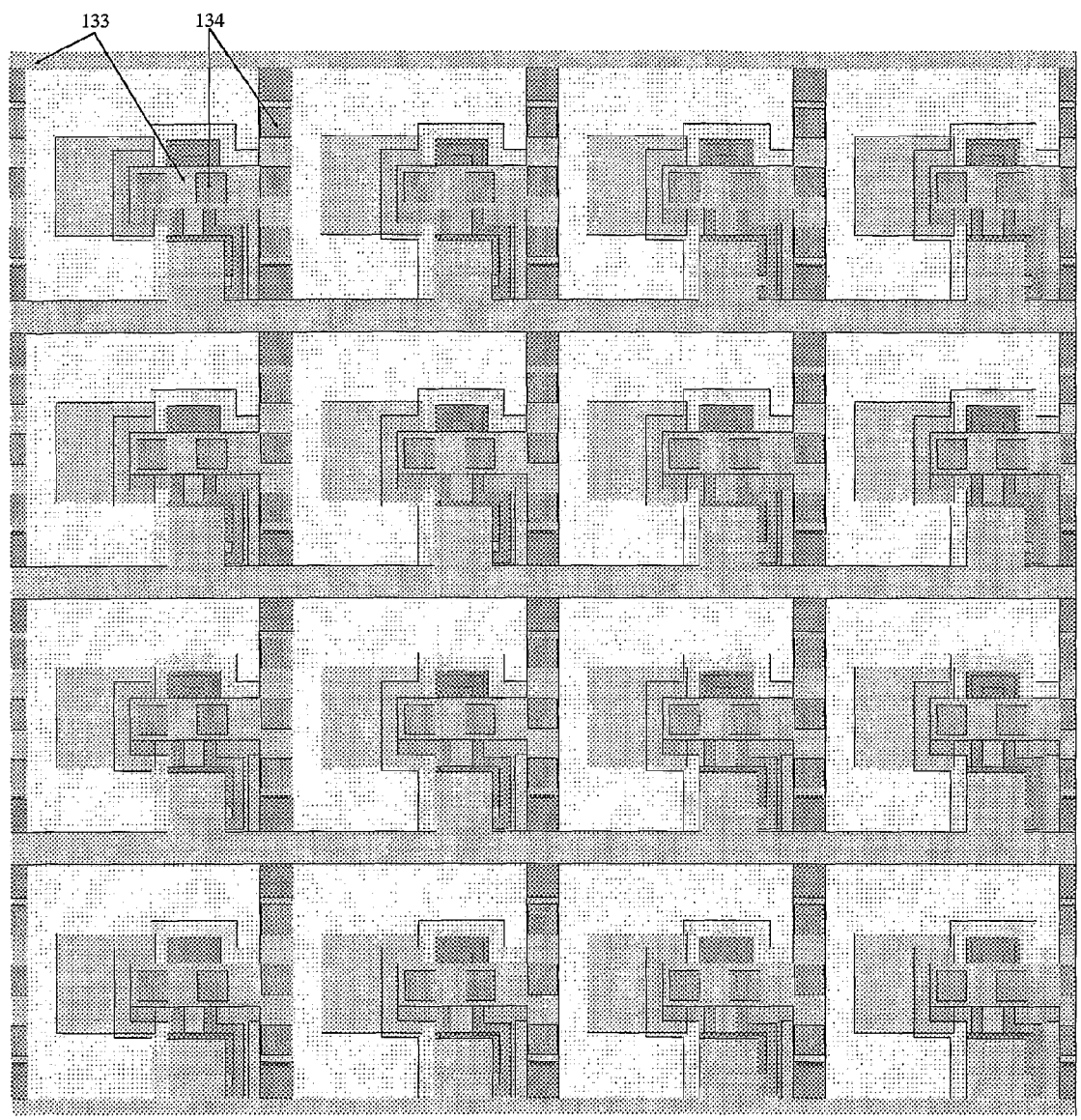
Figure 1E:
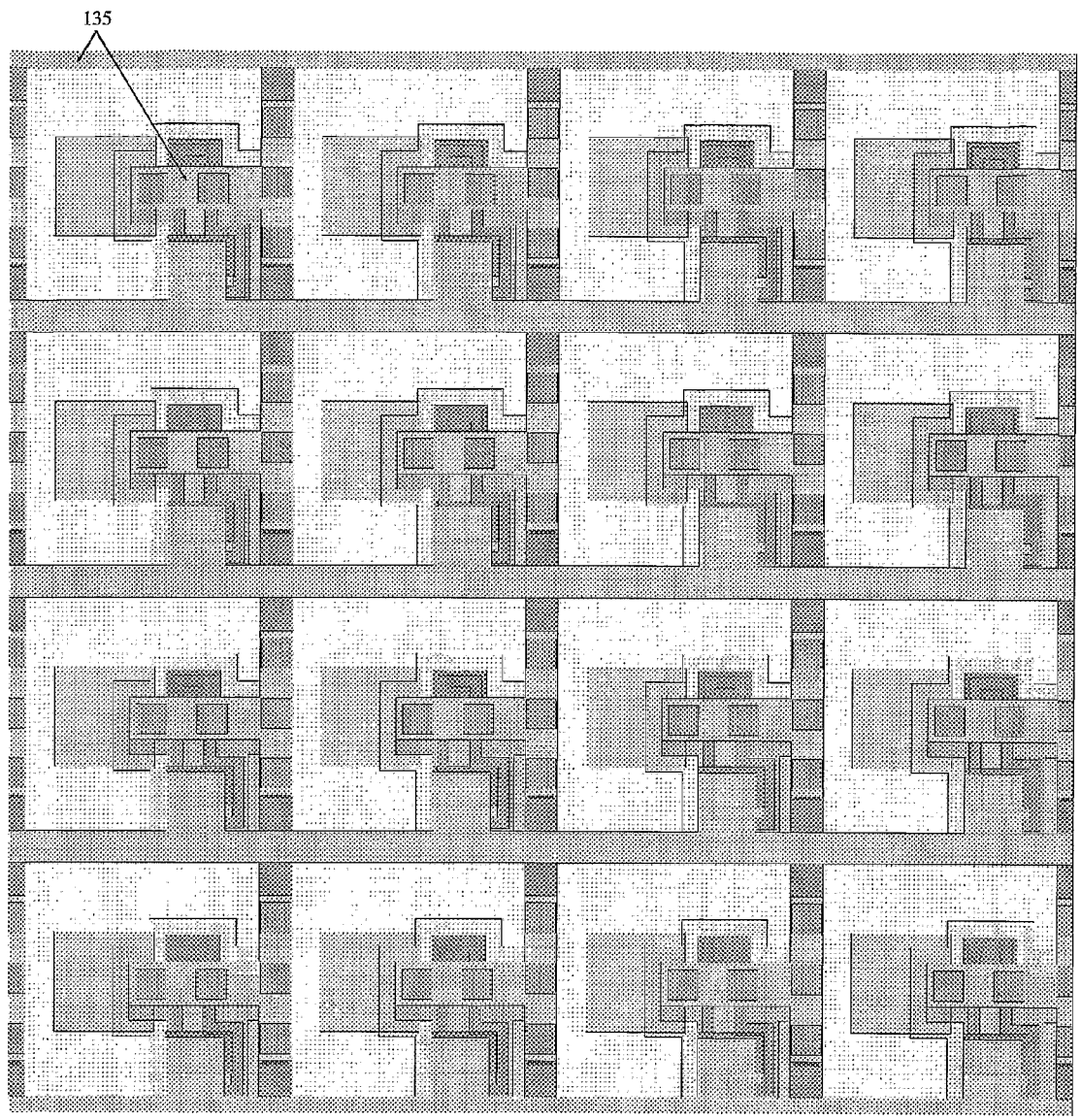

FIG. 1A—Top view of layout before Silicide formation.
FIG. 1C—Top view of layout after Metal-1 and Via-1.
FIG. 1D—Top view of layout after Metal-2 and Via-2.
FIG. 1E—Top view of layout after Metal-3.

Pixel/Lixel Design #2:

The sensor/emitter matrix is formed by replicating a basic cell comprising two adjacent Pixels/Lixels in the same horizontal row, having the following characteristics:

1. The two row-select NMOS transistors are fabricated on the same active area, share the same p-Well, and share the same source contact.
2. The gates of the two row-select NMOS transistors are controlled by two separate row-select lines.
3. The gates of the two row-select NMOS transistors are positioned in such way that the respective contact pads are on the same side of the shared active area.
4. The opposite ends of the common active area, the drain regions, overlap with the opposite n-Wells that provide conductive paths to the bottom electrodes of the respective APDs/ALEDs.
5. In the space between the two gates, the source region, is shared by both NMOS devices, and has a single contact, connected to a single vertical column metal line.
6. For any row in the matrix, the Pixels/Lixels in "Odd Columns" can be accessed when the "Odd Row-Select Signal" is ON, and the "Even Row-Select Signal" is OFF. Conversely, Pixels/Lixels in "Even Columns" can be accessed when the "Even Row-Select Signal" is ON, and the "Odd Row-Select Signal" is OFF.
7. The signals of four Pixels/Lixels from two cells, in two adjacent rows, forming a square, can be accessed simultaneously and combined, i.e. added, into a single output signal, by turning "ON" simultaneously the "Odd Row-Select Signals" and "Even Row-Select Signals" of the respective rows. It will be as if the output signal was produced by a single square Pixel/Lixel, with dimensions corresponding to the combined four Pixels/Lixels whose signal is added, thus providing the ability to have a variable Pixel/Lixel size.

FIGS. 2A, 2B, 2C, 2D, 2E, and 2F, provide top views of the layout of Pixel/Lixel Design #2, at different stages of the fabrication. An exemplary matrix with 4 rows and 4 columns is shown.

Figure 2A:
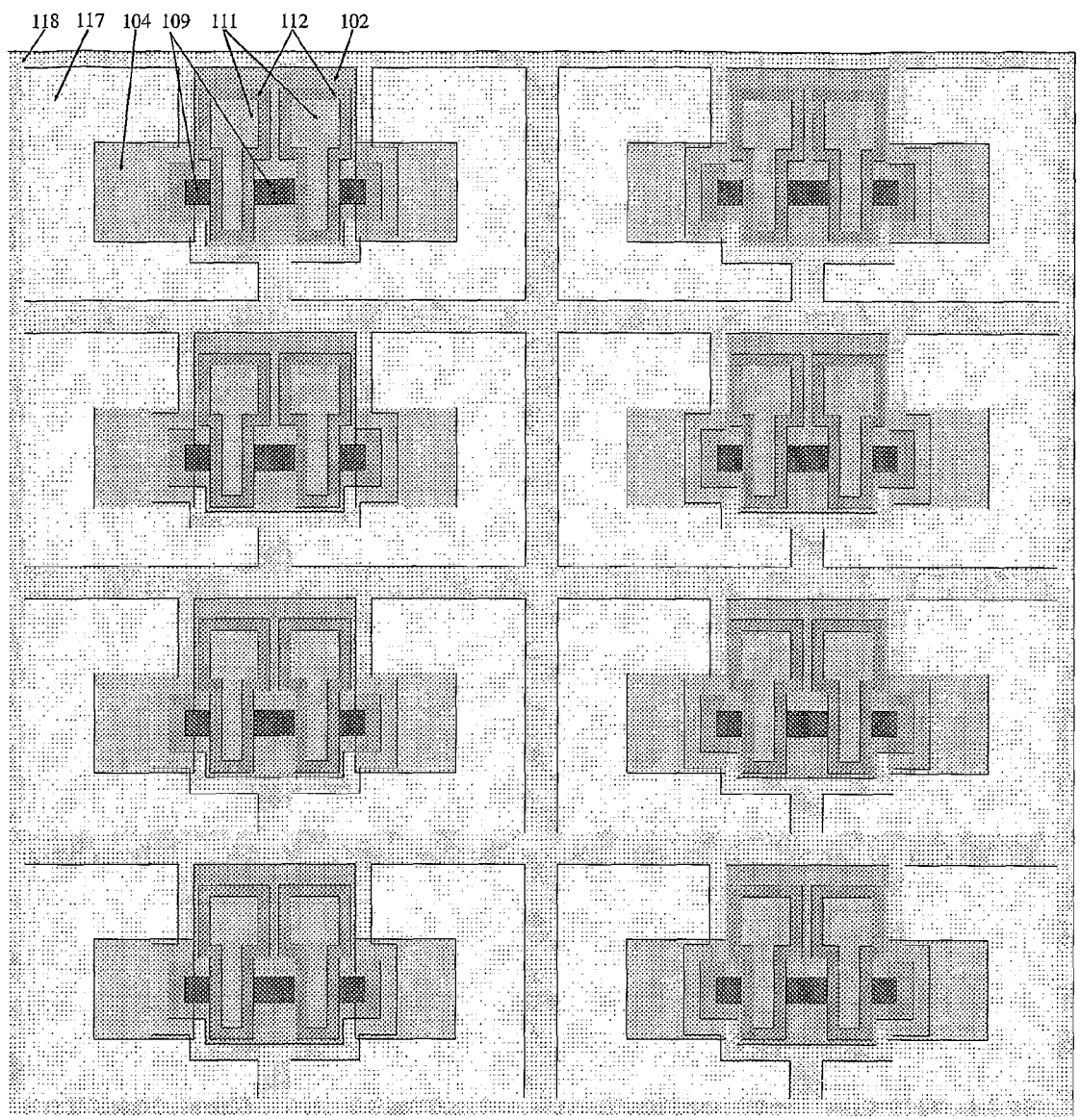
FIGS. 2A, 2B, 2C, 2D, 2E and 2F provide top views of the layout of Pixel/Lixel Design #2, made on bulk substrates, corresponding to the cross section of FIGS. 11A and 11B, at different stages of the fabrication. An exemplary matrix with 4 rows and 4 columns is shown.
Figure 2B:
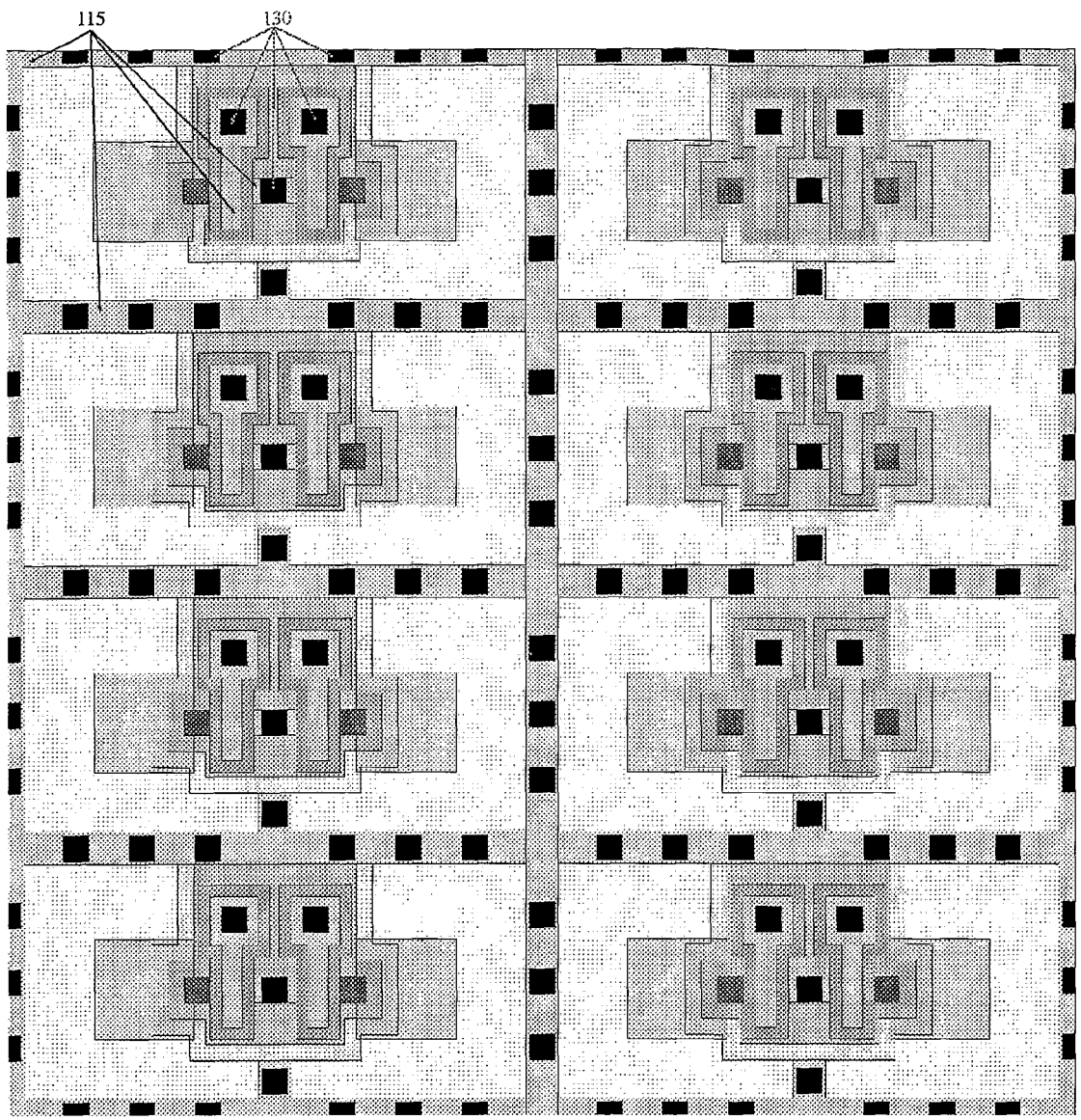
Figure 2C:
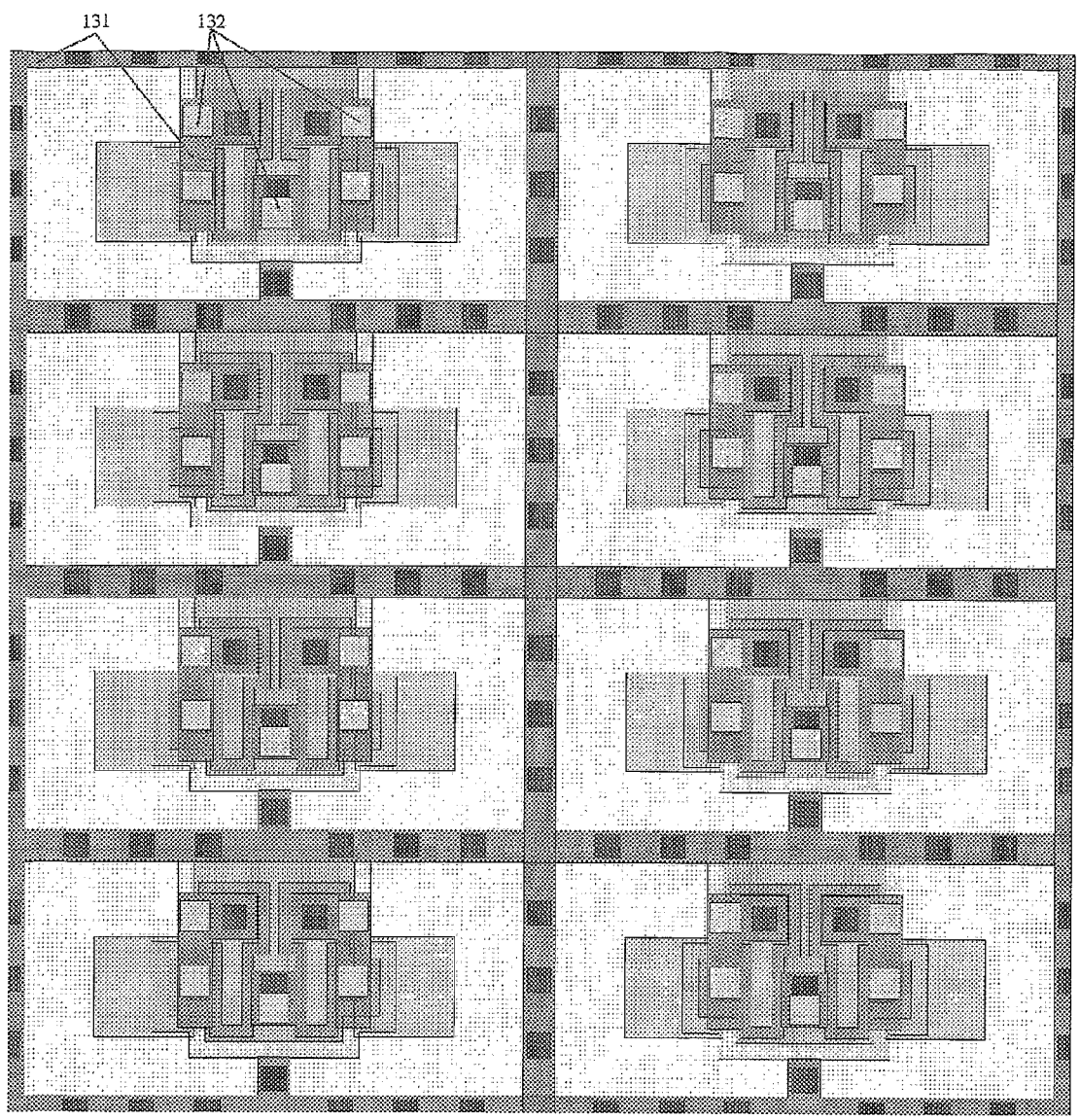
Figure 2D:
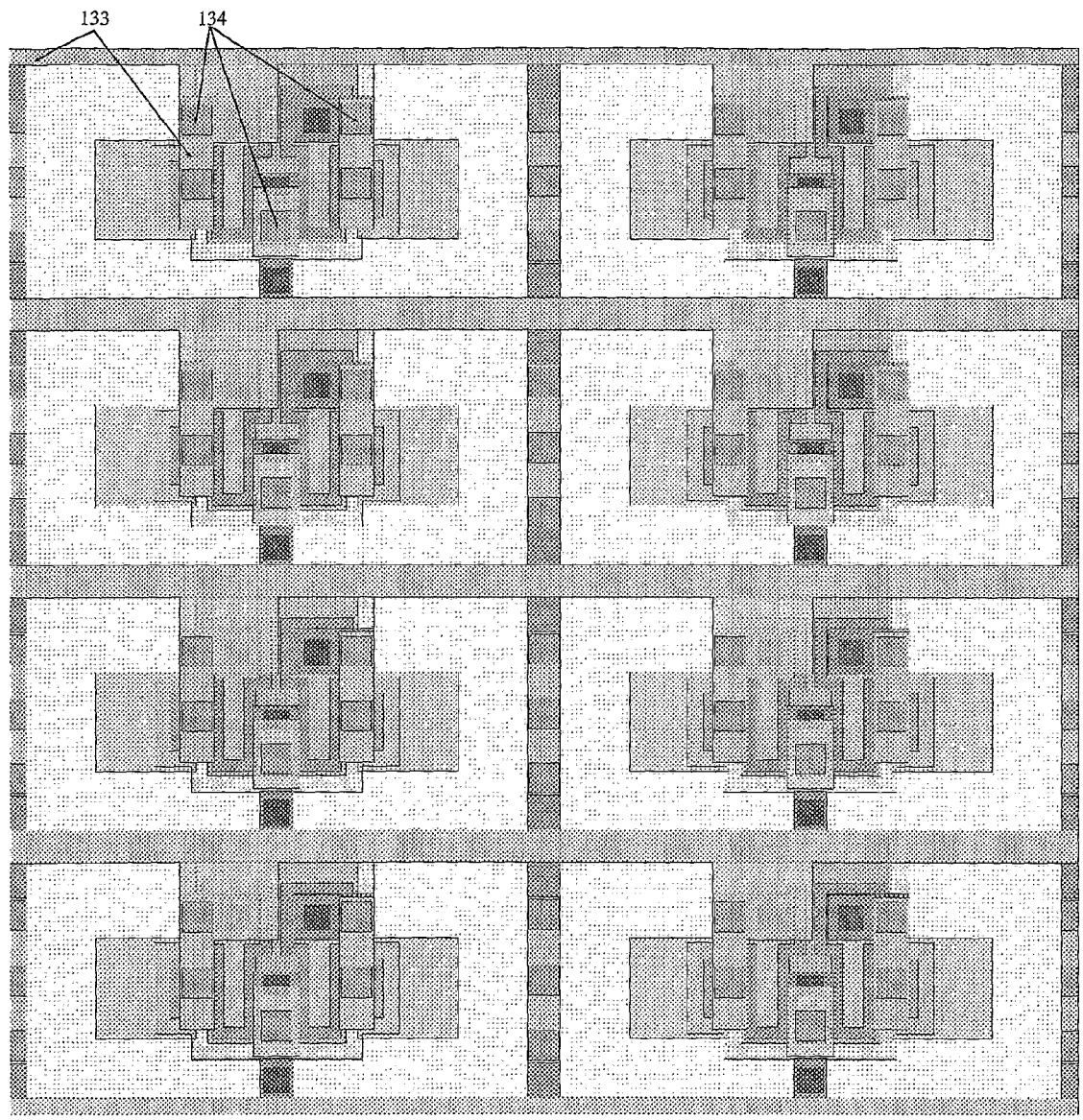
Figure 2E:
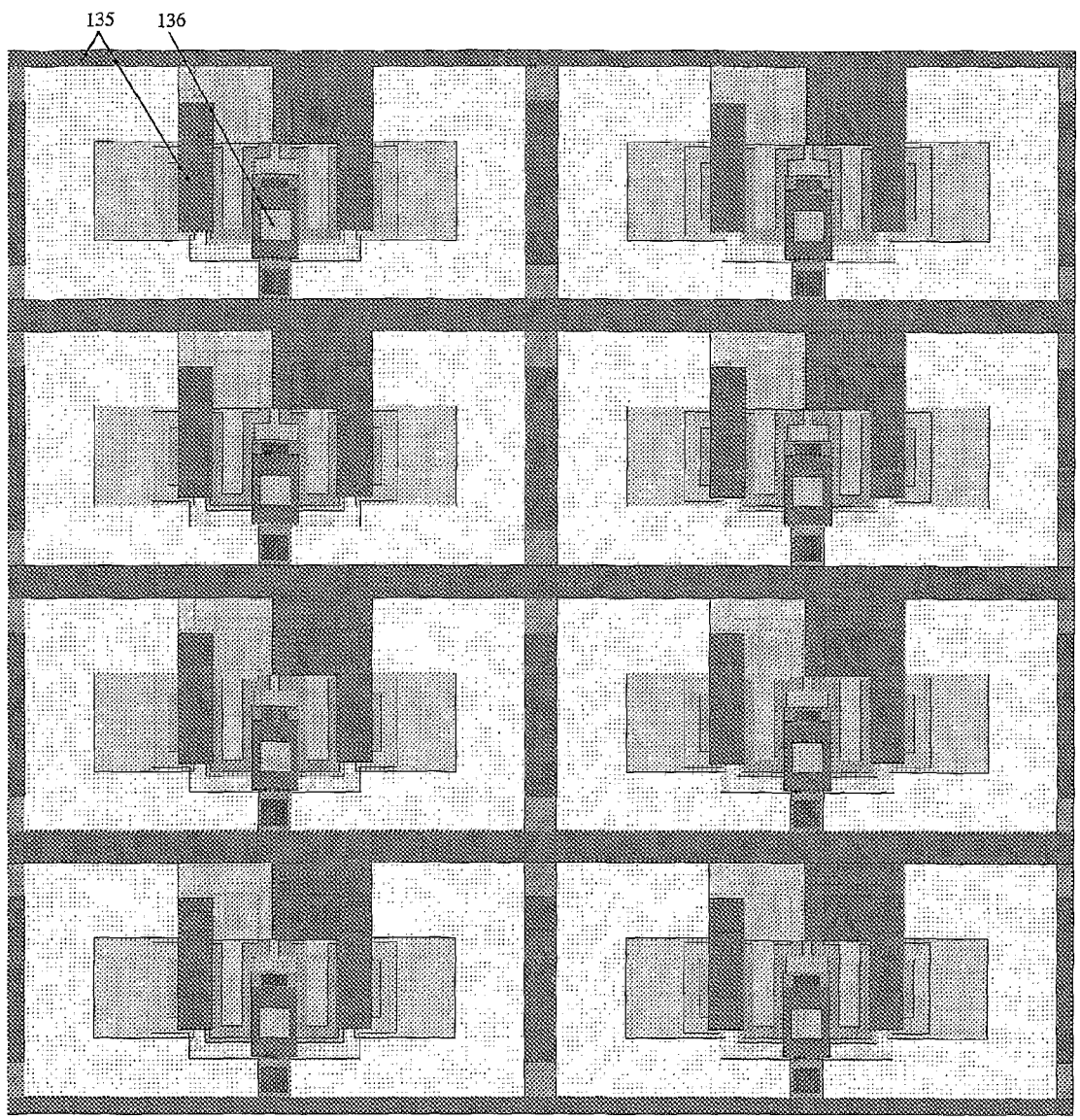
Figure 2F:
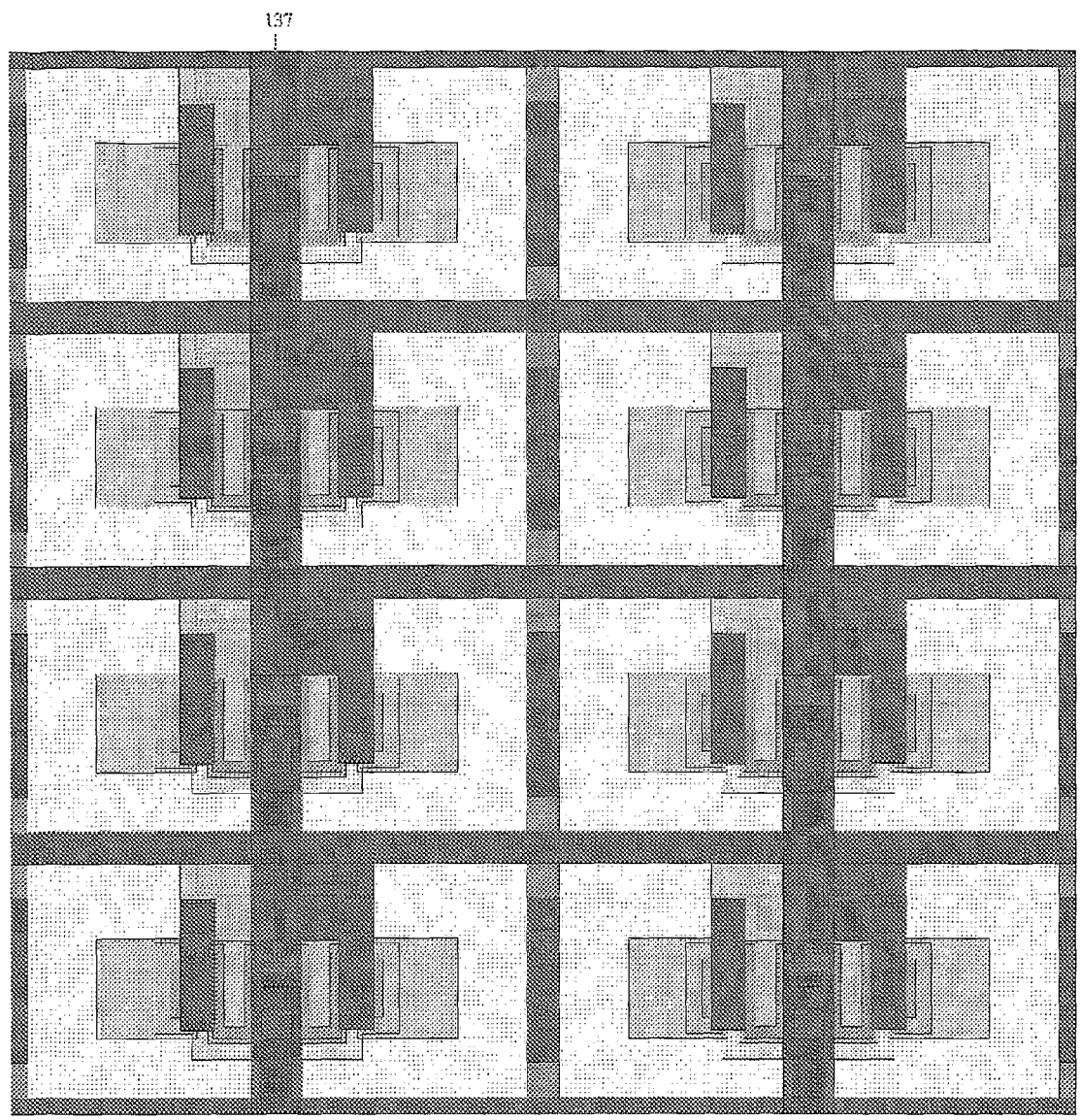

FIG. 2A—Top view of layout before Silicide formation.
FIG. 2B—Top view of layout after Silicide and Contacts
FIG. 2C—Top view of layout after Metal-1 and Via-1
FIG. 2D—Top view of layout after Metal-2 and Via-2
FIG. 2E—Top view of layout after Metal-3 and Via-3
FIG. 2F—Top view of layout after Metal-4

Pixel/Lixel Design #3:

Pixel/Lixel design #3 is identical to Pixel/Lixel Design #2 until Metal-2. The layouts of Metal-2, Via-2, Metal-3, Via-3, and Metal-4 layers are different and result in:

1. The number of column Metal-4 lines carrying the data signal, is identical to the number of Pixel/Lixel columns. This enables the halving of the number of Pixels/Lixels connected to a single Metal-4 data column line.
2. Compared to Pixel/Lixel Design #2, this layout doubles the available bandwidth between the sensor/emitter matrix and the periphery, provided that the "column circuitry" is also duplicated.
3. The bandwidth between the sensor/emitter matrix and the periphery can be further increased if another metal level is added. After Metal-4, each new metal level added can double the bandwidth. For example, Metal-5 can double the bandwidth available with Metal-4, while a Metal-6 layout can double the bandwidth available with Metal-5. The figures show only layers up Metal-4.

FIGS. 3A, 3B, 3C, 3D, 3E, and 3F, provide top views of the layout of Pixel/Lixel Design #3, at different stages of the fabrication. An exemplary matrix with 4 rows and 4 columns is shown.

Figure 3A:
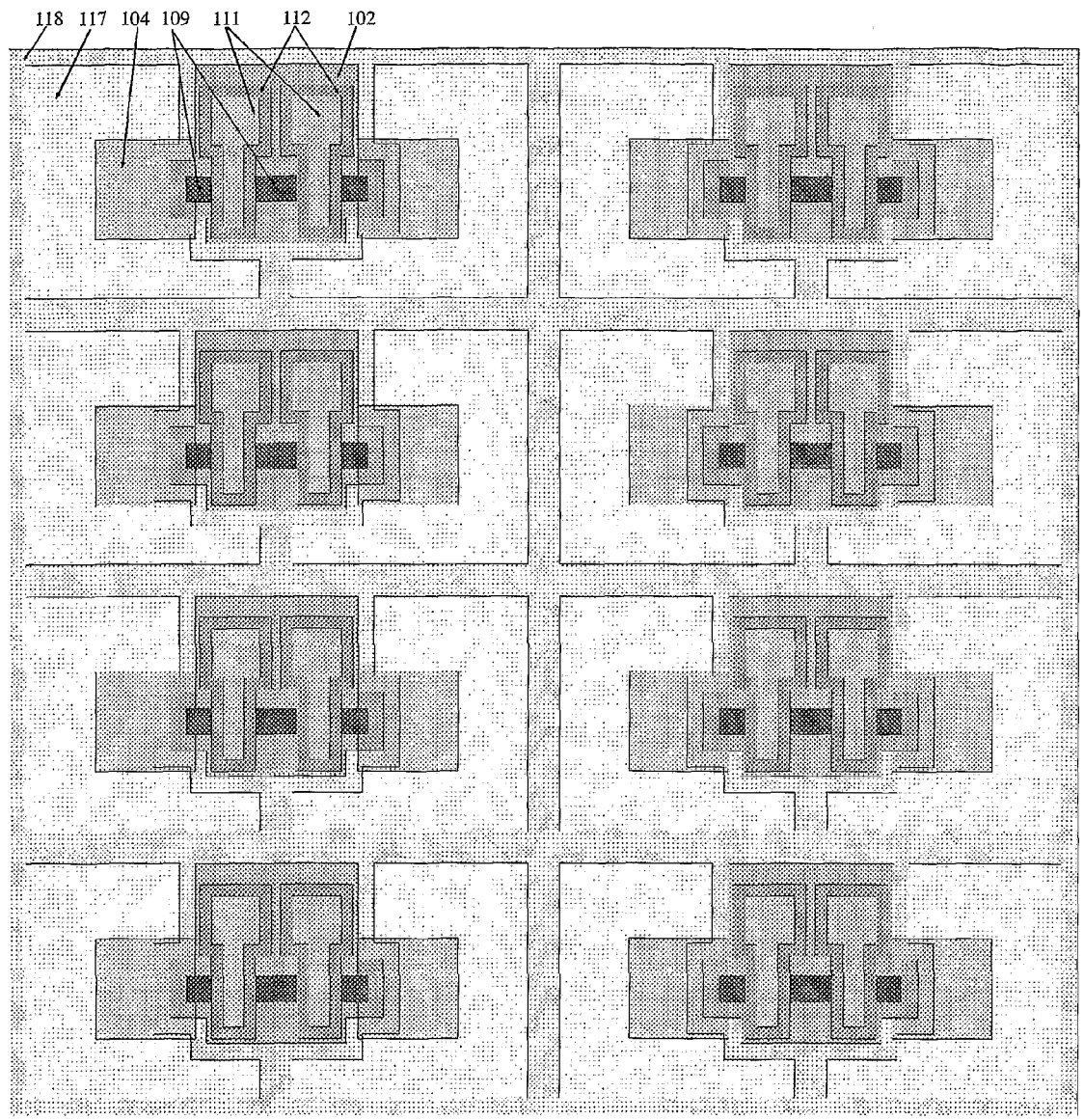
FIGS. 3A, 3B, 3C, 3D, 3E and 3F provide top views of the layout of Pixel/Lixel Design #3, made on bulk substrates, corresponding to the cross section of FIGS. 11A and 11B, at different stages of the fabrication. An exemplary matrix with 4 rows and 4 columns is shown.
Figure 3B:
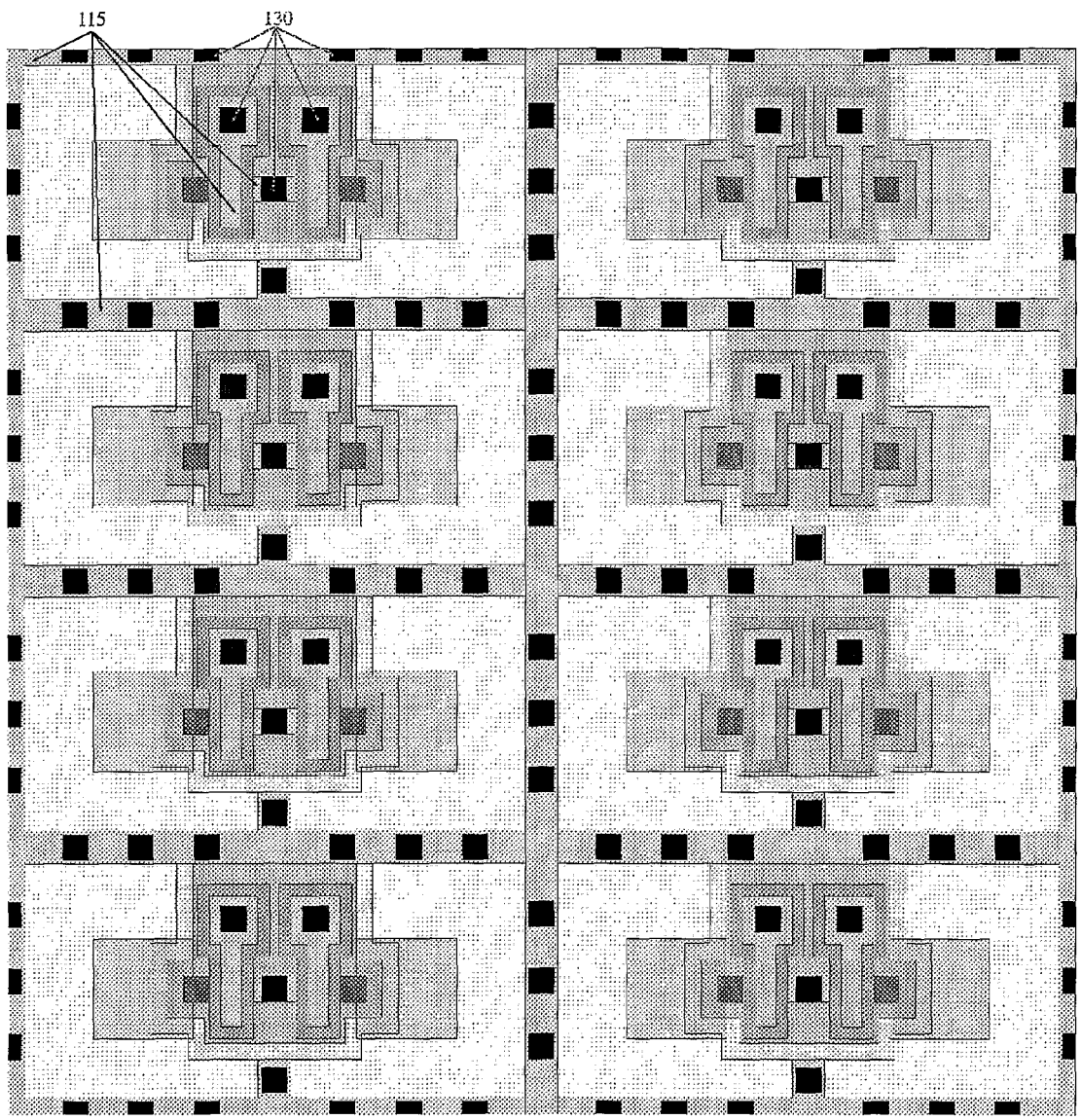
Figure 3C:
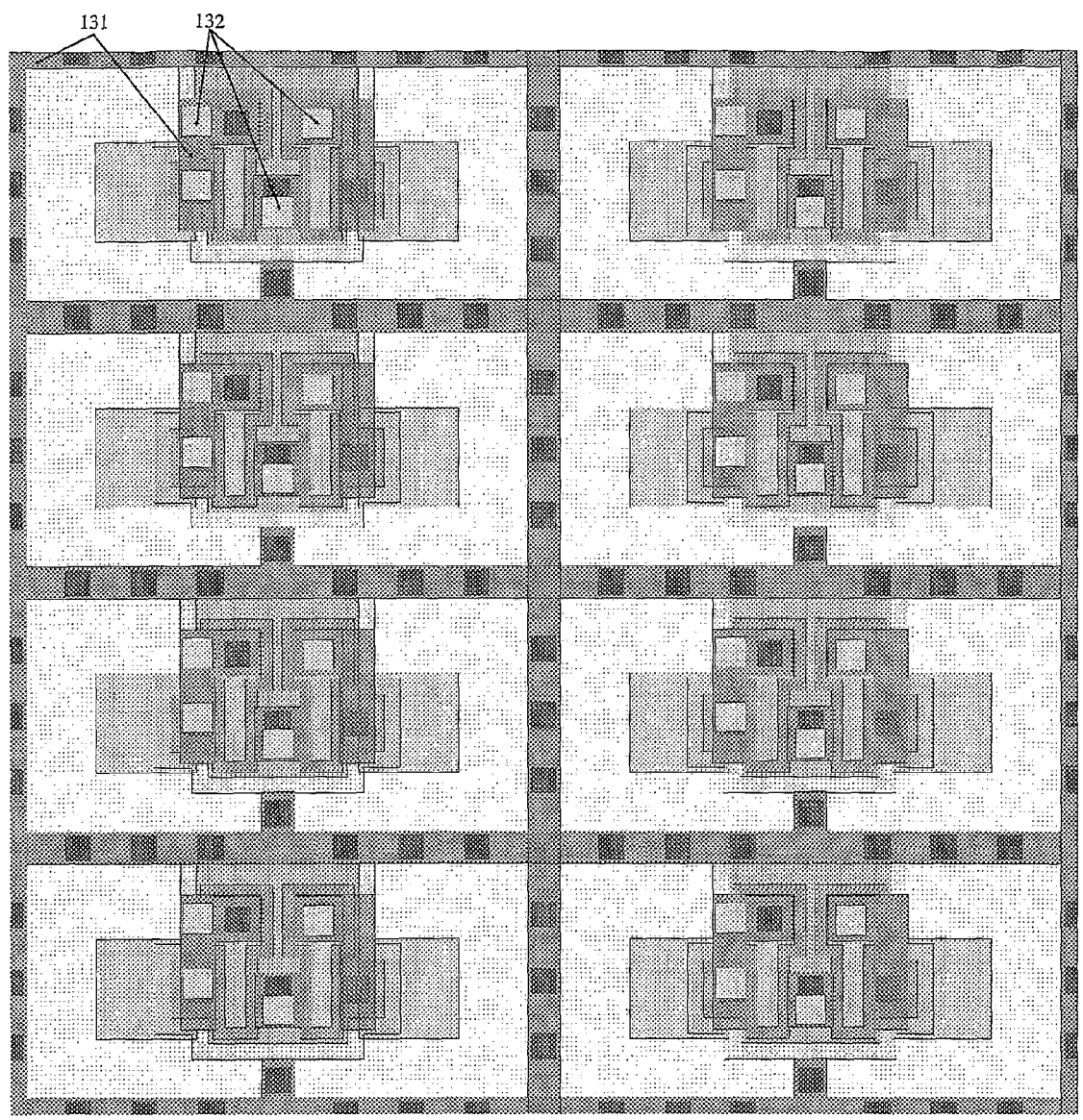
Figure 3D:
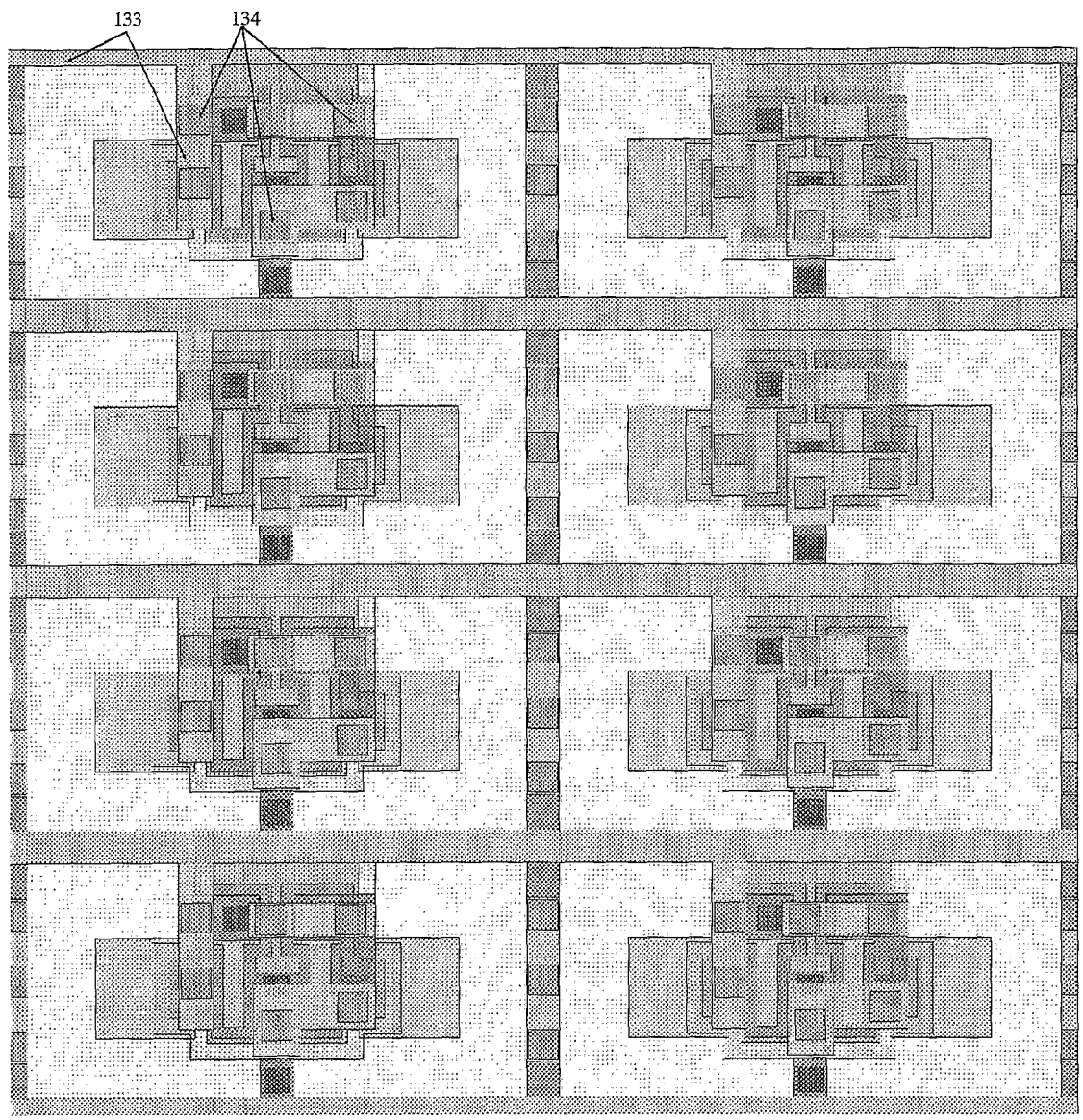
Figure 3E:
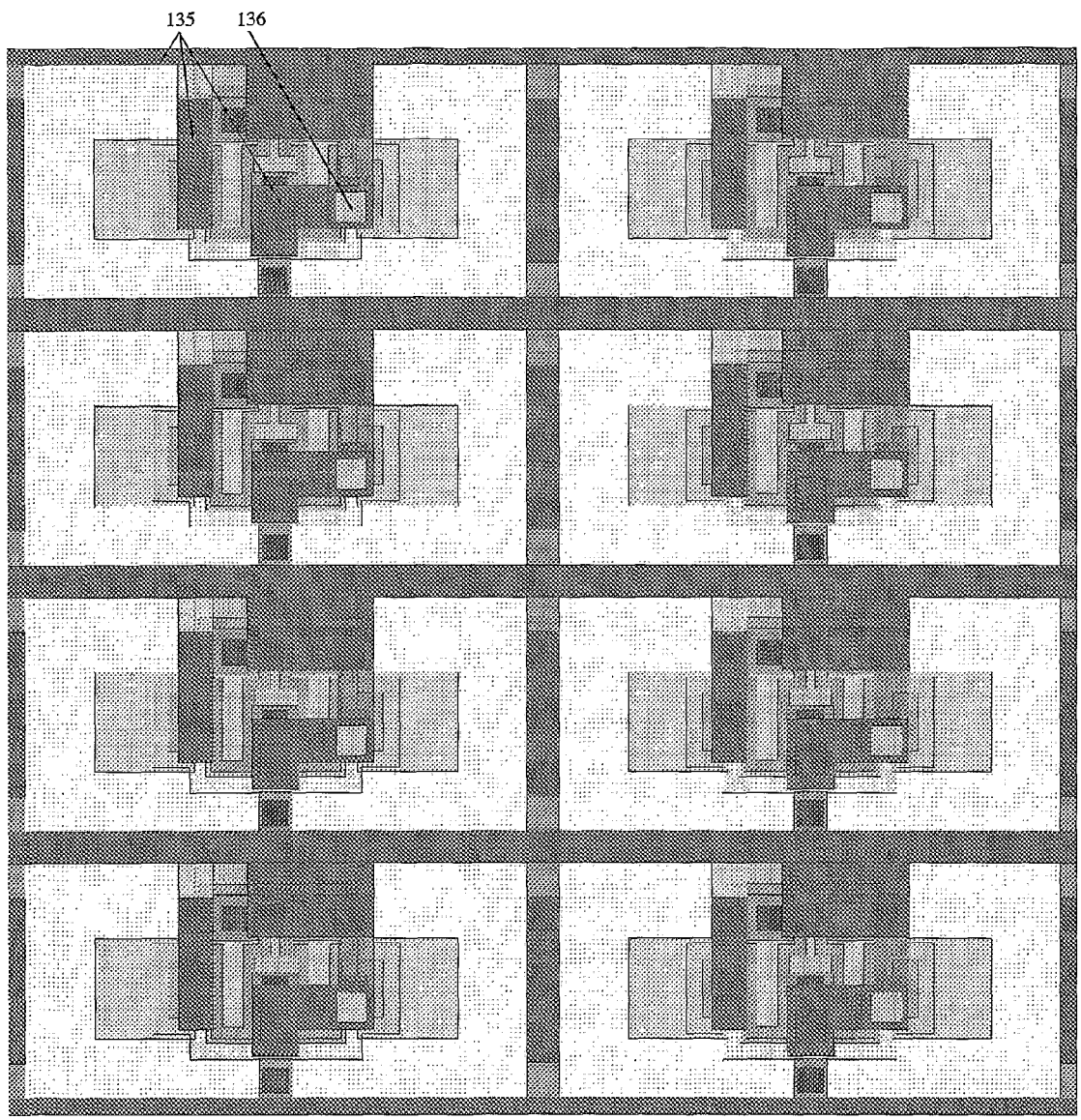
Figure 3F:
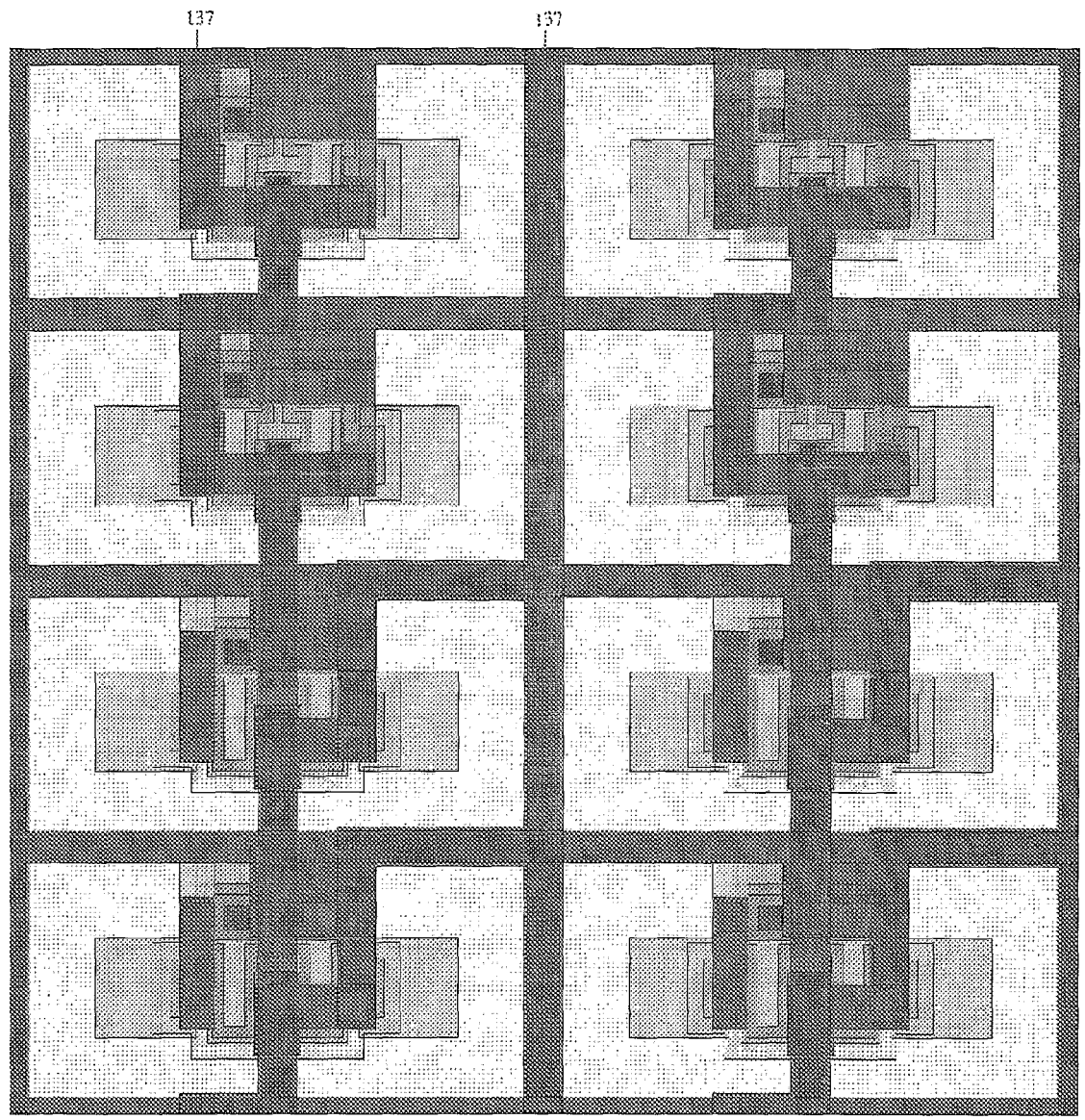

FIG. 3A—Top view of layout before Silicide formation
FIG. 3B—Top view of layout after Silicide and Contacts
FIG. 3C—Top view of layout after Metal-1 and Via-1
FIG. 3D—Top view of layout after Metal-2 and Via-2
FIG. 3E—Top view of layout after Metal-3 and Via-3
FIG. 3F—Top view of layout after Metal-4

Pixel/Lixel Design #4:

The sensor/emitter matrix is formed by replicating a basic cell comprising two adjacent Pixels/Lixels in the same vertical column, having the following characteristics:

1. The two row-select NMOS transistors in he cell are fabricated on separate active areas, but share the same p-Well, and the same gate contact.
2. For both active areas, the drain regions overlap with the respective n-Wells, providing conductive paths to the bottom electrodes of the respective APDs/ALEDs.
3. The source regions of the two active areas are connected to two different and separate vertical column lines, for example each made at a different metallization level.
4. With a single contact for the gates of the two NMOS transistors, both gates are turned "ON" and "OFF" simultaneously by a single row-select line.
5. When a row-select line turns "ON" the gates of two NMOS transistors in adjacent Pixels/Lixels sharing the same gate contact, the two Pixels/Lixels independently and simultaneously interact with column circuitry, because each Pixel/Lixel accesses a different data column line, connecting them to separate blocks of column circuitry.
6. For each vertical column of Pixels/Lixels, the signals carried by the two separate data column lines are processed in parallel by two identical blocks of column circuitry at the periphery of the sensor/emitter matrix. Each of the blocks of column circuitry is pitch-matched to the Pixel/Lixel width, and the two identical blocks are aligned such that the total width is unchanged, thus the pitch matching to the column of Pixels/Lixels is preserved, while the length of the column circuitry is roughly doubled.

7. The electric contact to the top electrode of the APDs/ALEDs (p-type doped SiGeC film) is made using Metal-1 lines over the whole sensor/emitter matrix in order to minimize series resistance.
8. The electric contact to the gates of the row-select transistors is made using Metal-2 lines.
9. The electric contact to the bottom electrode of half of all the APDs/ALEDs in one column, for example of the odd-numbered rows, is made using Metal-3, while the other half of all the APDs/ALEDs in one column, for example of the even-numbered rows, is made using Metal-4 lines.

FIGS. 4A, 4B, 4C, 4D, 4E, and 4F, provide top views of the layout of Pixel/Lixel Design #4, at different stages of the fabrication. An exemplary matrix with 4 rows and 4 columns is shown.

Figure 4A:
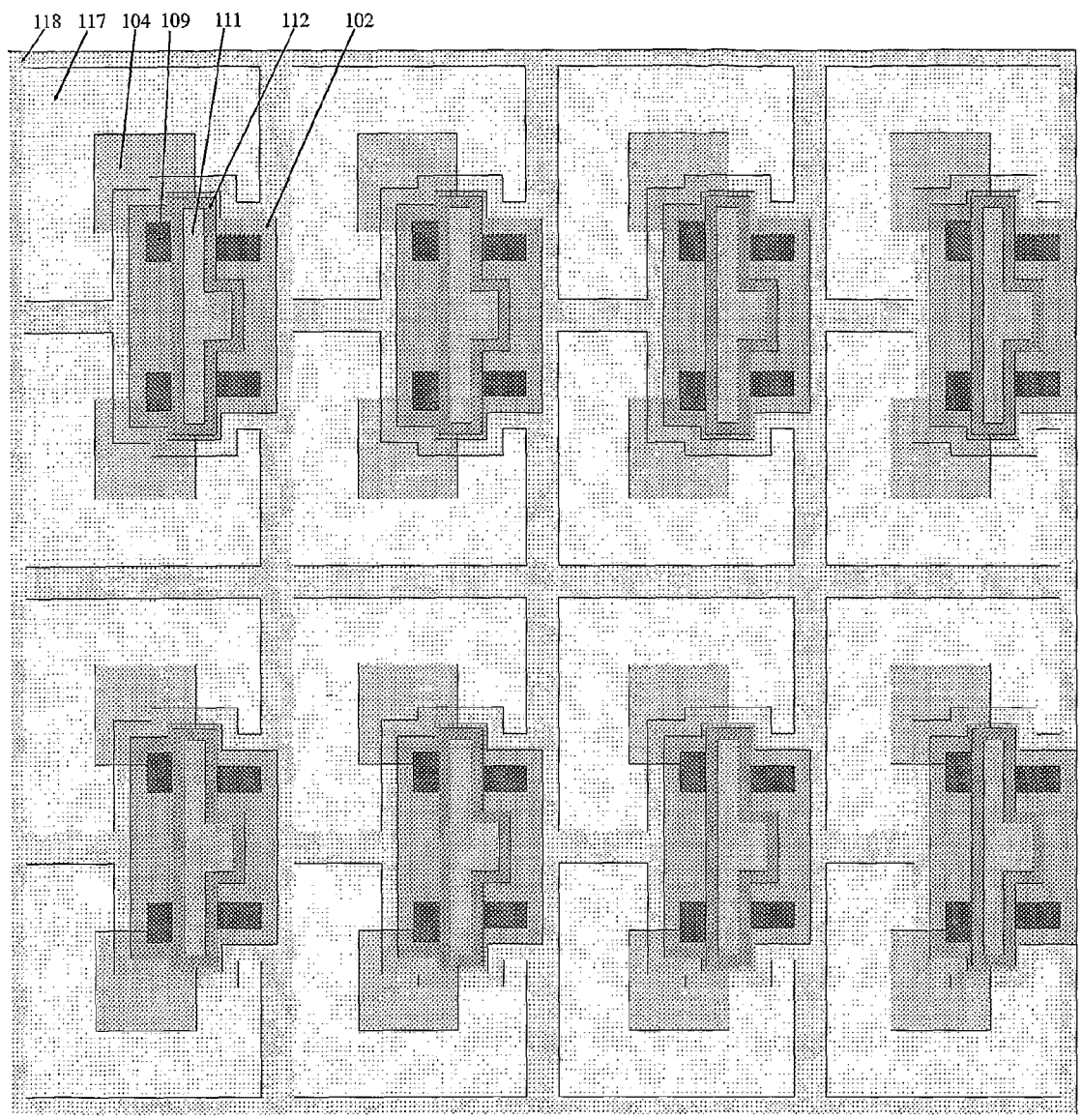
FIGS. 4A, 4B, 4C, 4D, 4E and 4F provide top views of the layout of Pixel/Lixel Design #4, made on bulk substrates, corresponding to the cross section of FIGS. 11A and 11B, at different stages of the fabrication. An exemplary matrix with 4 rows and 4 columns is shown.
Figure 4B:
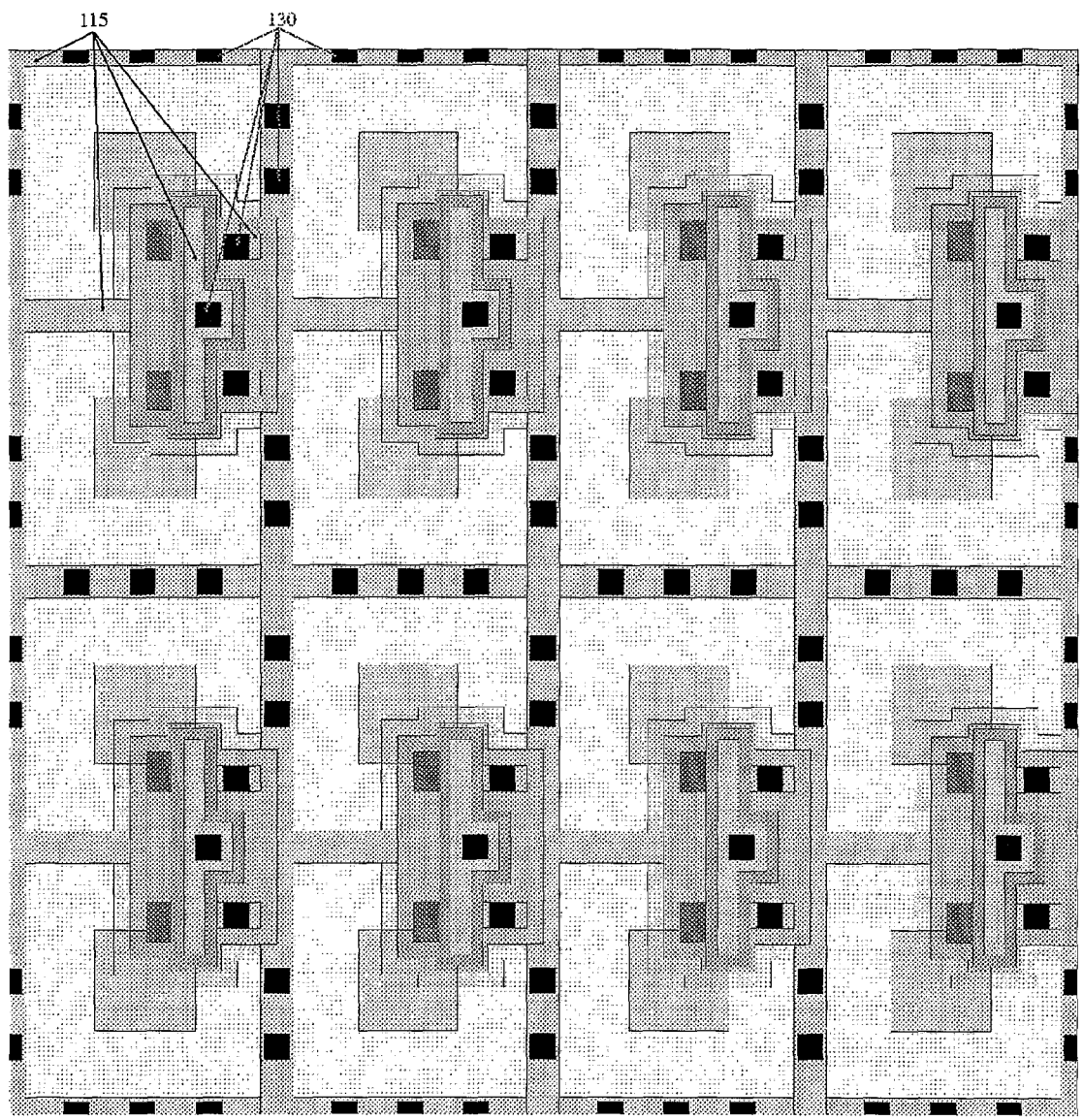
Figure 4C:
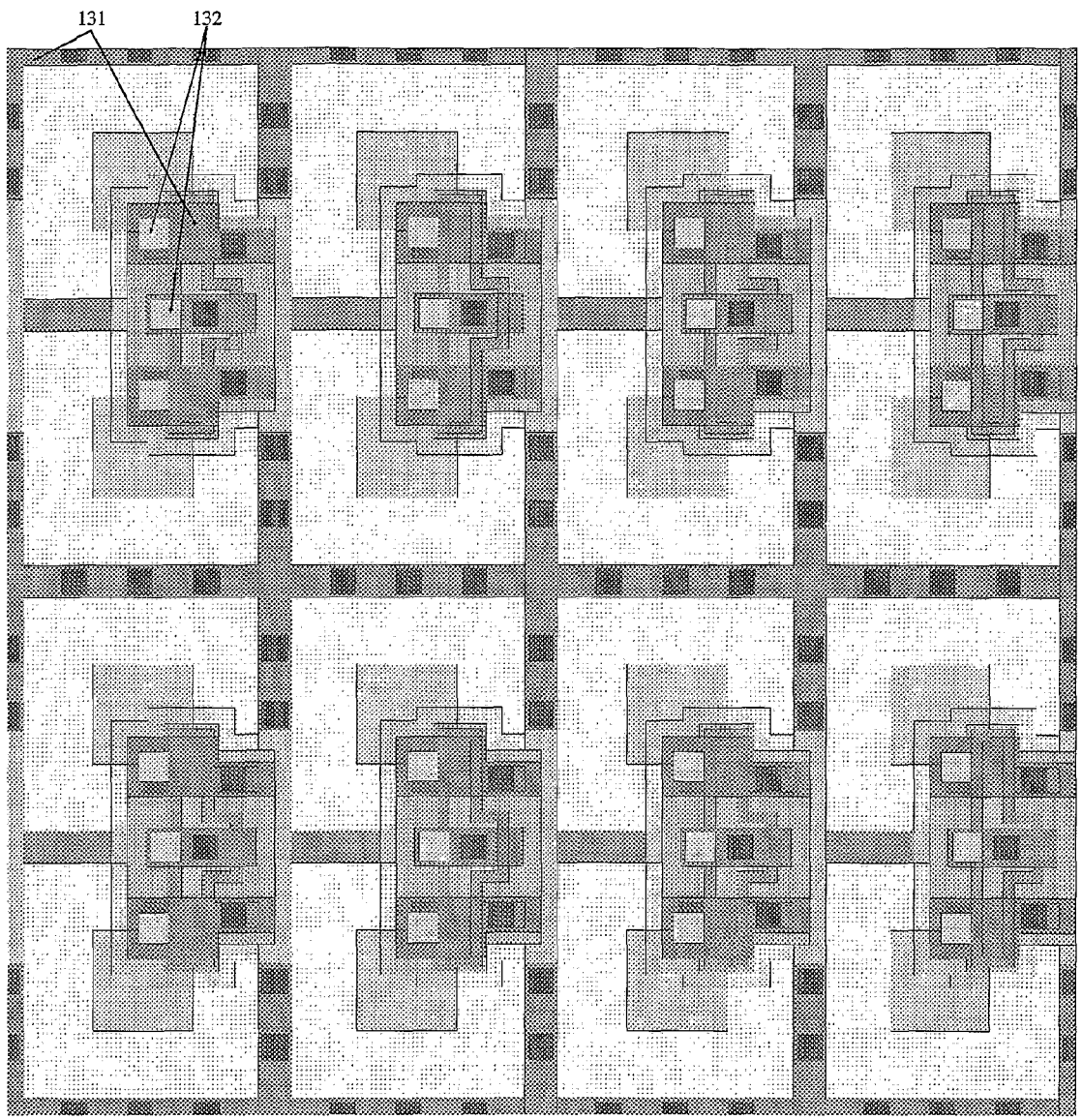
Figure 4D:
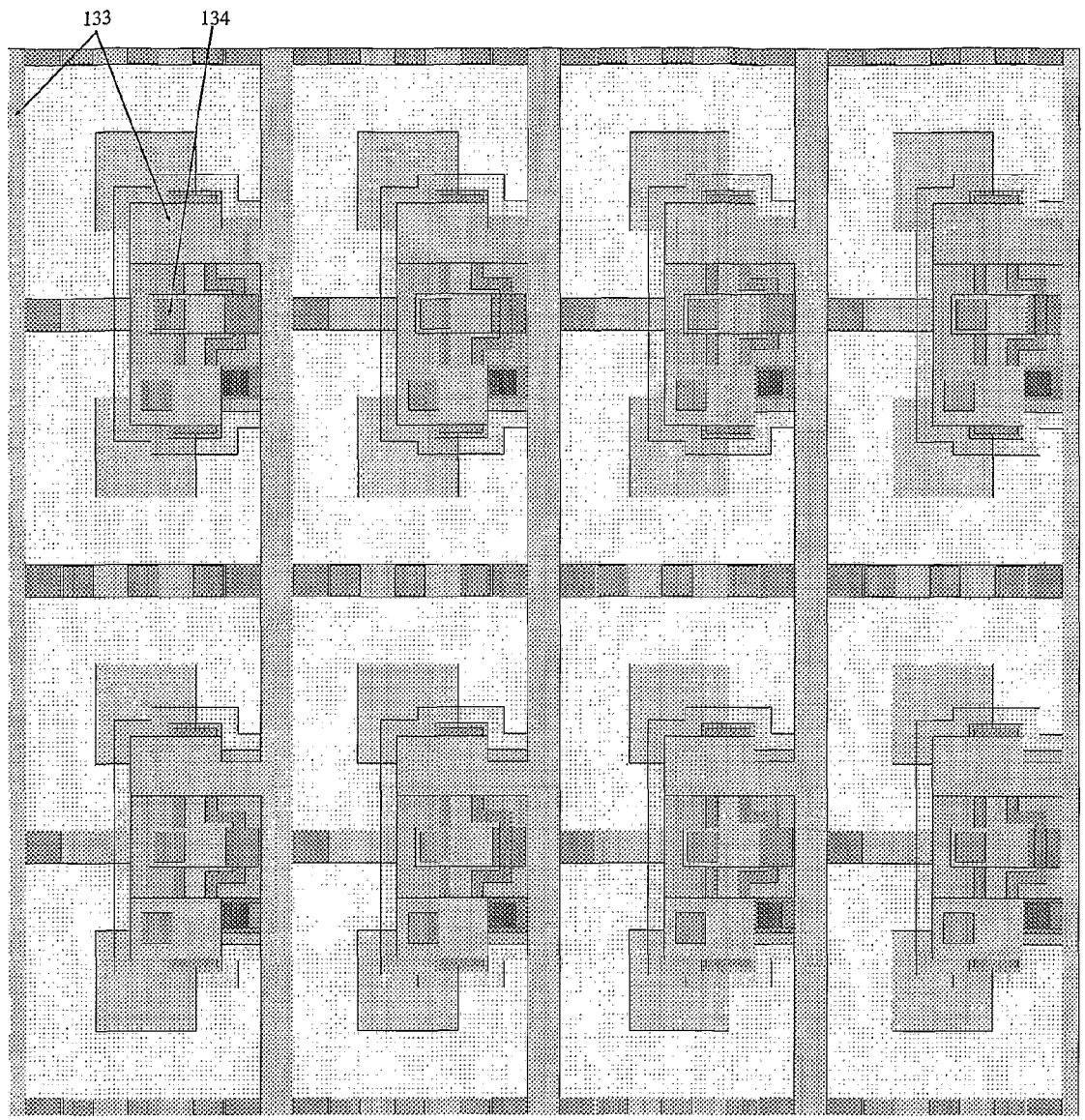
Figure 4E:
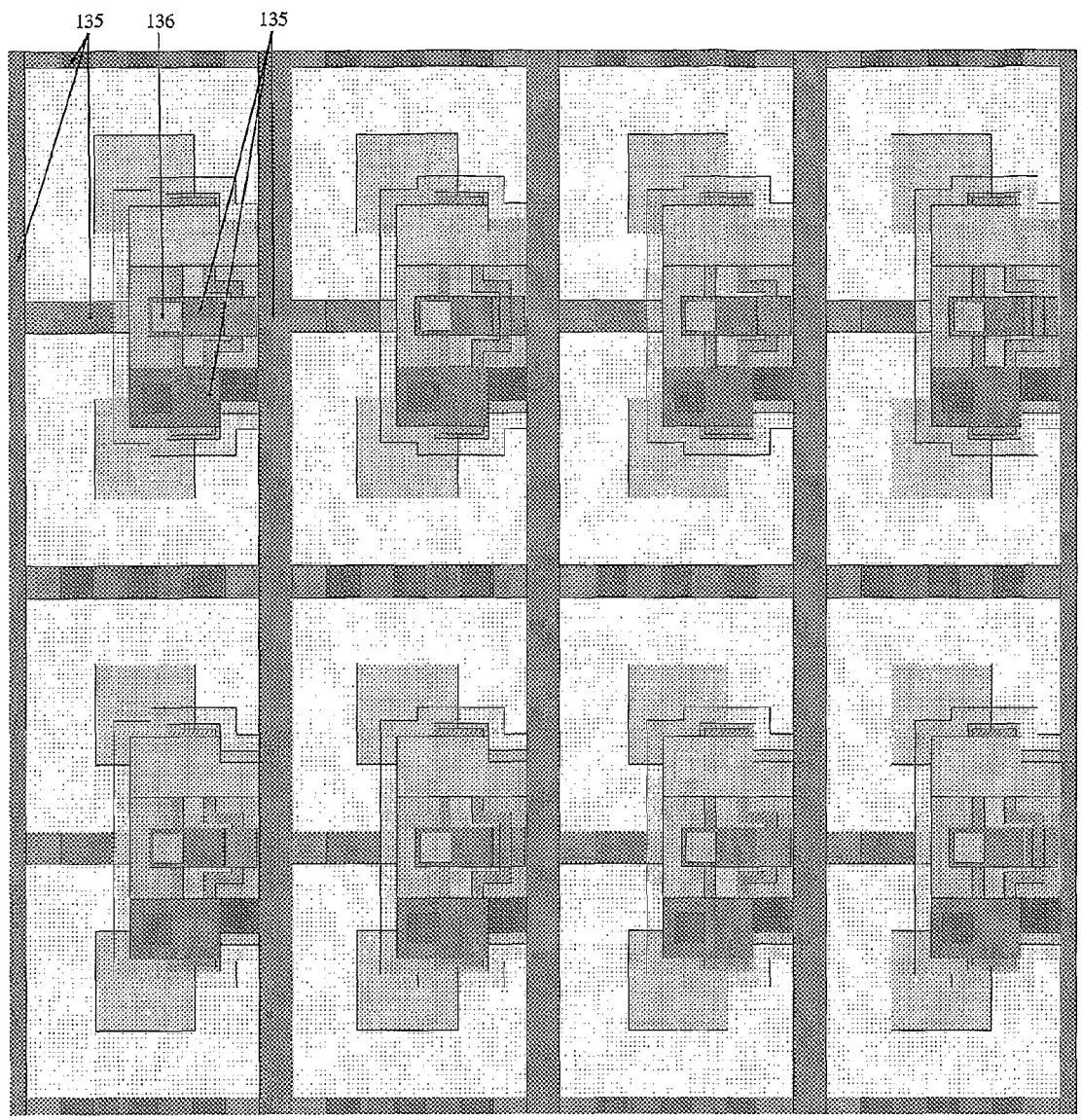
Figure 4F:
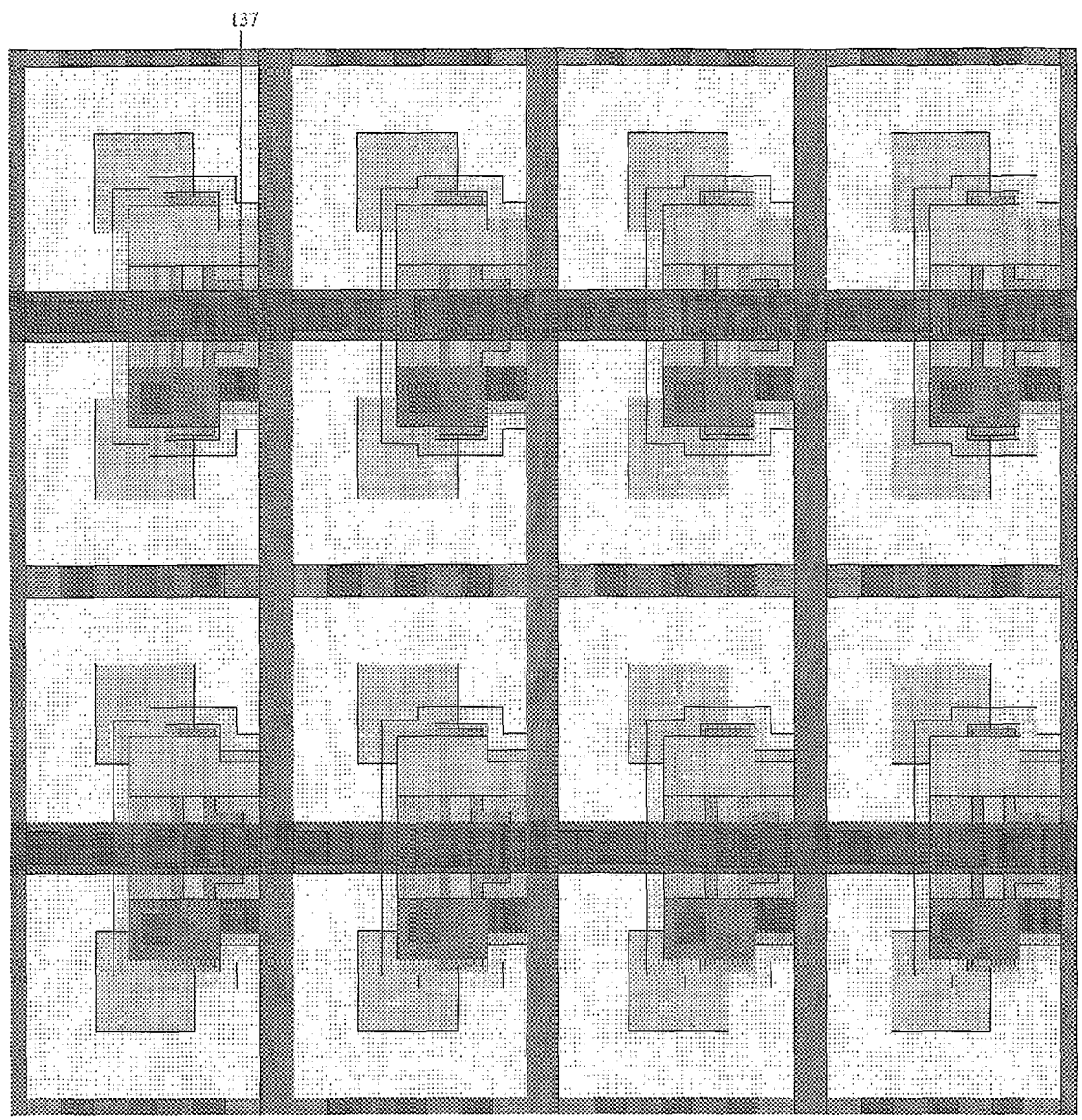

FIG. 4A—Top view of layout before Silicide formation
FIG. 4B—Top view of layout after Silicide and Contacts
FIG. 4C—Top view of layout after Metal-1 and Via-1
FIG. 4D—Top view of layout after Metal-2 and Via-2
FIG. 4E—Top view of layout after Metal-3 and Via-3
FIG. 4F—Top view of layout after Metal-4

Pixel/Lixel Design #5:

A sensor/emitter matrix is formed by replicating a basic cell comprising four adjacent Pixels/Lixels forming a square, having the following characteristics:

1. Four minimum sized n-Wells from the 4 adjacent Pixels/Lixels, are positioned in a square whose corners are the geometric centers of the four, minimum size, n-Wells. The distance between the geometric centers of the n-Wells is given by the sum of the minimum distance between independently biased n-Wells, and the length of minimum size n-Wells.
2. Two separate and parallel active areas are horizontally aligned. Both the top and the bottom active areas have each their opposite ends (drain regions) overlapping the n-Wells of the two different Pixels/Lixels in the same horizontal row.
3. Each active area is dimensioned for two minimum size NMOS transistors, sharing a common source contact at mid-distance between the two gates.
4. The gates of the four NMOS devices are aligned vertically, perpendicularly to the active areas. The top and bottom gates on the left, share the same gate contact. The top and bottom gates on the right, share the same gate contact.
5. The two separate gate contacts, controlling the four NMOS transistors, are connected to two independent row-select lines.
6. The shared source contact at the center the top active area, and the shared source contact at the center of the bottom active area, are connected to two independent vertical data column lines.
7. The two independent horizontal row-select lines can be implemented at the same metal level because of the intrinsic symmetry properties of the 4-Pixel/Lixel arrangement, and the sharing of two gate contacts to the four NMOS row-select transistors.
8. The two independent vertical data column lines can be implemented at the same metal level because of the intrinsic symmetry properties of the 4-Pixel/Lixel arrangement, and the sharing of two source contacts to the four NMOS row-select transistors.
9. A sensor matrix is obtained through the replication of the 4-Pixel/Lixel cells. Different types of replication carry different possibilities for cell grouping and programmable resolution or Pixel/Lixel size. The replication of the 4-Pixel/Lixel basic cell can be made in four ways:
   A. Replication without geometric transformations.
   B. Replication and mirroring with respect to the horizontal axis only.
   C. Replication and mirroring with respect to the vertical axis only.
   D. Replication and mirroring with respect to the horizontal and the vertical axis.
10. The geometry and specific layout for the vertical column metal lines is such that it is straightforward to add more metal levels to increase the number of independent vertical column metal lines, connected to different 4-Pixel/Lixel cells, in order to increase the bandwidth between the sensor/emitter matrix and the periphery.
11. The electric contact to the top electrode of the APDs/ALEDs (p-type doped SiGeC film) is made using Metal-1 lines over the whole sensor/emitter matrix in order to minimize series resistance.
12. The electric contact to the gates of the row-select transistors is made using Metal-2 lines.
13. The electric contacts to the bottom electrode of the APDs/ALEDs, through the data column lines, are made with Metal-3 lines.

FIGS. 5A, 5B, 5C, 5D, and 5E, provide top views of the layout of Pixel/Lixel Design #5, at different stages of the fabrication. FIG. 5F shows an alternative layout to that of FIG. 5E. An exemplary matrix with 8 rows and 8 columns is shown.

Figure 5A:
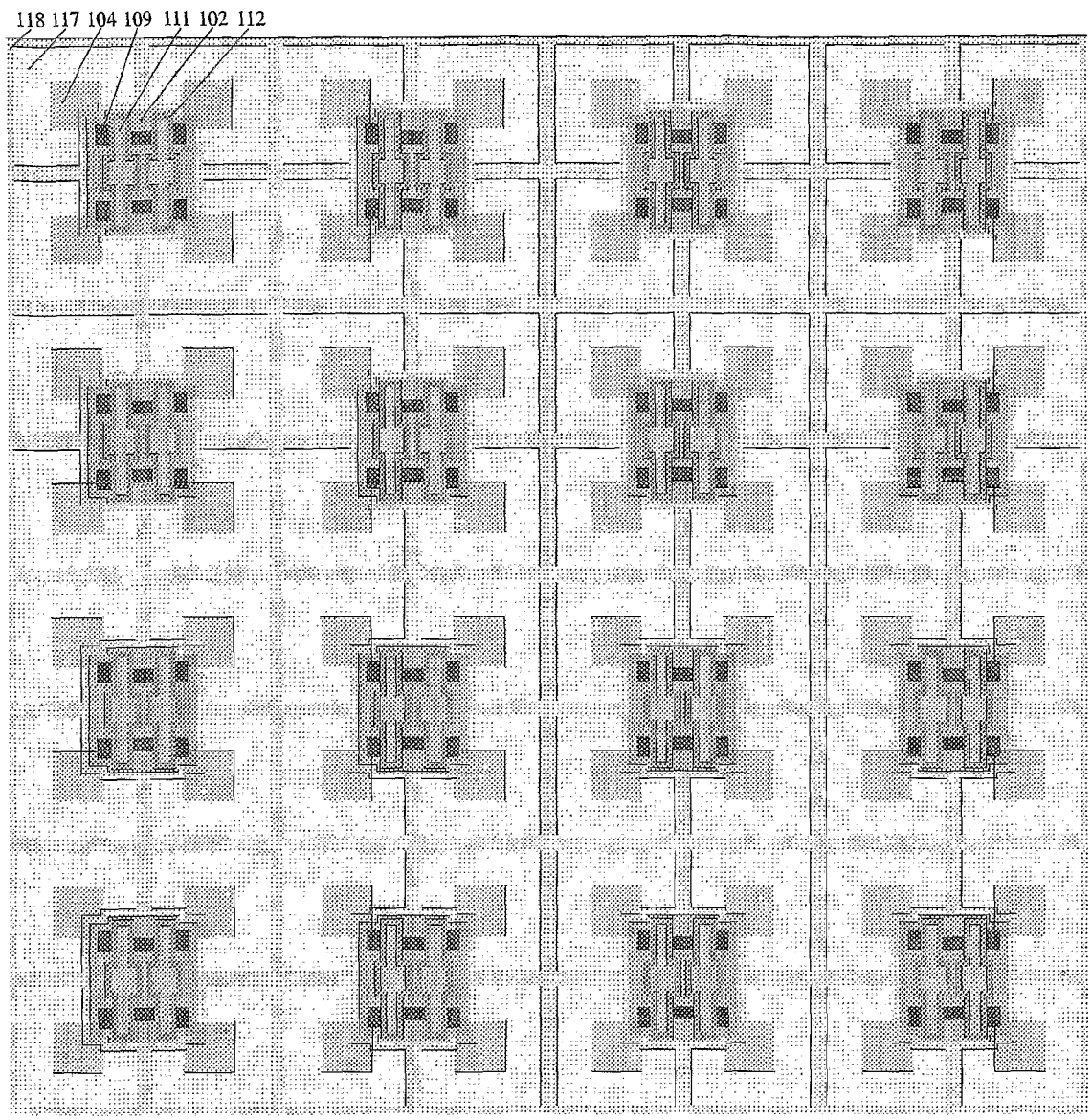
FIGS. 5A, 5B, 5C, 5D and 5E provide top views of the layout of Pixel/Lixel Design #5, made on bulk substrates, corresponding to the cross section of FIGS. 11A and 11B, at different stages of the fabrication. An exemplary matrix with 8 rows and 8 columns is shown.
Figure 5B:
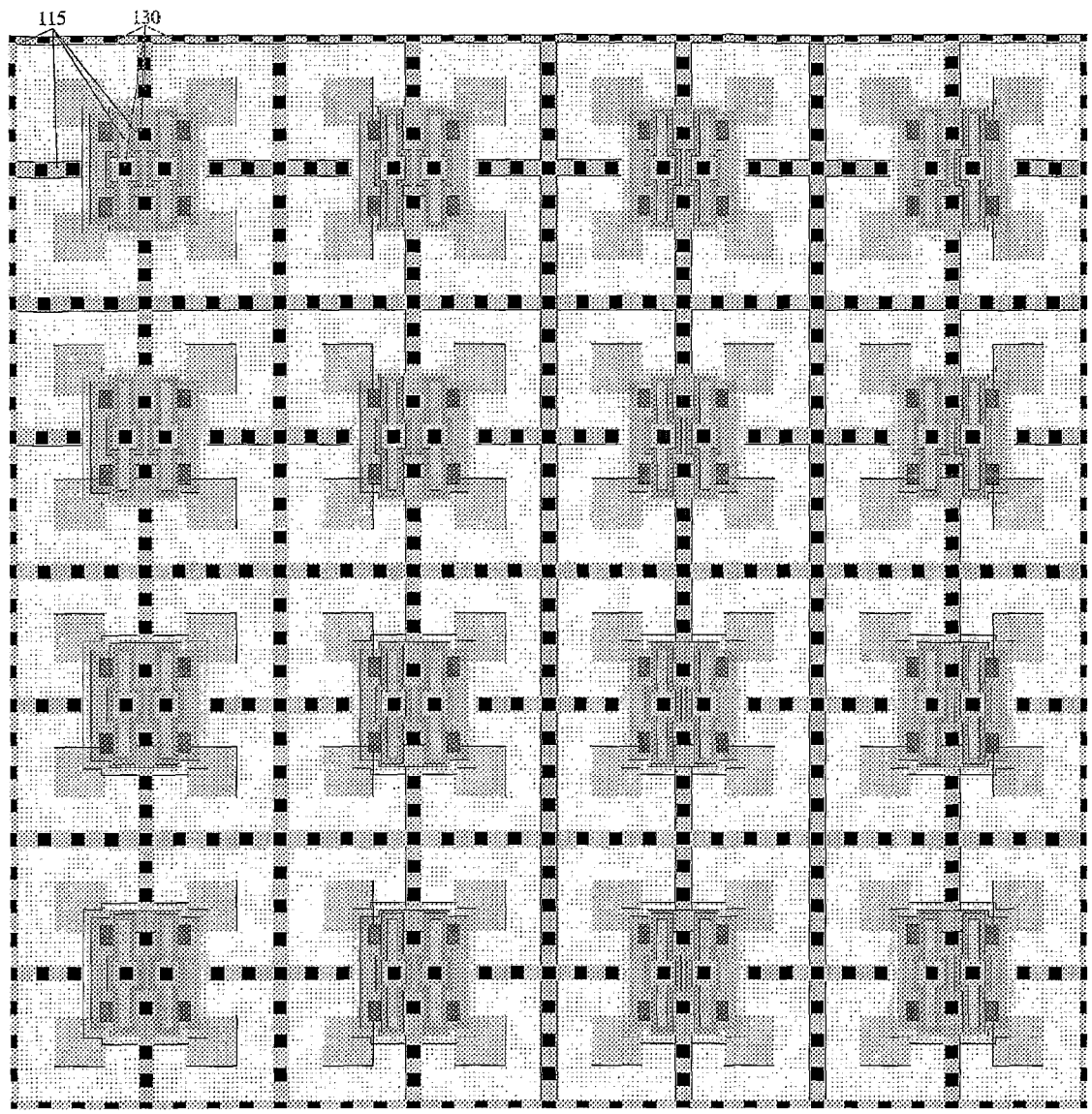
Figure 5C:
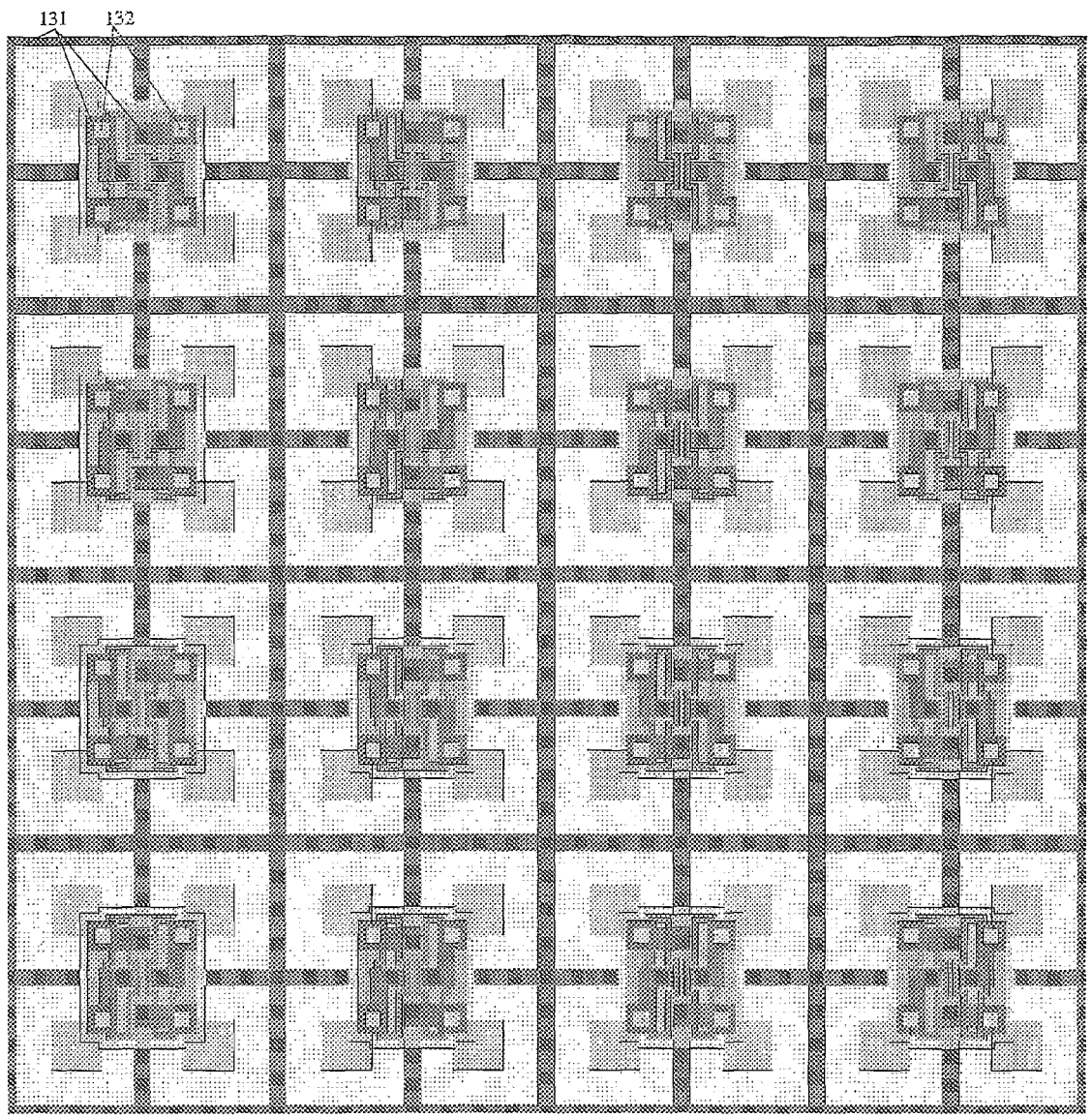
Figure 5D:
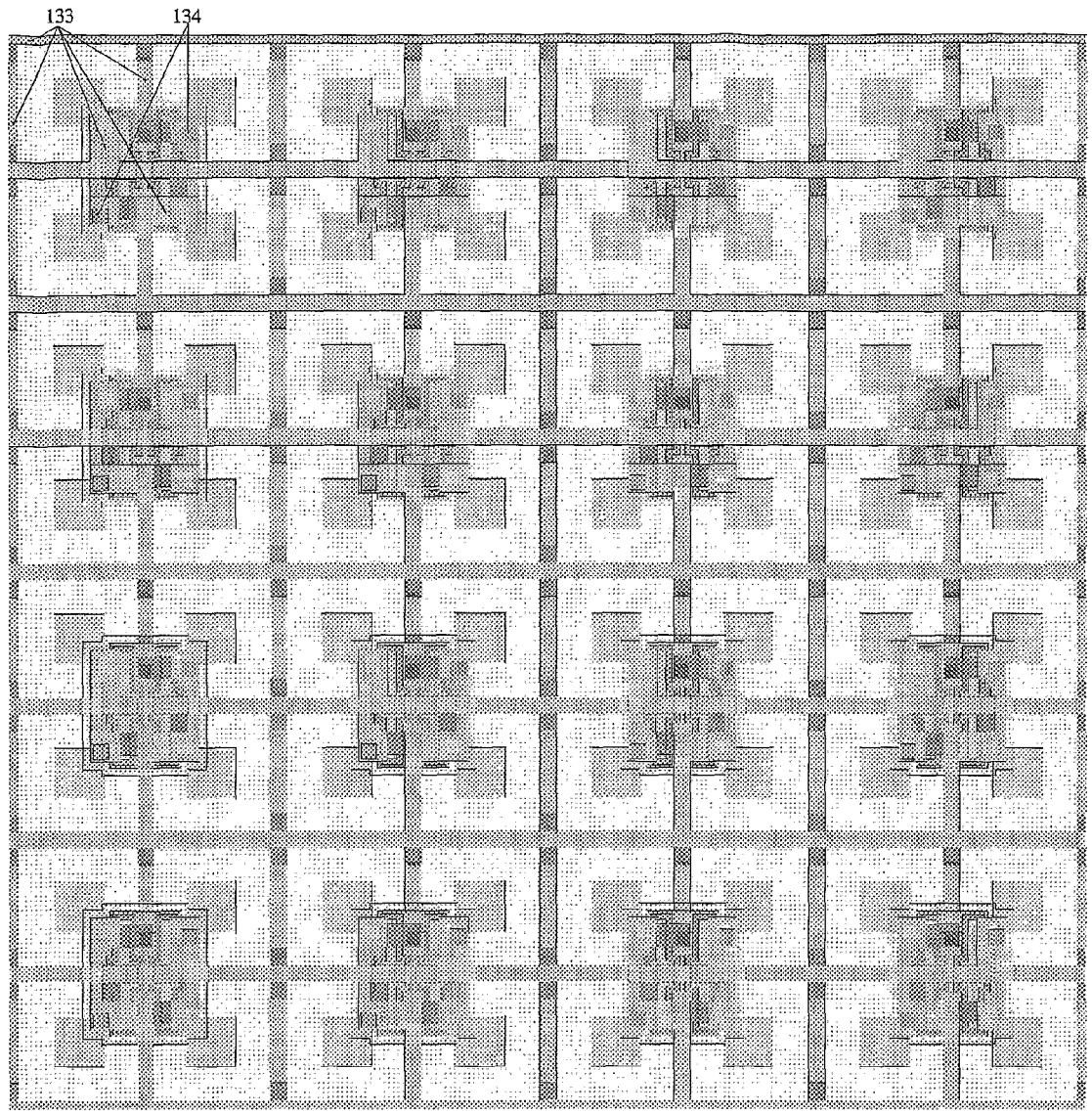
Figure 5E:
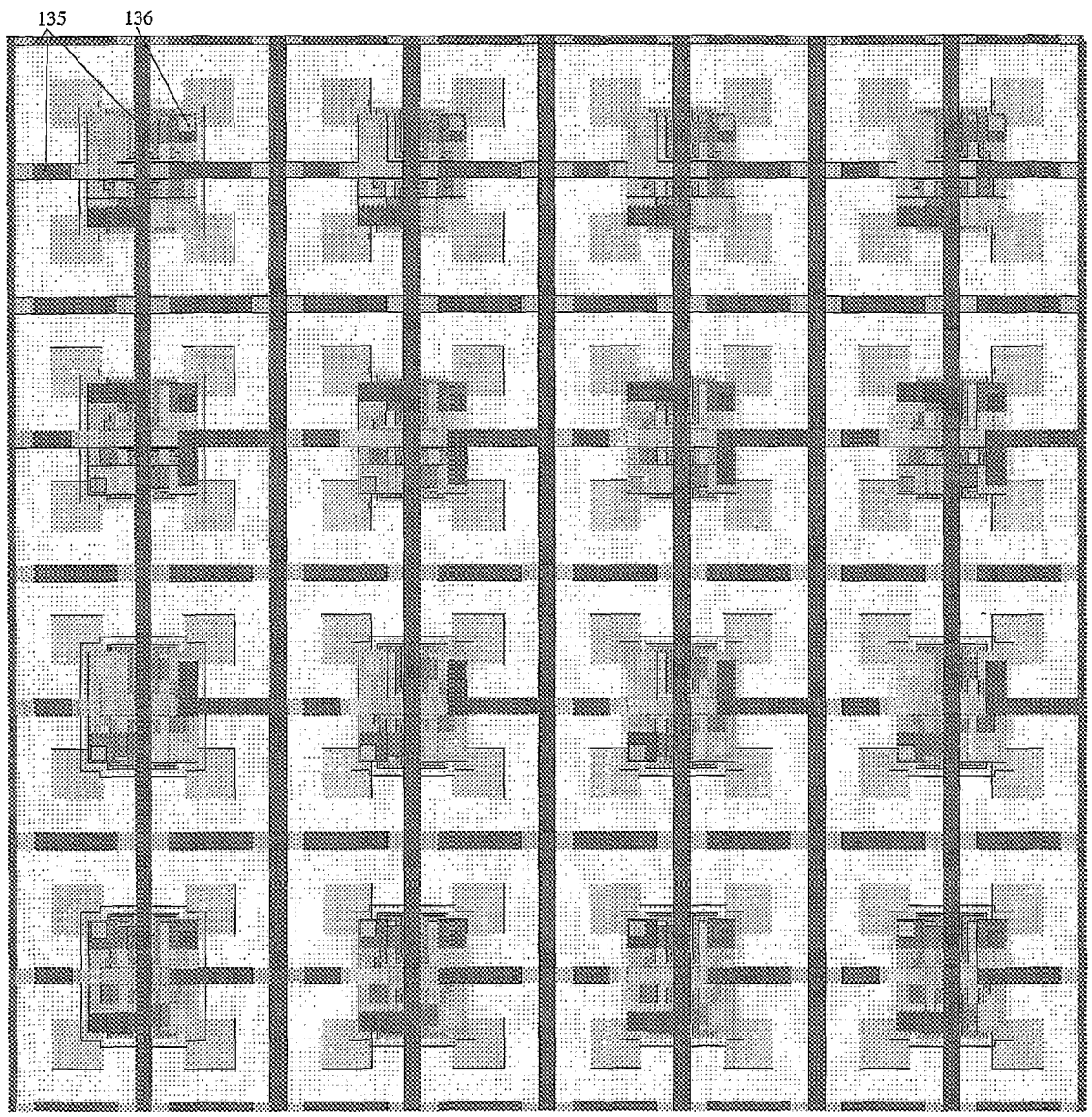
Figure 5F:
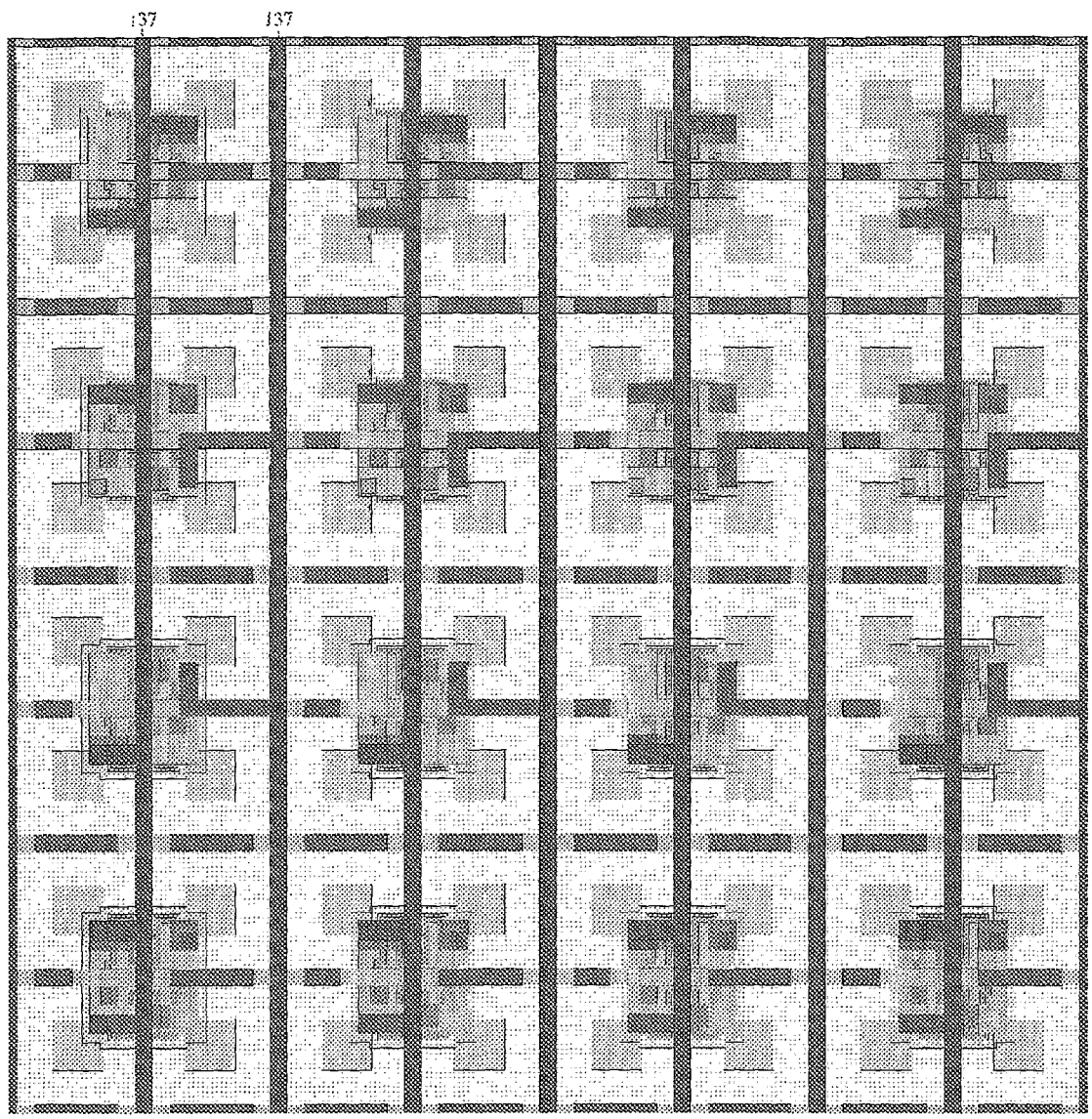
FIG. 5F shows an alternative layout to that of FIG. 5E.

FIG. 5A—Top view of layout before Silicide formation
FIG. 5B—Top view of layout after Silicide and Contacts
FIG. 5C—Top view of layout after Metal-1 and Via-1
FIG. 5D—Top view of layout after Metal-2 and Via-2
FIG. 5E—Top view of layout after Metal-3 and Via-3
FIG. 5F—Top view of layout after Metal-3 and Via-3 alternative to that of FIG. 5E Pixel/Lixel Design #6:

Pixel/Lixel design #6 shares the characteristics of Pixel/Lixel design #2, except that the gates of the two row-select NMOS transistors are positioned in such way that the respective contact pads are on opposite sides of the shared active area. The metallization layout is also different and presents another possible alternative.

FIGS. 6A, 6B, 6C, 6D, 6E, and 6F, provide top views of the layout of Pixel/Lixel Design #6, at different stages of the fabrication. FIG. 6G shows an alternative layout to that of FIG. 6F. An exemplary matrix with 4 rows and 4 columns is shown.

Figure 6A:
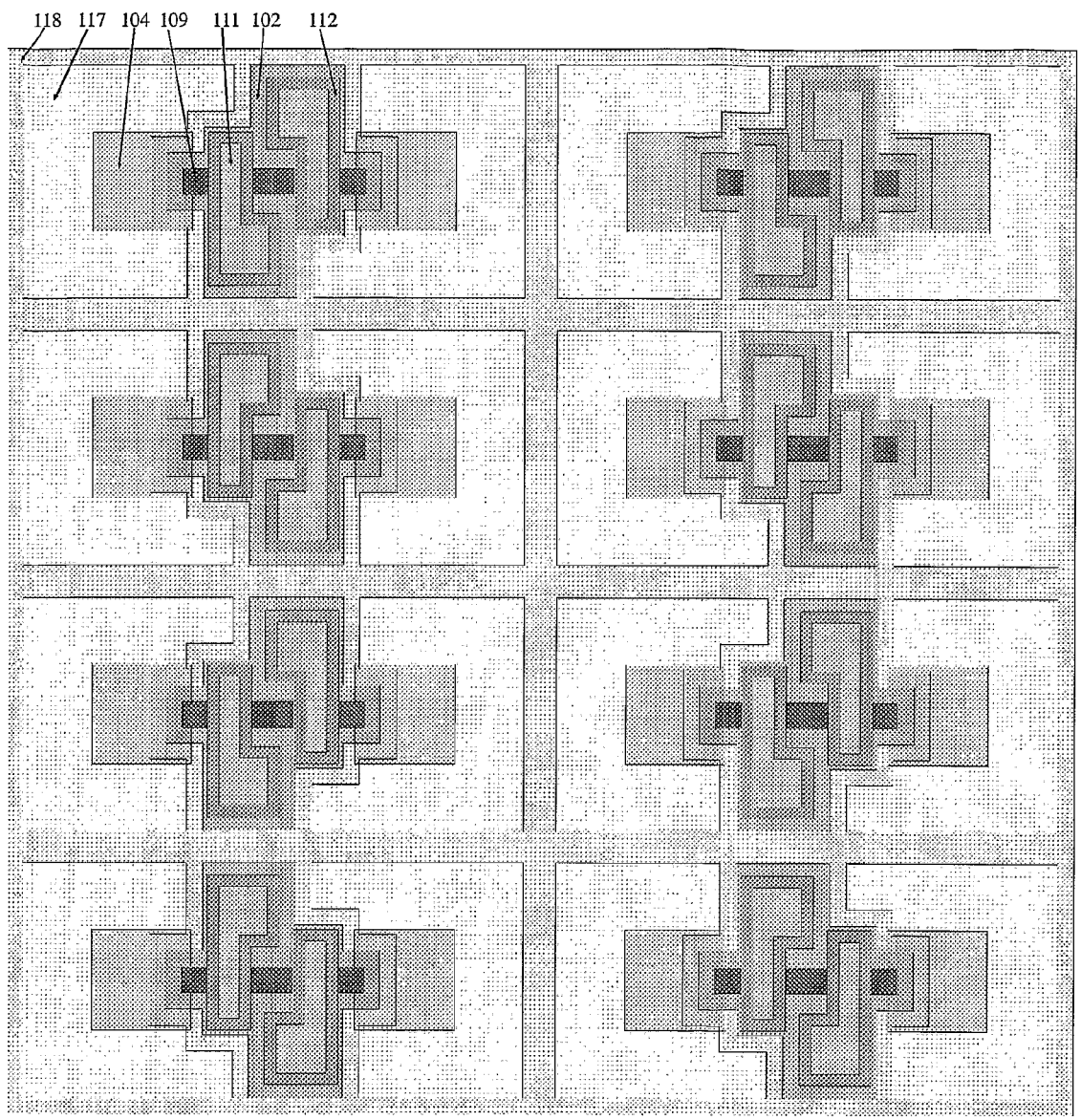
FIGS. 6A, 6B, 6C, 6D, 6E and 6F provide top views of the layout of Pixel/Lixel Design #6, made on bulk substrates, corresponding to the cross section of FIGS. 11A and 11B, at different stages of the fabrication. An exemplary matrix with 4 rows and 4 columns is shown.
Figure 6B:
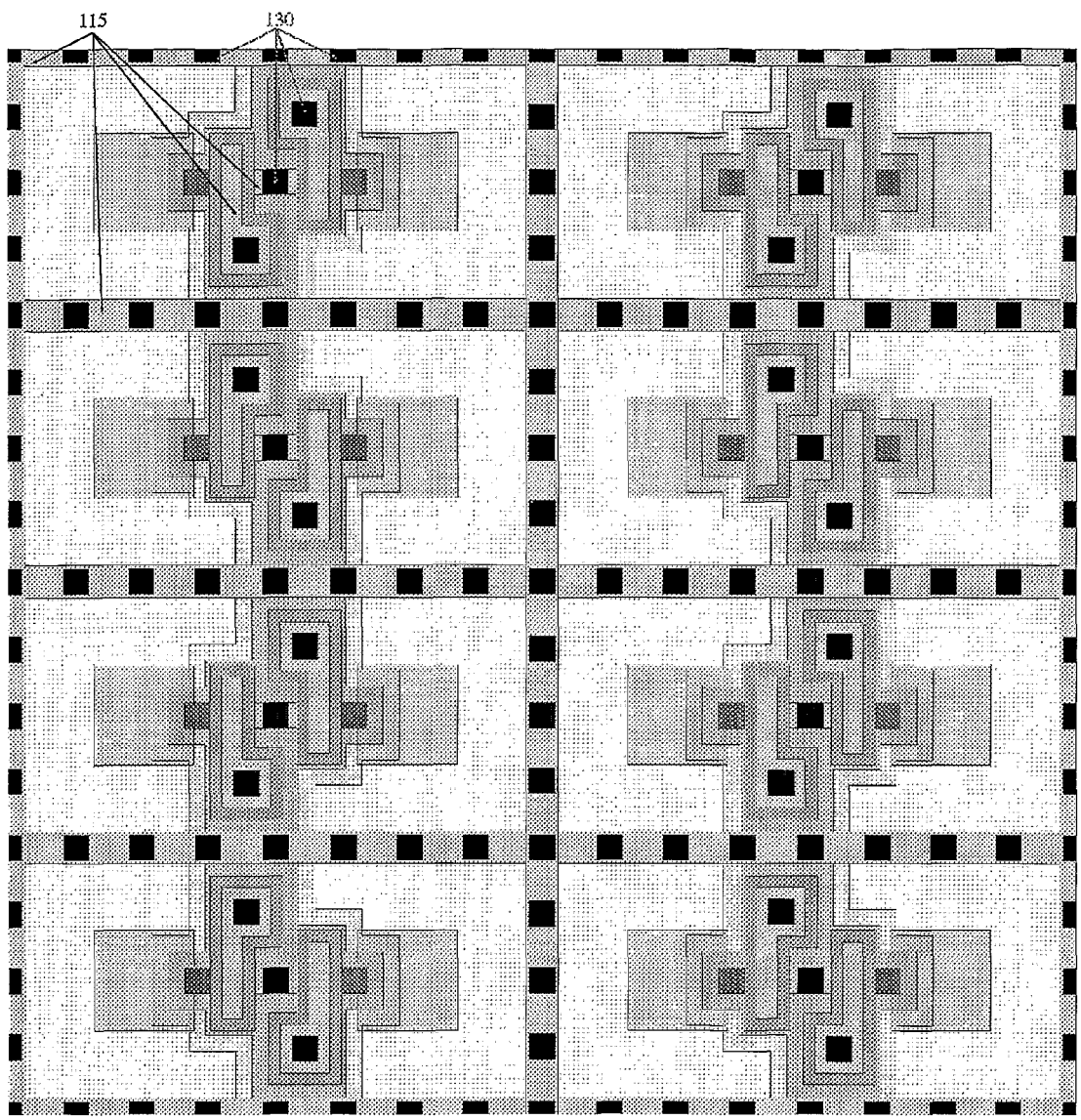
Figure 6C:
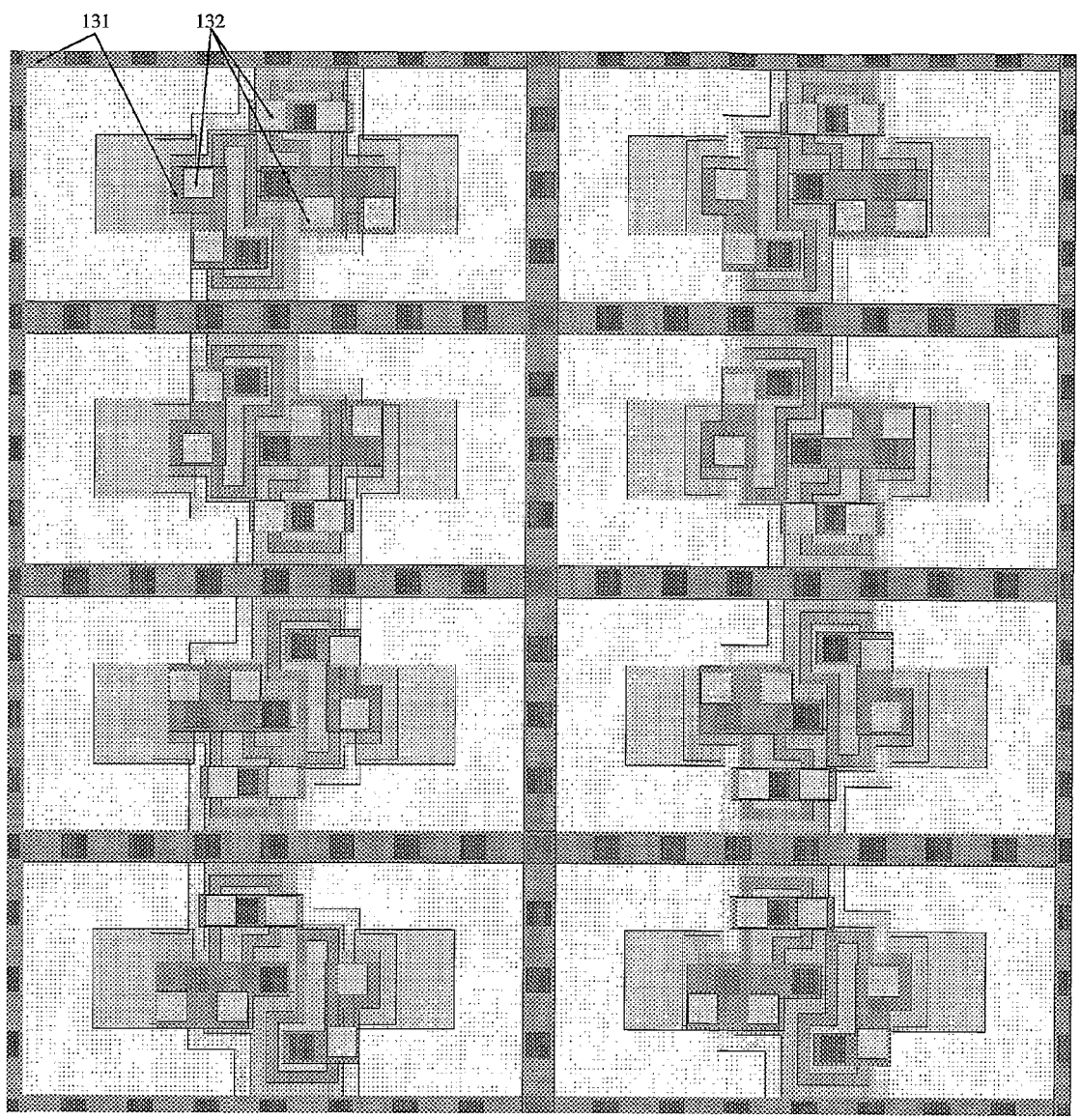
Figure 6D:
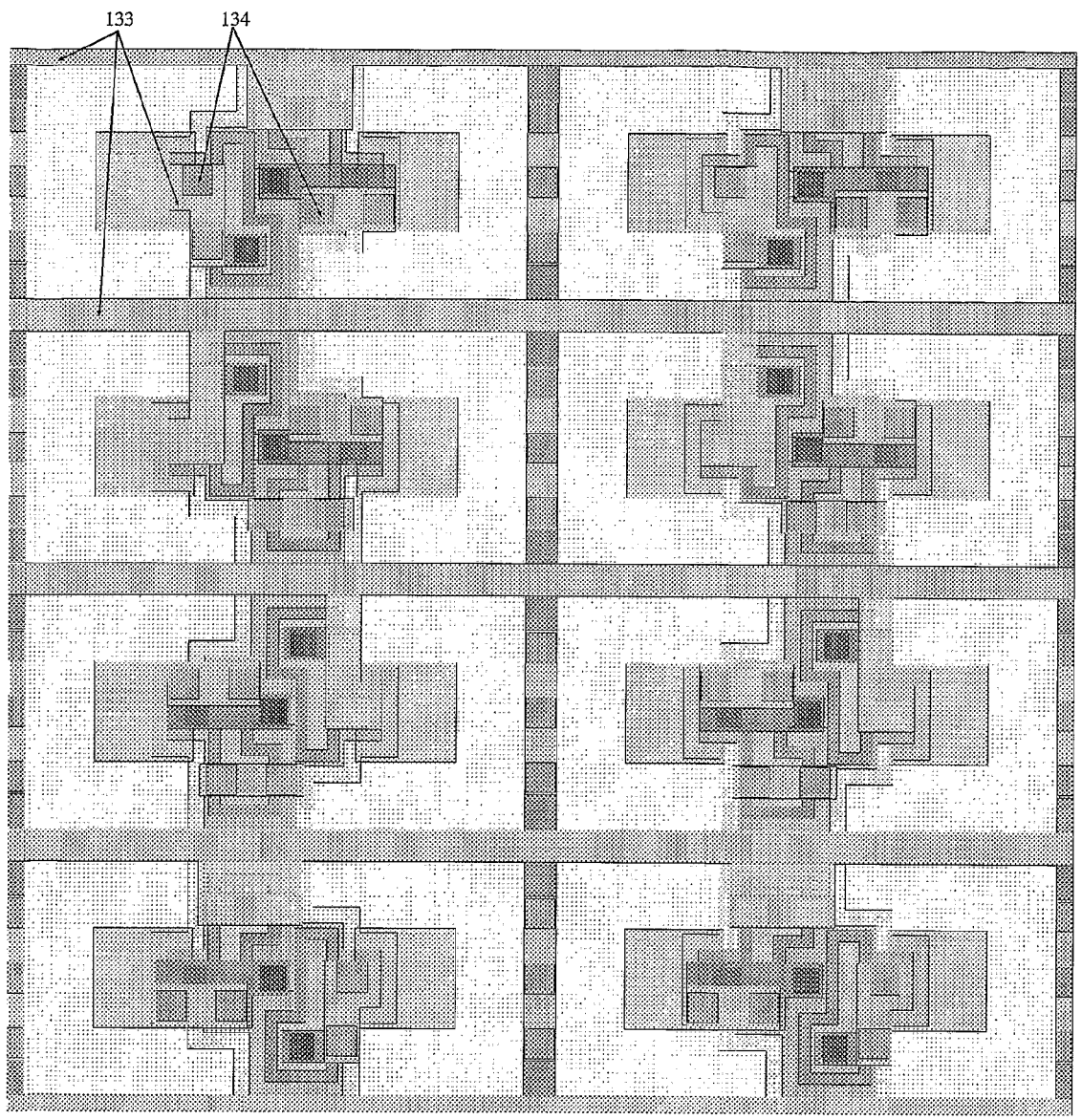
Figure 6E:
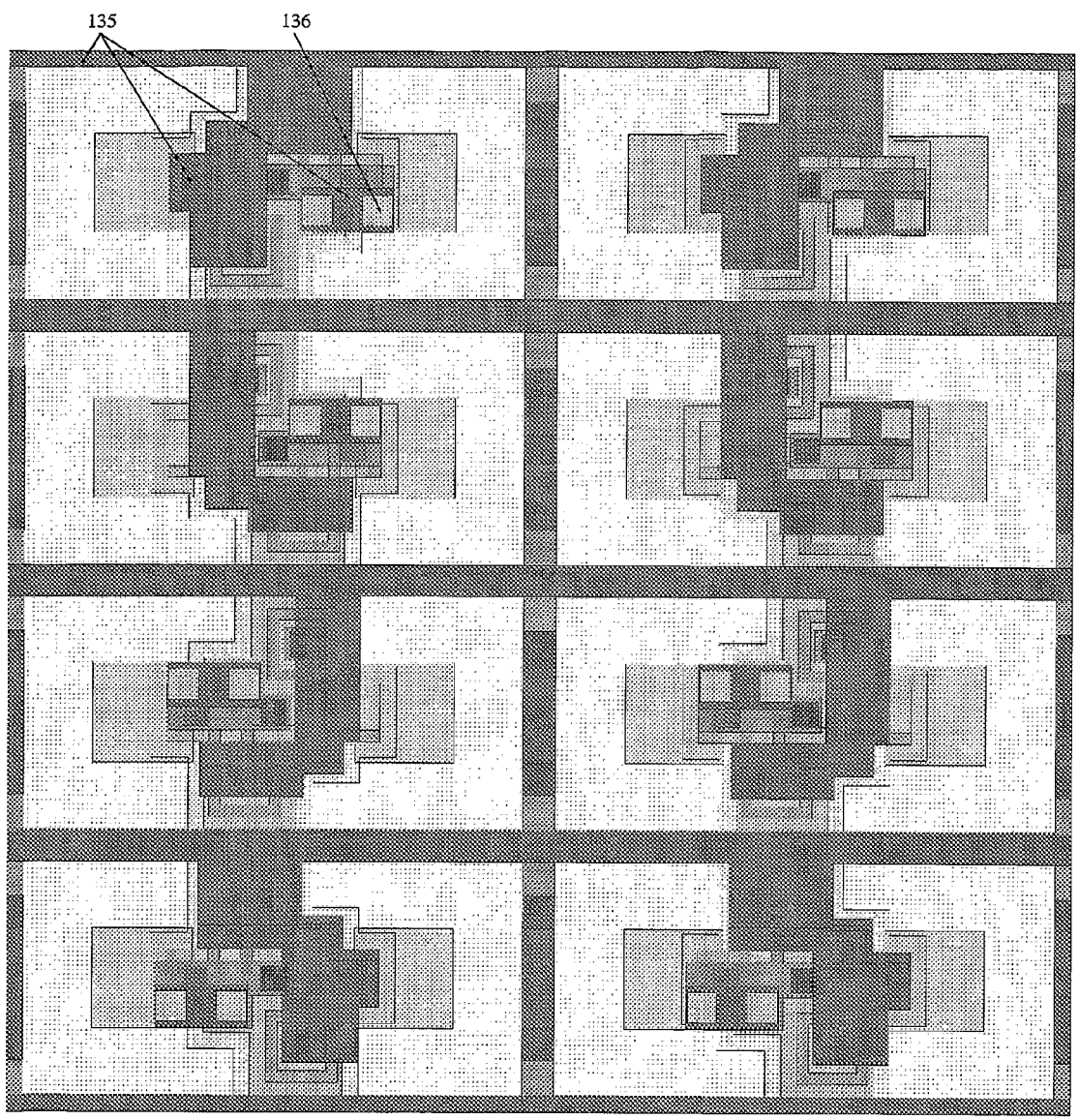
Figure 6F:
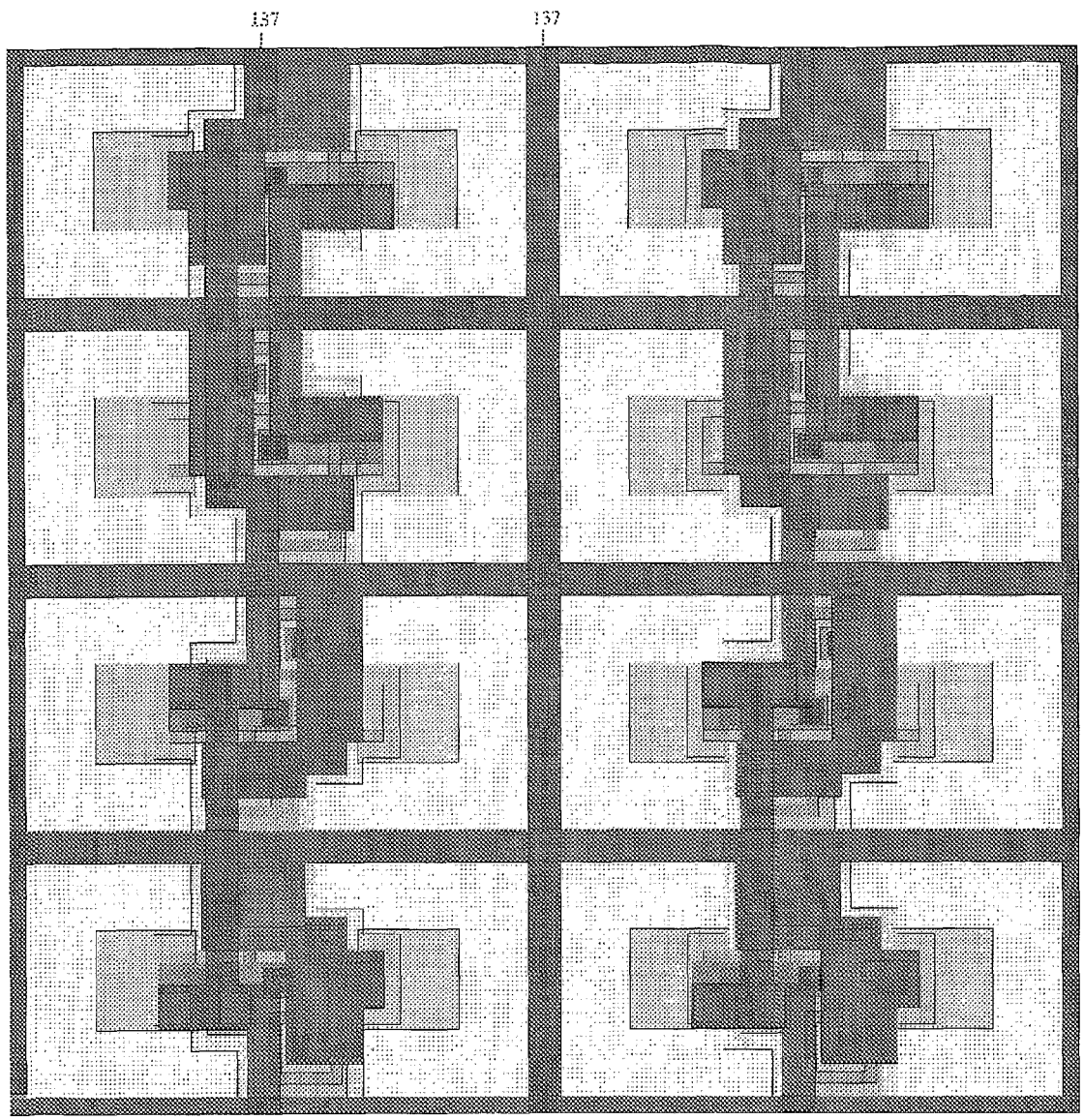
Figure 6G:
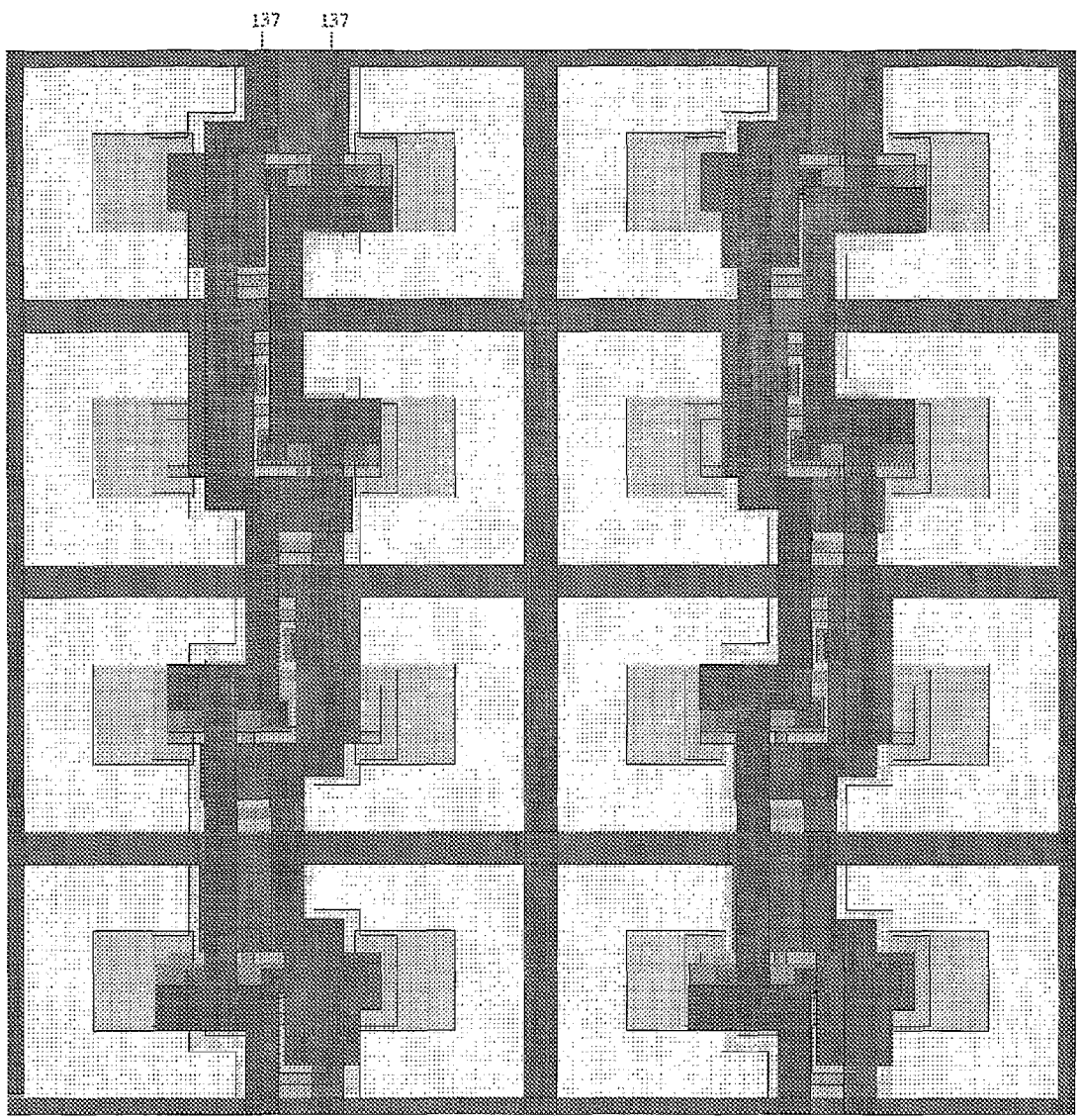
FIG. 6G shows an alternative layout to that of FIG. 6.

FIG. 6A—Top view of layout before Silicide formation
FIG. 6B—Top view of layout after Silicide and Contacts
FIG. 6C—Top view of layout after Metal-1 and Via-1
FIG. 6D—Top view of layout after Metal-2 and Via-2
FIG. 6E—Top view of layout after Metal-3 and Via-3
FIG. 6F—Top view of layout after Metal-4
FIG. 6G—Top view of layout after Metal-4, alternative to that of FIG. 6F Pixel/Lixel Design #7:

Based on the Pixel/Lixel Design #6, and shows how that Pixel/Lixel design can be used to double the bandwidth with every extra metal level added, assuming that the necessary extra peripheral circuitry is also added. In this exemplary implementation, 5 metal levels are used to illustrate this feature.

Among many advantages of Pixel/Lixel design with APDs is the fact that the avalanche is itself the amplification mechanism of the photo-generated signal, thereby avoiding the need for electronic analog amplification of the source signal. This allows signal amplification with a Pixel/Lixel design having just one transistor, the Row-Select Transistor. Conventional CMOS "active pixels sensors" use the transconductance of MOSFETs to amplify the photo-generated signal. The source-drain current flowing in the MOSFET is proportional to the amount of photo-generated charge stored at the gate of that MOSFET. The readout is non-destructive, and there needs to be a reset mechanism before the next image acquisition process.

FIGS. 7A, 7B, 7C, 7D, 7E, 7F, and 7G, provide top views of the layout of Pixel/Lixel Design #7, at different stages of the fabrication. FIGS. 7H and 7I show alternative layouts to those of FIGS. 7F and 7G, respectively. An exemplary matrix with 8 rows and 8 columns is shown.

Figure 7A:
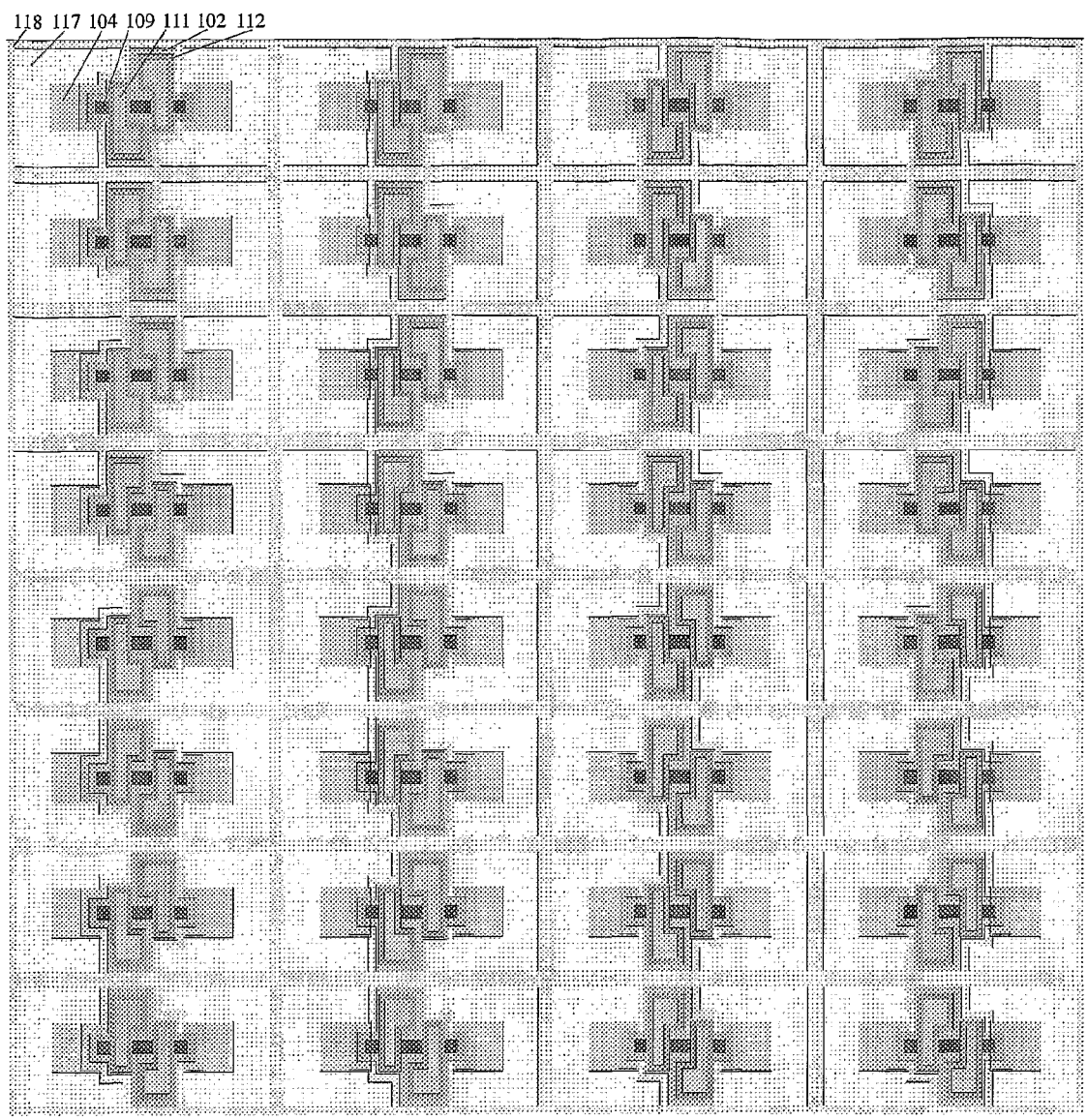
FIGS. 7A, 7B, 7C, 7D, 7E, 7F and 7G provide top views of the layout of Pixel/Lixel Design #7, made on bulk substrates, corresponding to the cross section of FIGS. 11A and 11B, at different stages of the fabrication. An exemplary matrix with 8 rows and 8 columns is shown.
Figure 7B:
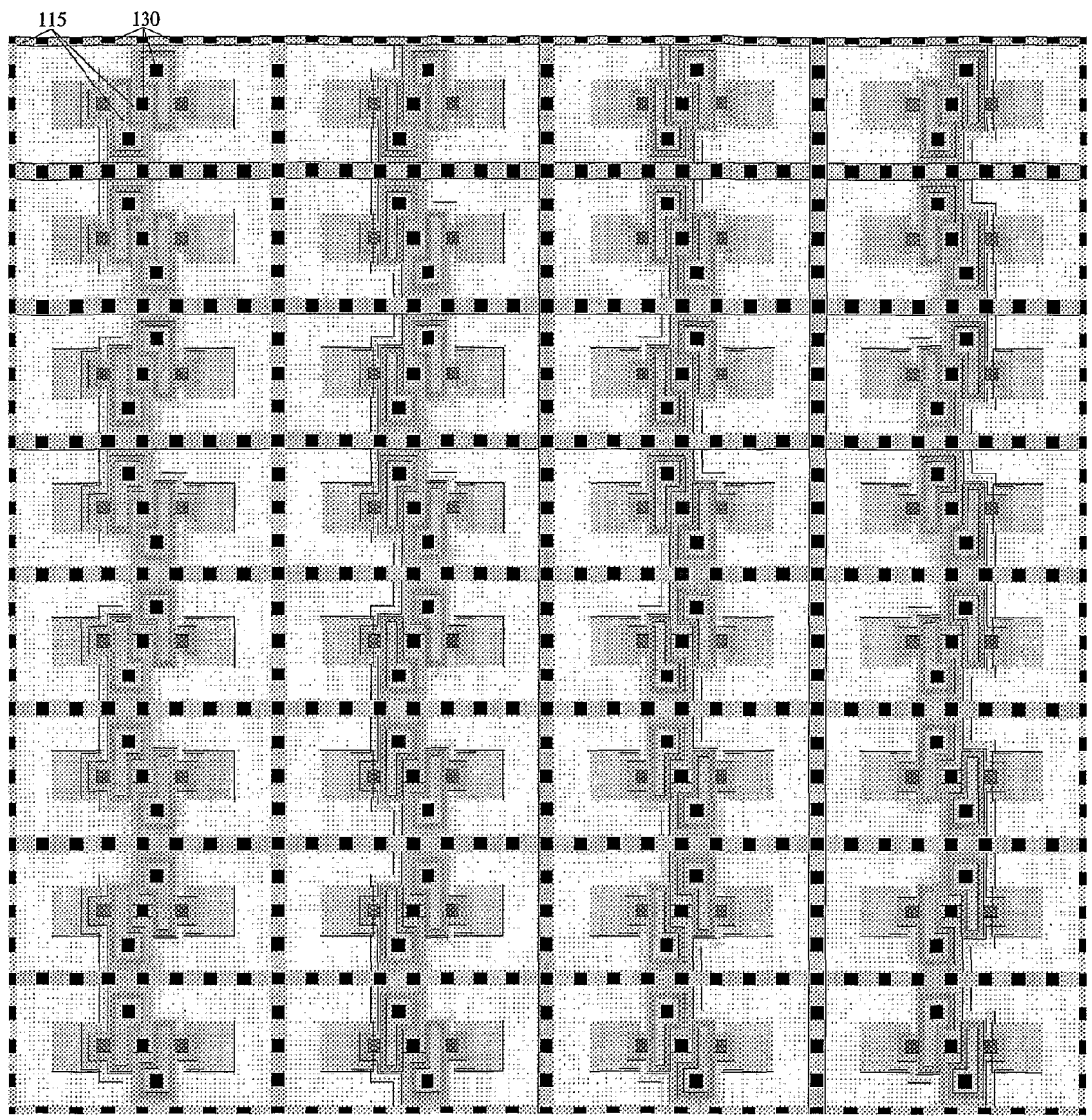
Figure 7C:
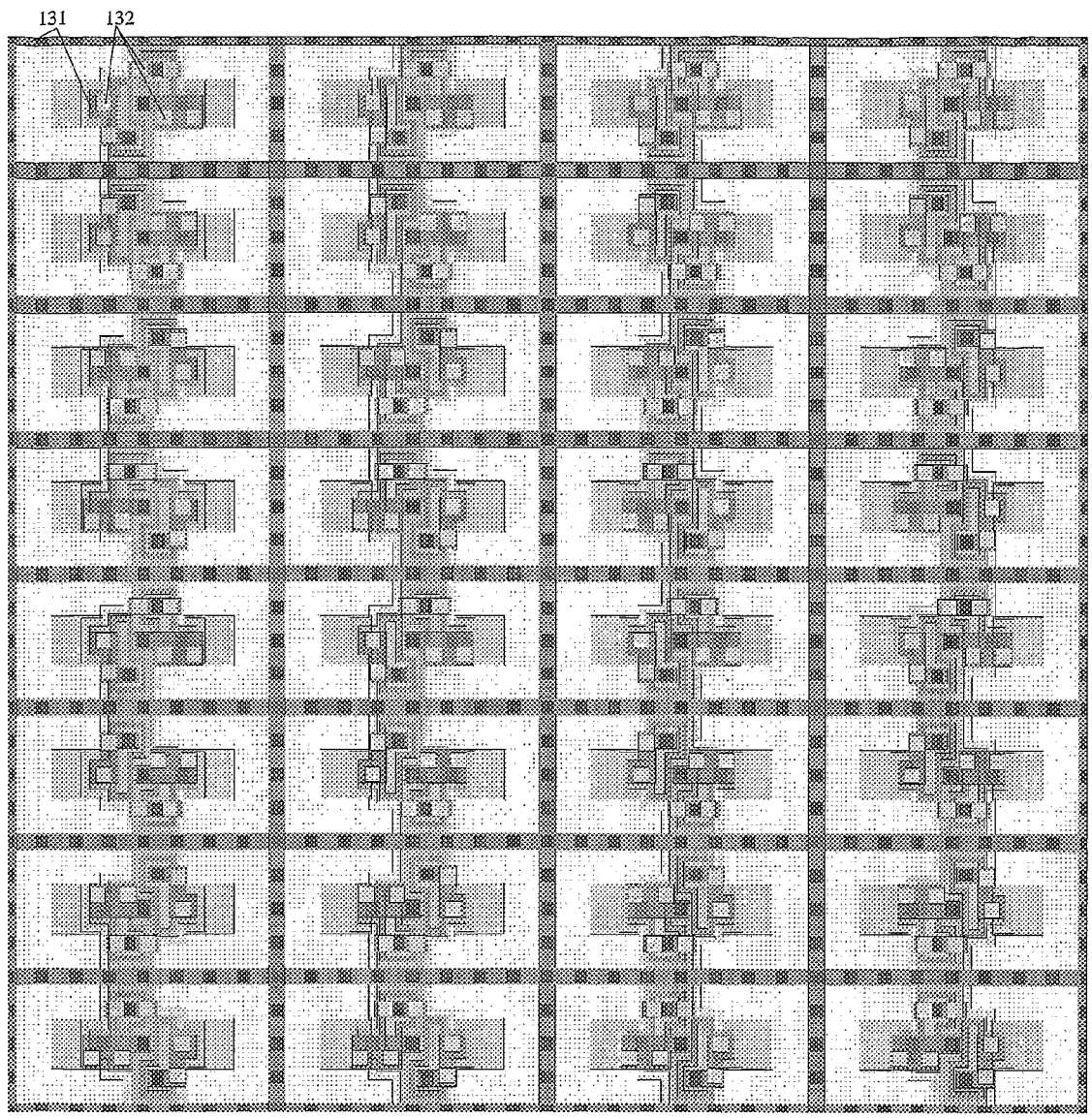
Figure 7D:
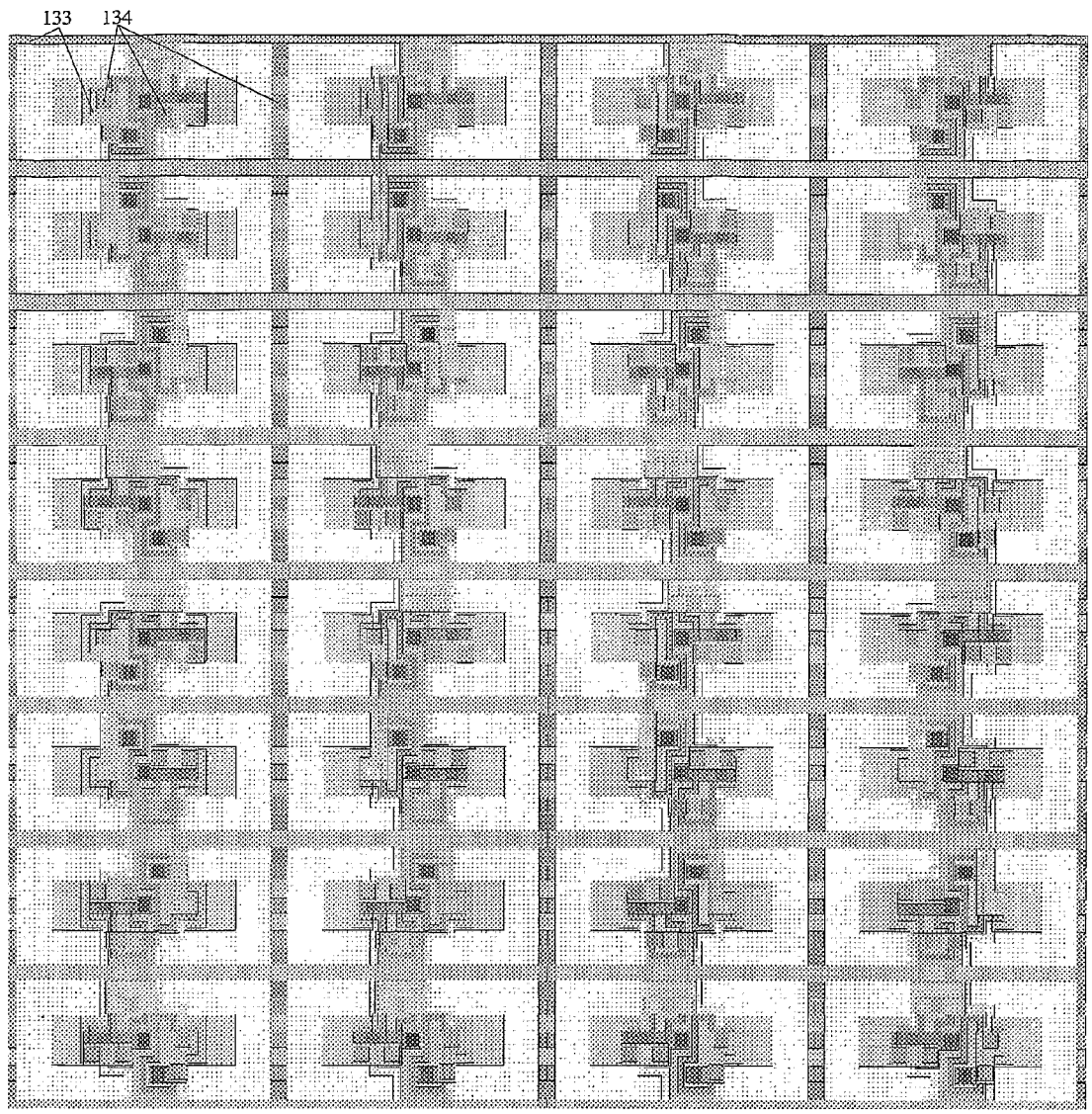
Figure 7E:
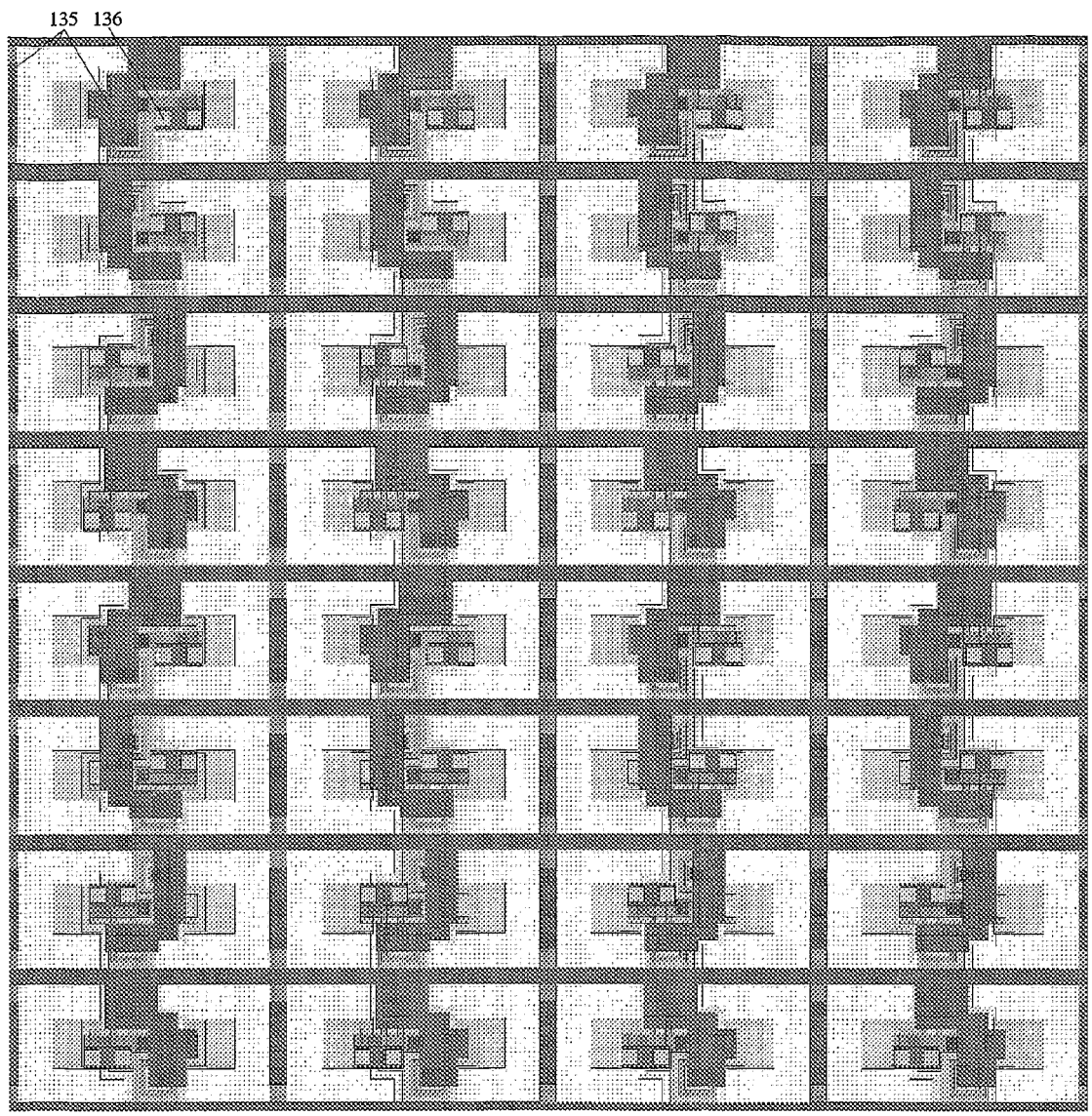
Figure 7F:
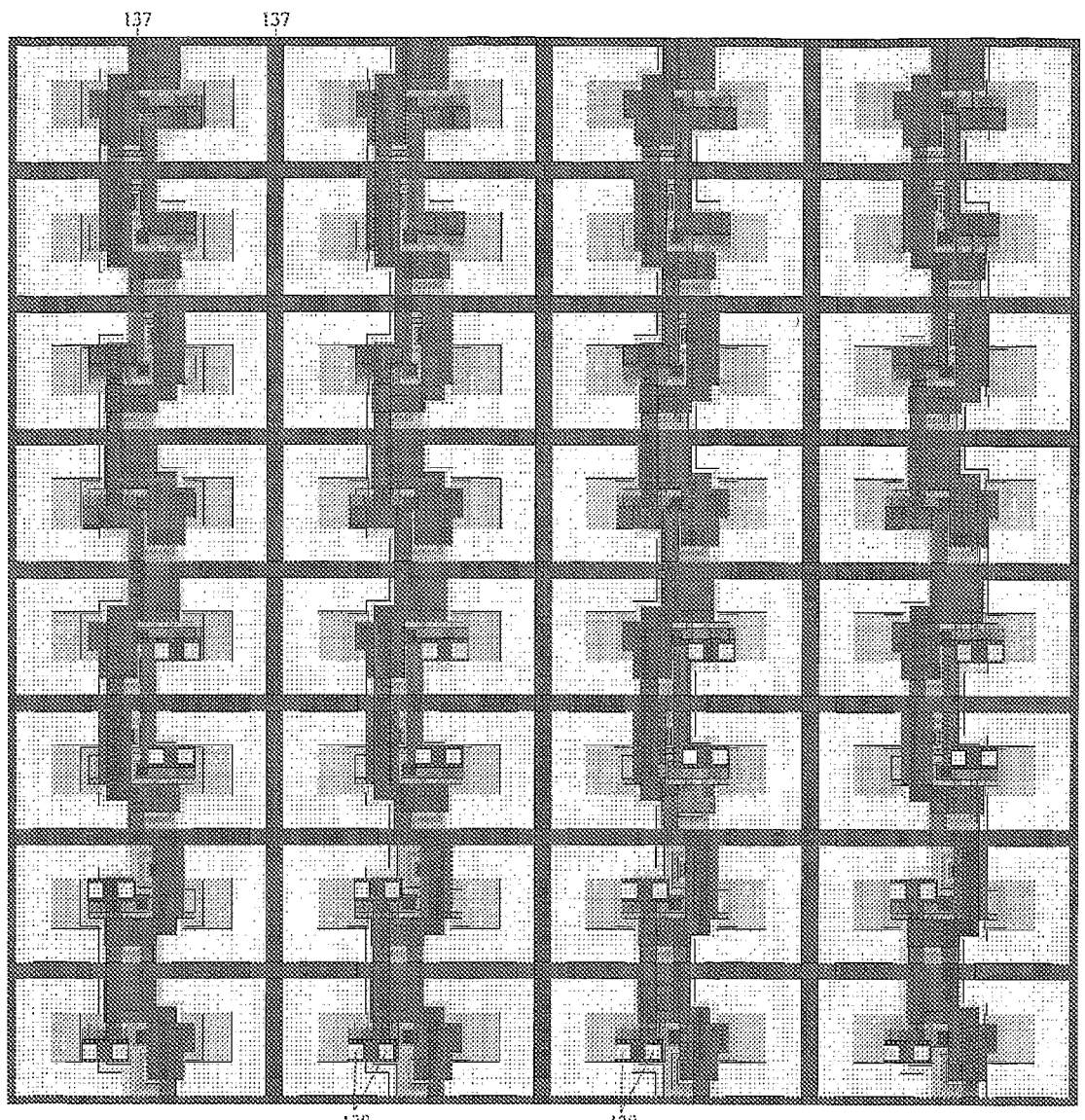
Figure 7G:
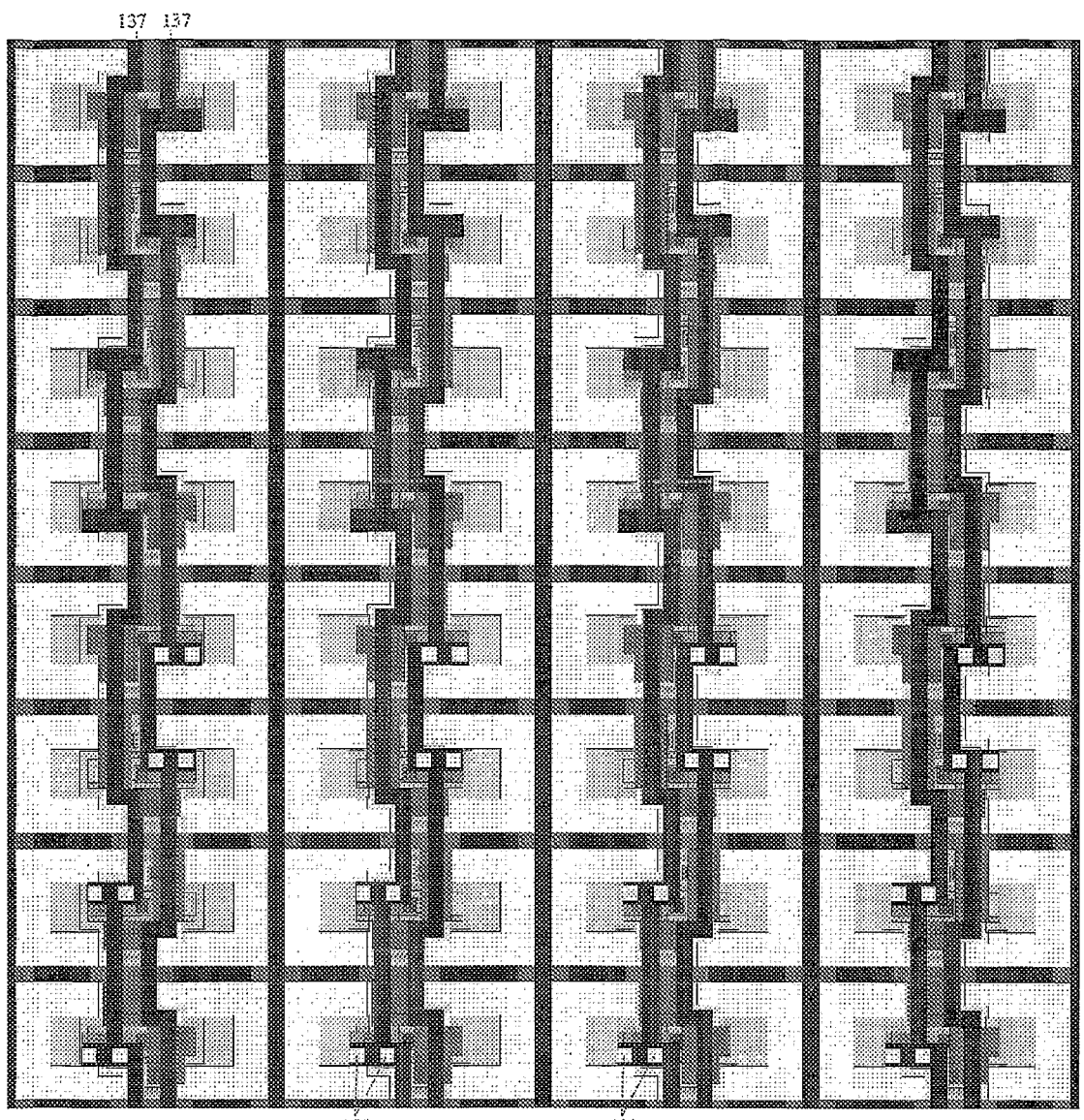
Figure 7H:
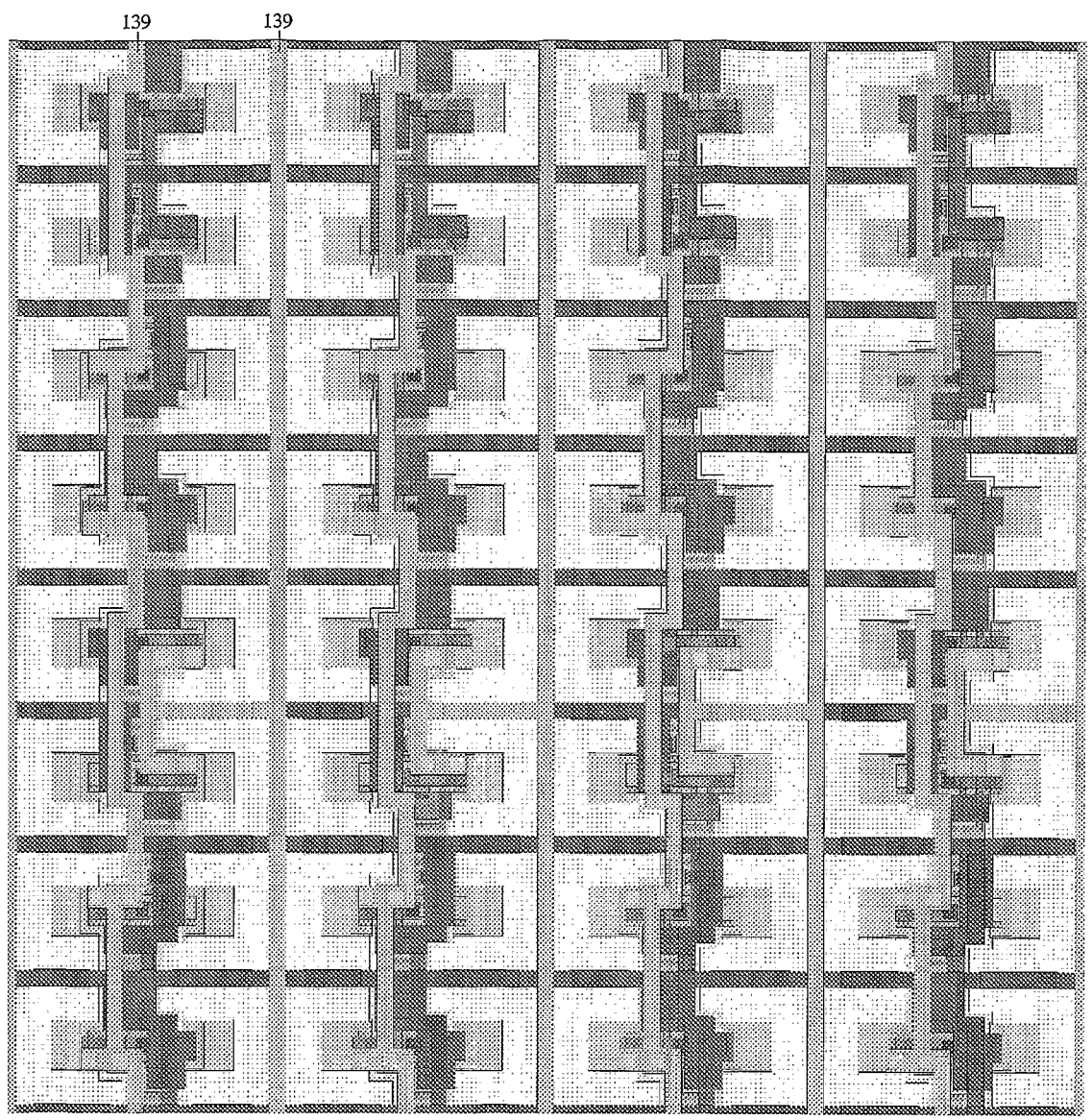
FIGS. 7H and 7I show alternative layouts to those of FIGS. 7F and 7G, respectively.
Figure 7I:
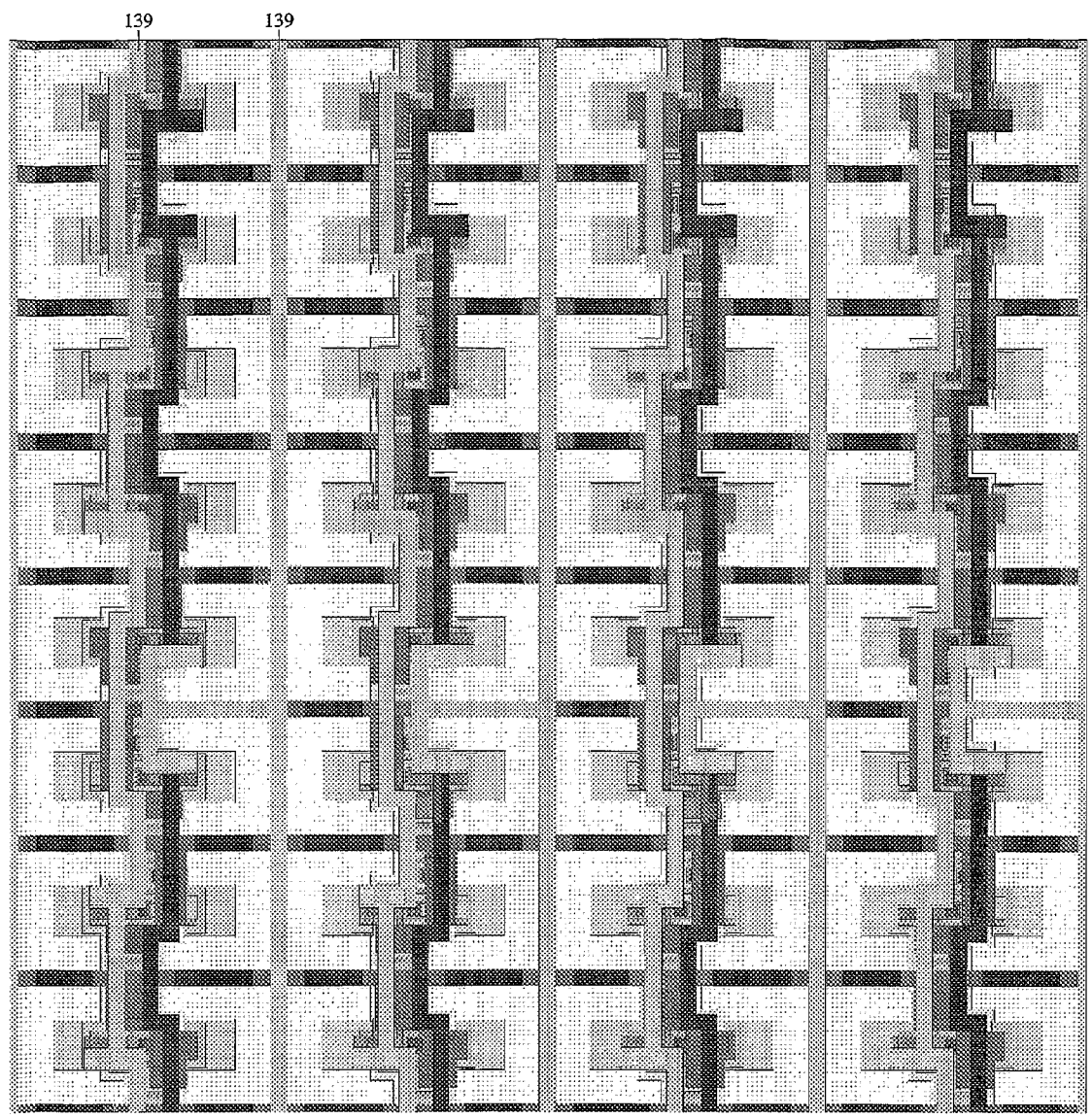
Figure 8A:
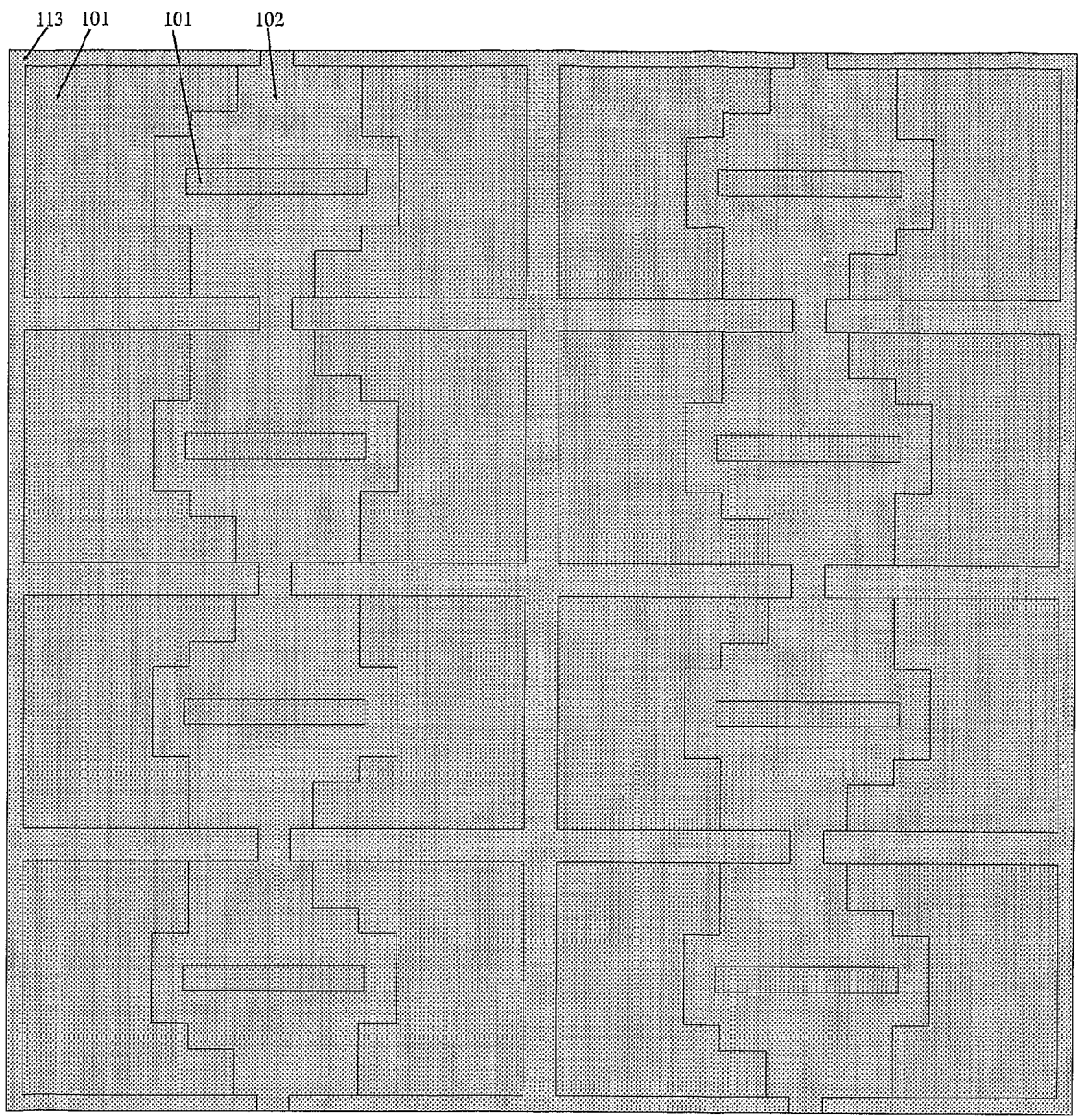
FIGS. 8A, 8B and 8C provide top views of the layout of Pixel/Lixel Design #8, made on Thick-Film SOI substrates, corresponding to the cross sections of FIGS. 12A and 12B, at different stages of the fabrication. An exemplary matrix with 4 rows and 4 columns is shown.
Figure 8B:
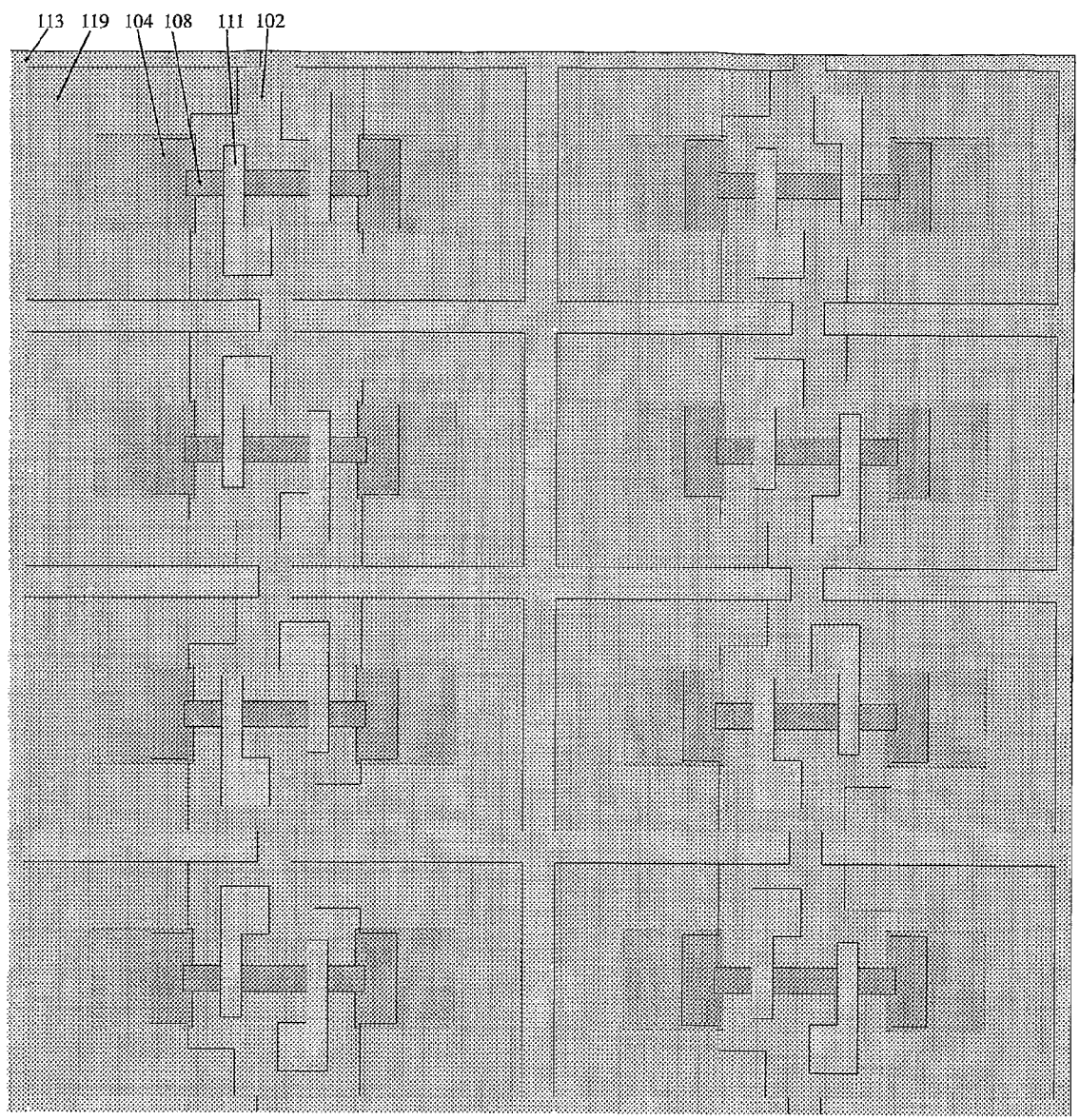
Figure 8C:
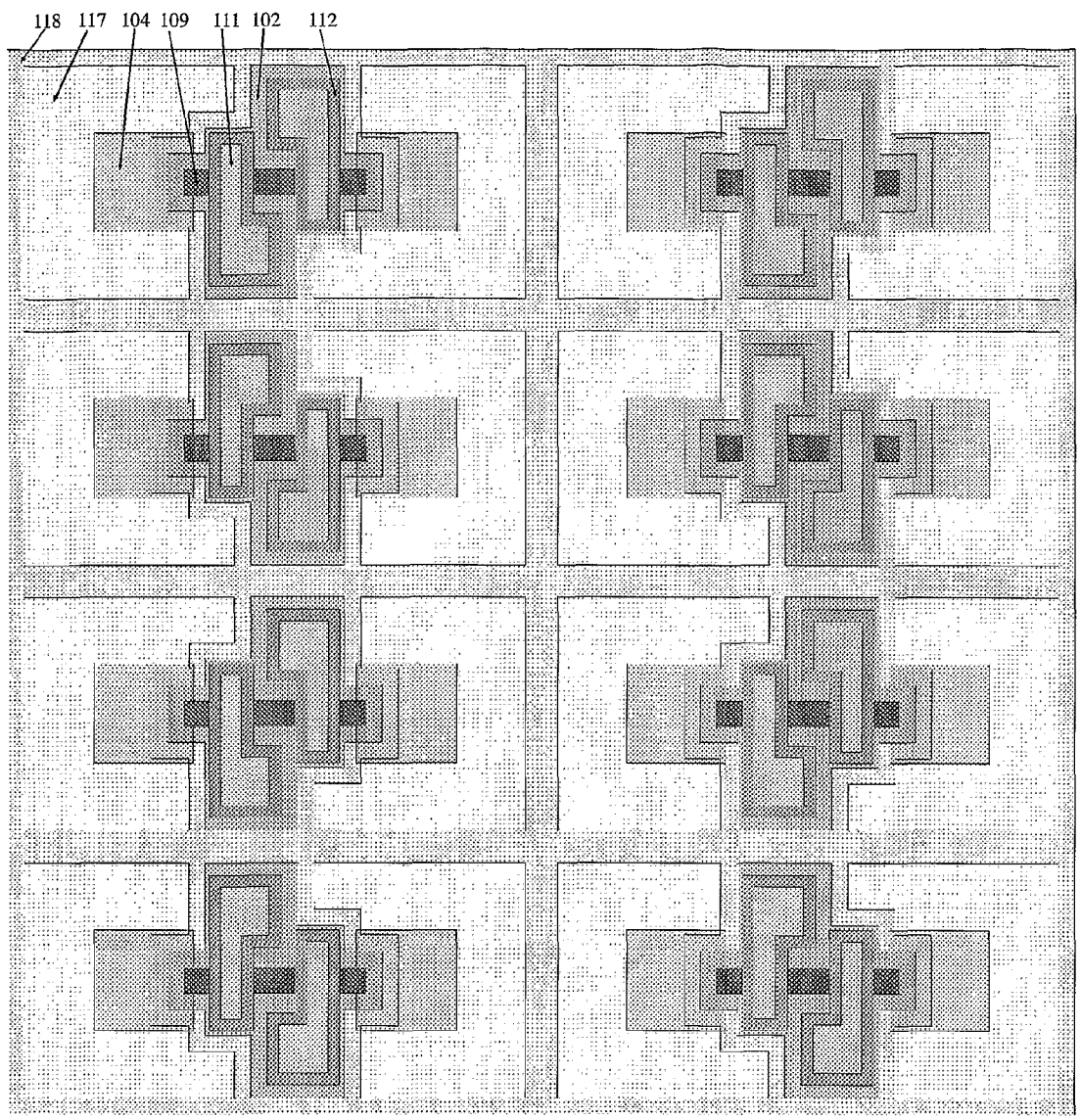

FIG. 7A—Top view of layout before Silicide formation
FIG. 7B—Top view of layout after Silicide and Contacts
FIG. 7C—Top view of layout after Metal-1 and Via-1
FIG. 7D—Top view of layout after Metal-2 and Via-2
FIG. 7E—Top view of layout after Metal-3 and Via-3
FIG. 7F—Top view of layout after Metal-4 and Via-4
FIG. 7G—Top view of layout after Metal-5
FIG. 7H—Top view of layout after Metal-4 and Via-4, alternative to that of FIG. 7F
FIG. 7I—Top view of layout after Metal-5, alternative to that of FIG. 7G Pixel/Lixel Design #8

This design is a first implementation using Thick-Film SOI substrates.

The Pixel/Lixel designs #1 through #7 are meant for bulk substrates and process flows introduced in PCT/EP01/11817. The Continuation-in-Part of U.S. patent application Ser. No. 10/399,495 explicitly shows one exemplary implementation using Thick-Film SOI substrates, with optoelectronic devices having active layers deposited on CMOS active areas, which is the base for Pixel/Lixel design #8.

In said exemplary implementation, the top silicon film has a thickness such that the n-Wells and p-Wells, having the typical depth for a given CMOS generation made on bulk substrates, reach the buried oxide of the SOI substrate. The lateral isolation was implemented with shallow trenches, with the typical depth that these trenches would have in bulk substrates for the same CMOS generation, and with deep trenches whose bottom reaches the buried oxide.

For the purpose of designing the Pixel/Lixel cells, the shallow trenches are used to isolate the active area on which the photonic layers are epitaxially grown from the active areas on which the NMOS row-select transistors are made. The deep trenches are used to separate adjacent active areas with photonic films.

Figure 12A:
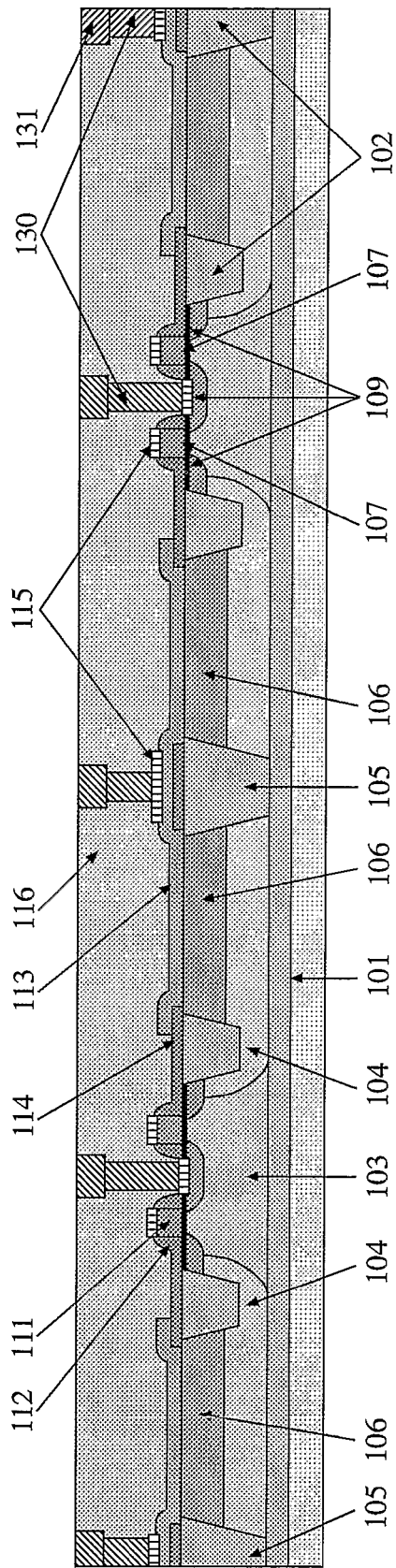
FIGS. 12A and 12B show cross section views of a second example of implant and epitaxial layer configuration of a 2-Pixel/Lixel cell, made on Thick-Film SOI substrates, with shared source contact at mid-distance between gates, such as those of Pixel/Lixel Design #2 and #3.

FIG. 12A shows how the connection, underneath a shallow trench, between the drain region of a MOSFET and the bottom electrode of APD/ALED devices made on Thick-Film SOI, and the complete isolation, provided by a deep trench, between adjacent active areas with photonic films.

All other aspects of Pixel/Lixel Design #8 can remain identical to those described in Pixel/Lixel designs #1 through #7. Because of this, only the most relevant differentiating points of Pixel/Lixel designs #8 will be shown in FIGS. 8A to 8D.

Figure 12B:
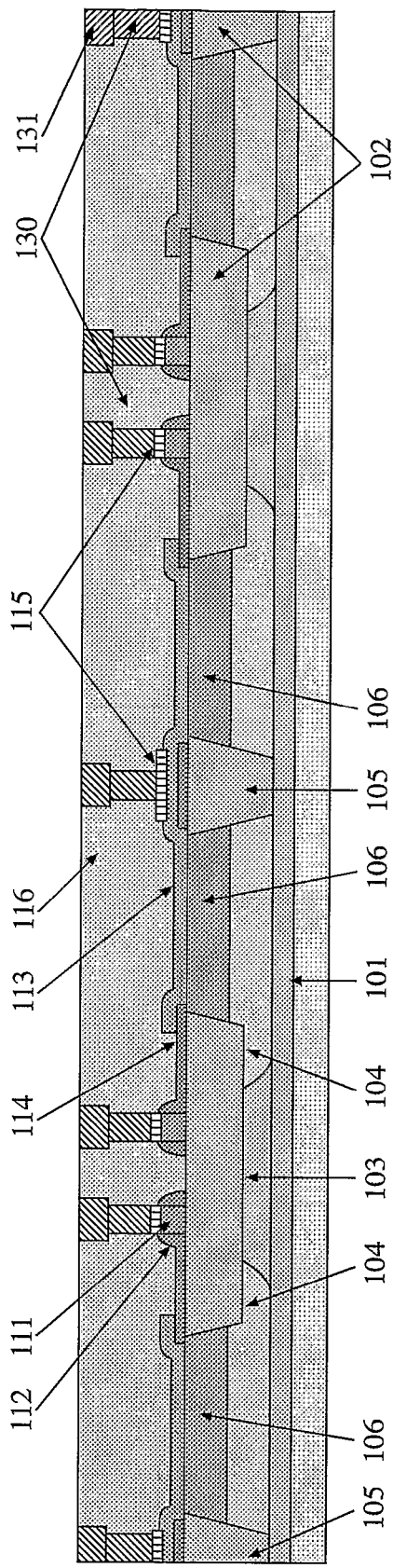

FIGS. 8A, 8B, 8C, and 8D, provide top views of the layout for a Pixel/Lixel Design made on Thick-Film SOI corresponding to the cross section of FIGS. 12A and 12B.

Pixel/Lixel Design #9

This design is a second implementation using Thick-Film SOI substrates, based on the Design #8, but with a layout for active regions such that, all Row-Select N-MOSFETs in one horizontal row of "2-Pixel/lixel" cells, have their p-Wells connected together under Shallow Trench Isolation (STI) regions, arranged along said horizontal row, while the active regions for the APDs/ALEDs are separated by Deep Trench Isolation (DTI) regions. Said p-Wells in each "2-Pixel/Lixel" cells are shared by the 2 Row-Select N-MOSFETs inside said cells. The p-Wells along a given horizontal row of "2-Pixel/Lixel" cells, are electrically isolated from the p-Wells along any other horizontal row of "2-Pixel/lixel" cells.

It is then possible to independently bias the p-Wells of one horizontal row of 2-Pixel/Lixel cells, without doing so to any other p-Wells. Because said p-Wells are all connected to the lateral edge of the sensor/emitter matrix, only one contact to all p-Wells in one row is needed, thereby resulting in almost no penalty in terms of area. This feature can be taken advantage of to have a "dynamic threshold voltage" for the Row-Select N-MOSFETs.

While the Row-Select N-MOSFETs inside the Pixels/Lixels are OFF, the threshold voltage should be high to keep a very low leakage current. When said N-MOSFETs are turned for the Pixels/Lixels to be accessed from the periphery, then the threshold voltage is lowered, but only for those that are being turned ON.

FIGS. 9A, 9B, 9C, 9D, 9E, 9F, 9G, and 9H, provide top views of the Pixel/Lixel Design #9, at different stages of the fabrication. An exemplary matrix with 4 rows and 4 columns is shown.

Figure 9A:
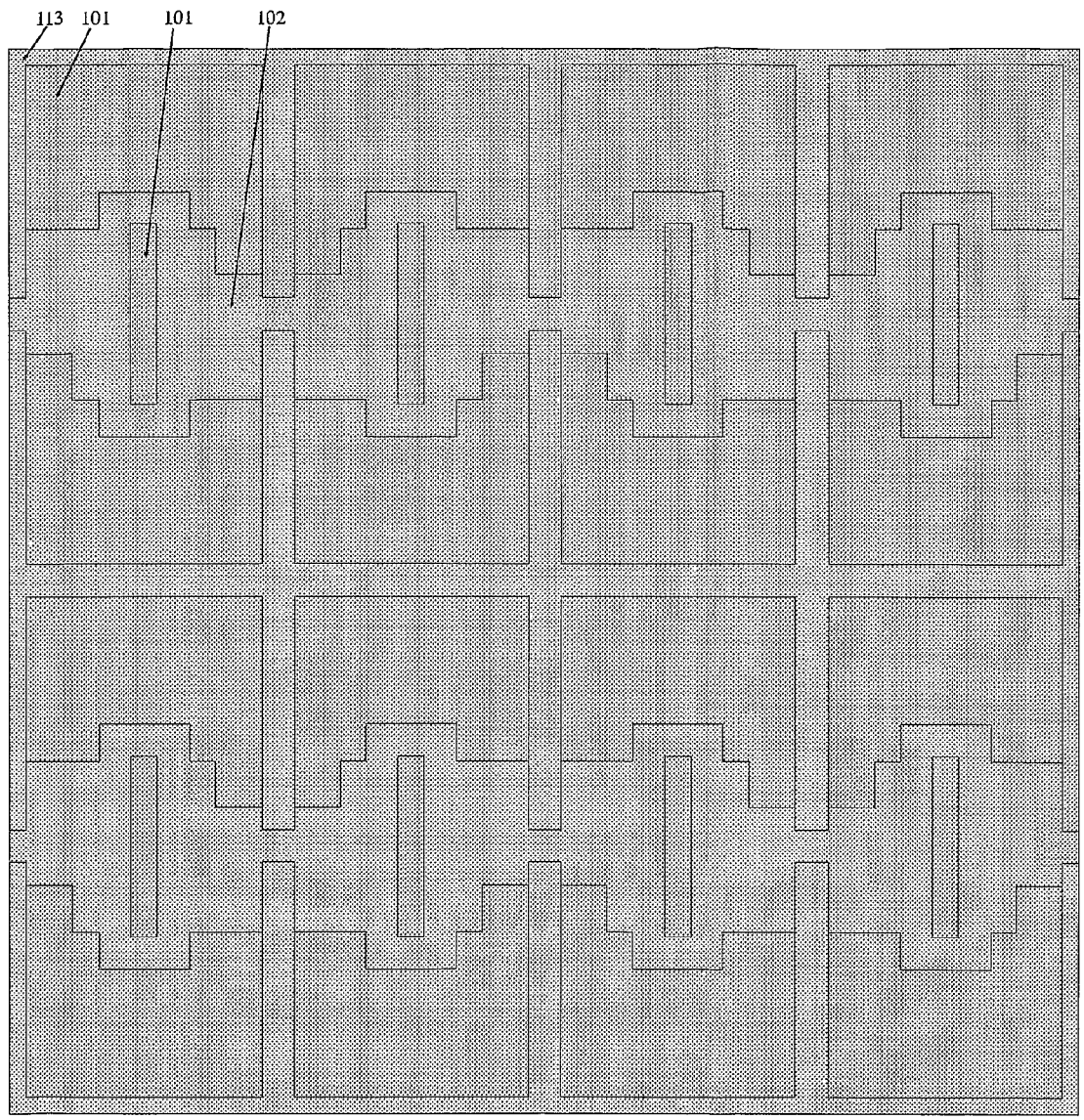
FIGS. 9A, 9B, 9C, 9D, 9E, 9F, 9G, and 9H provide top views of the layout of Pixel/Lixel Design #9, a second implementation with Thick-Film SOI substrates, corresponding to the cross sections of FIGS. 12A and 12B, at different stages of the fabrication. An exemplary matrix with 4 rows and 4 columns is shown.
Figure 9B:
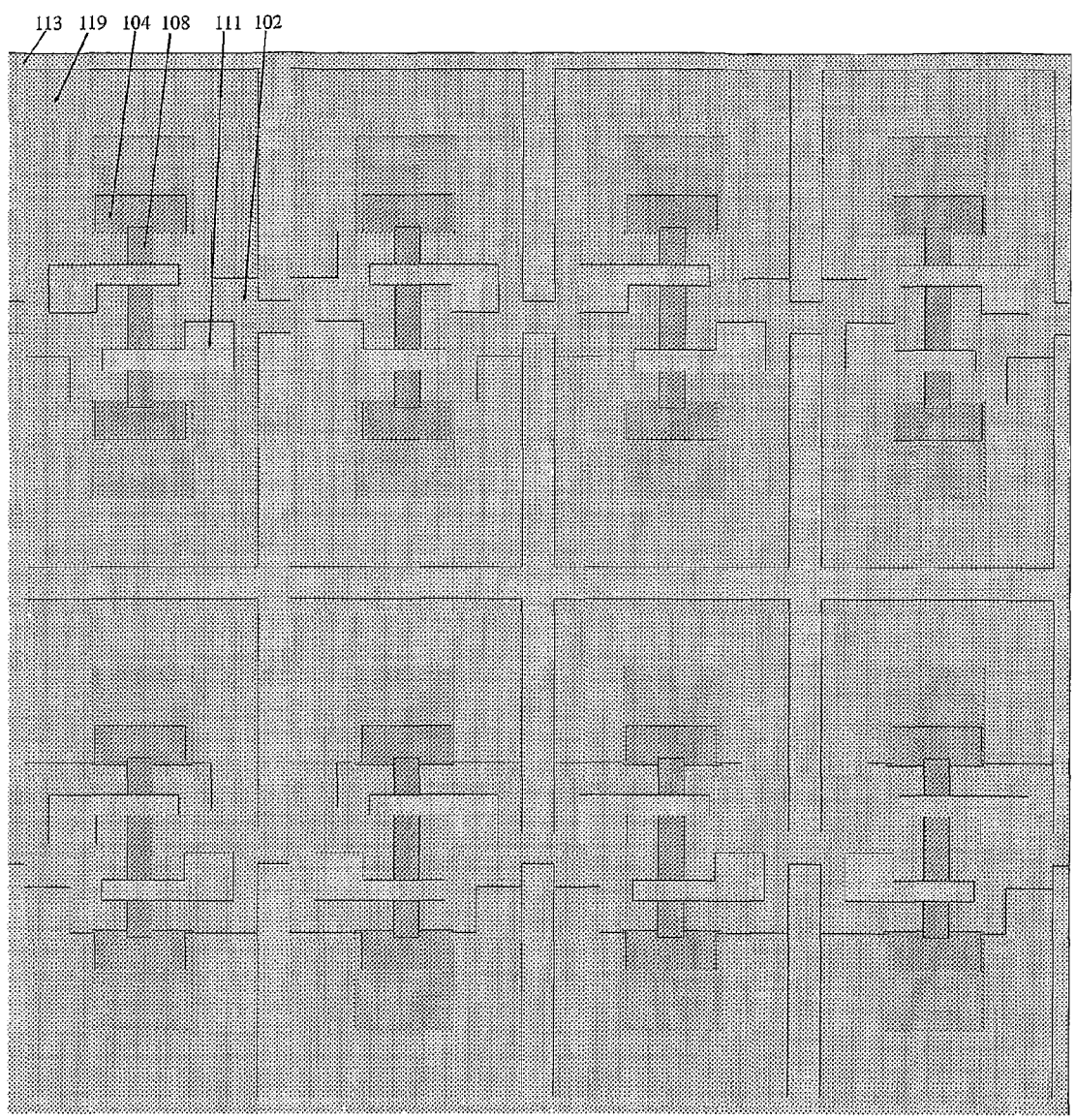
Figure 9C:
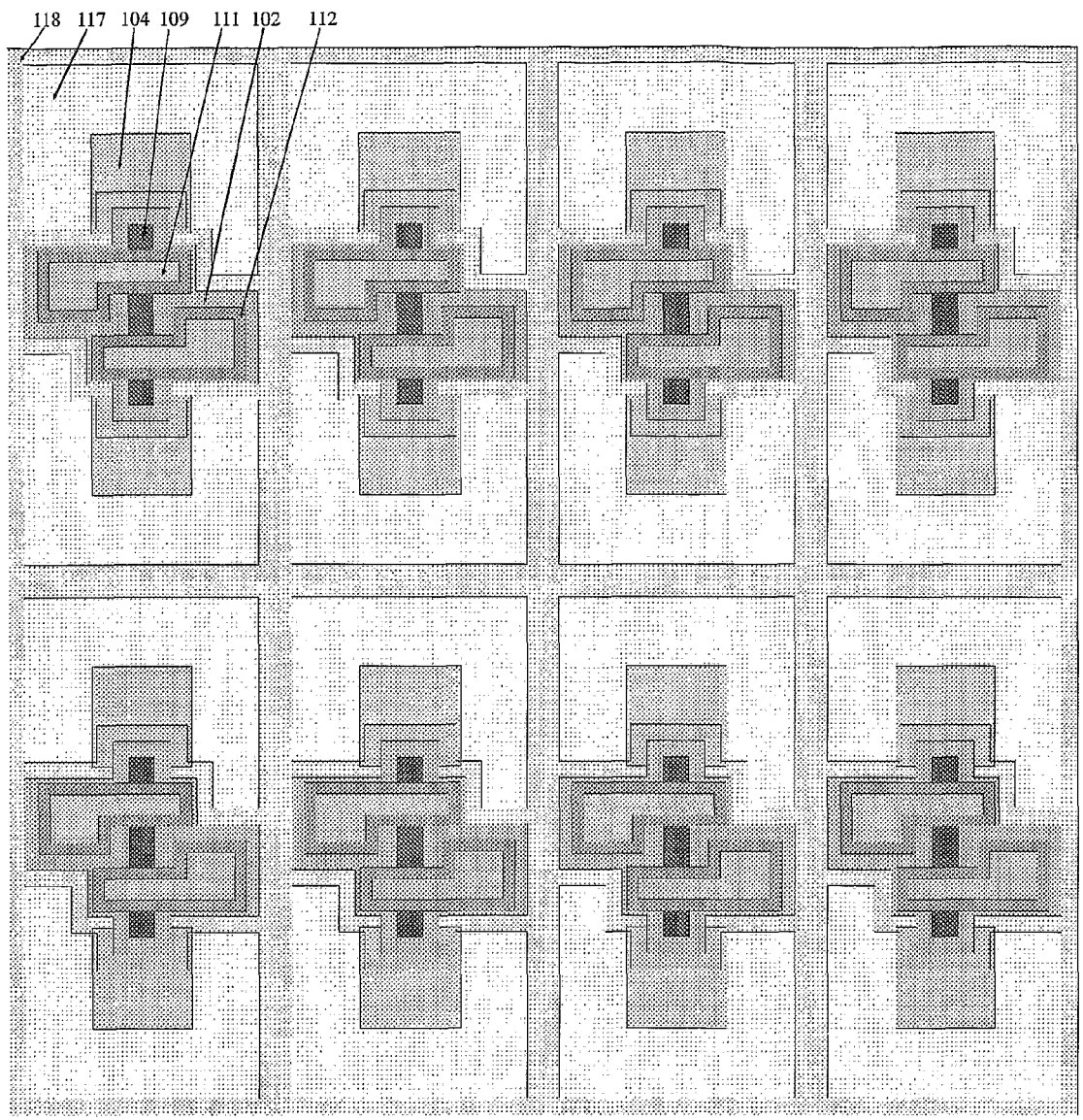
Figure 9D:
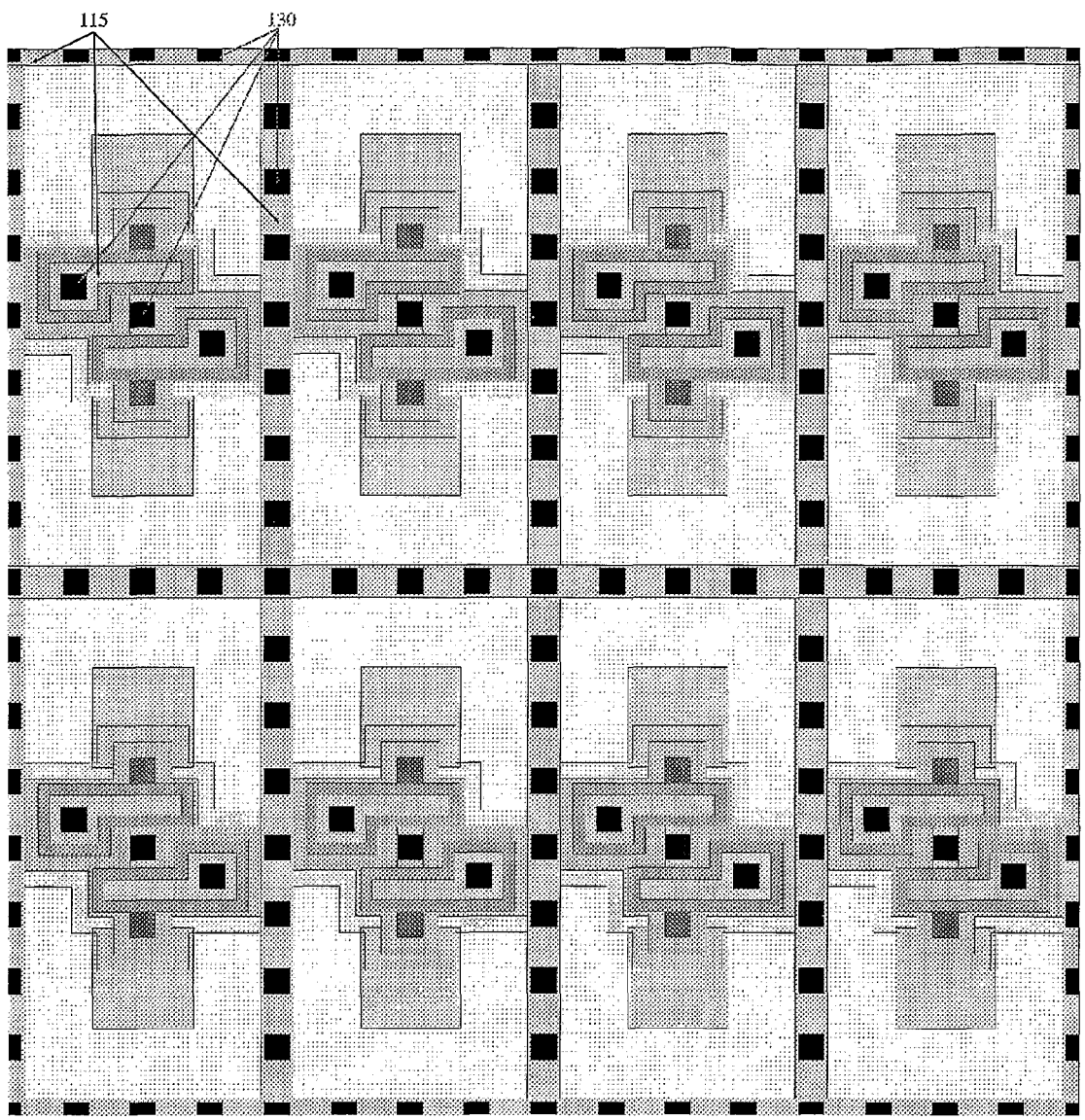
Figure 9E:
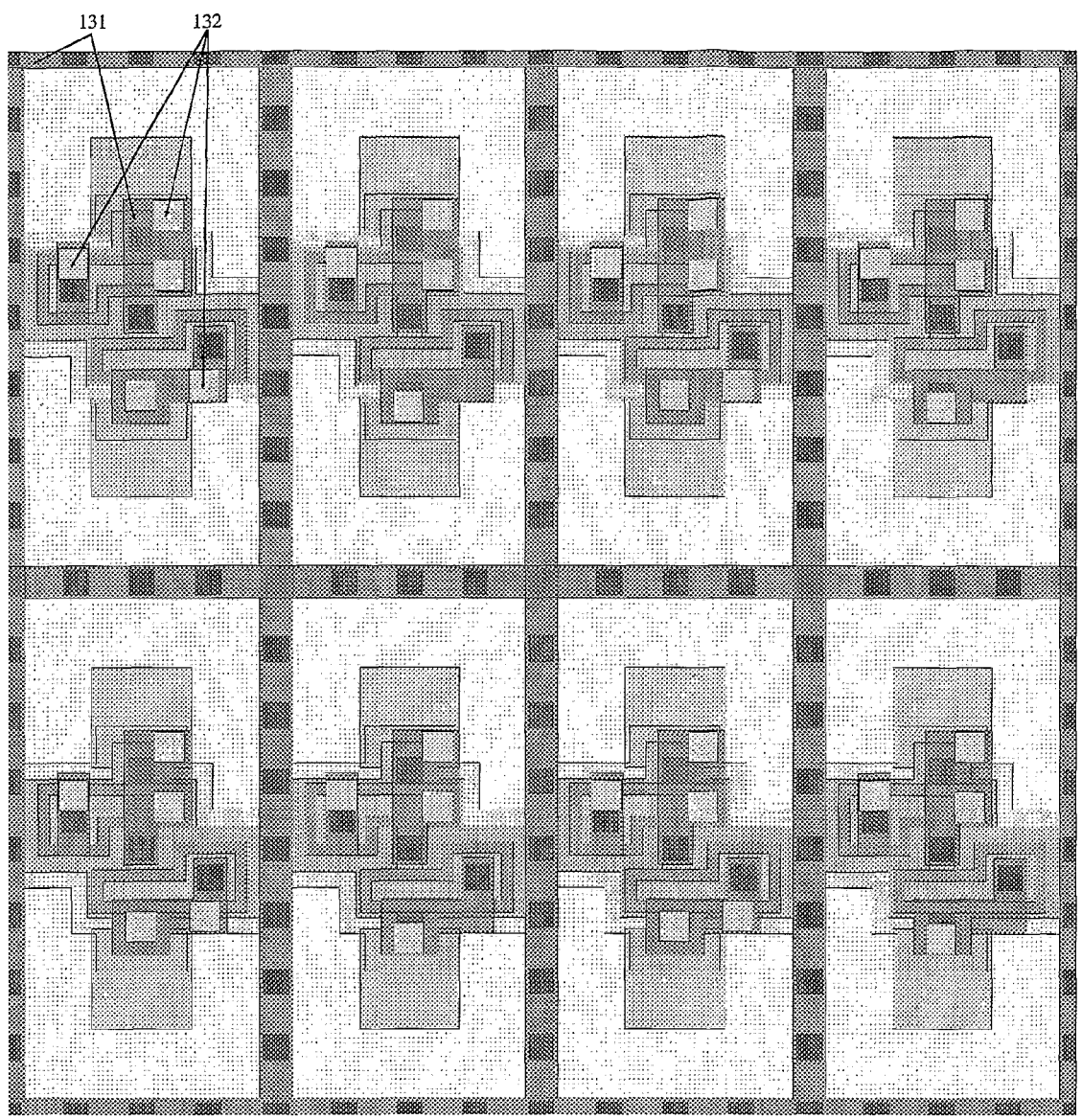
Figure 9F:
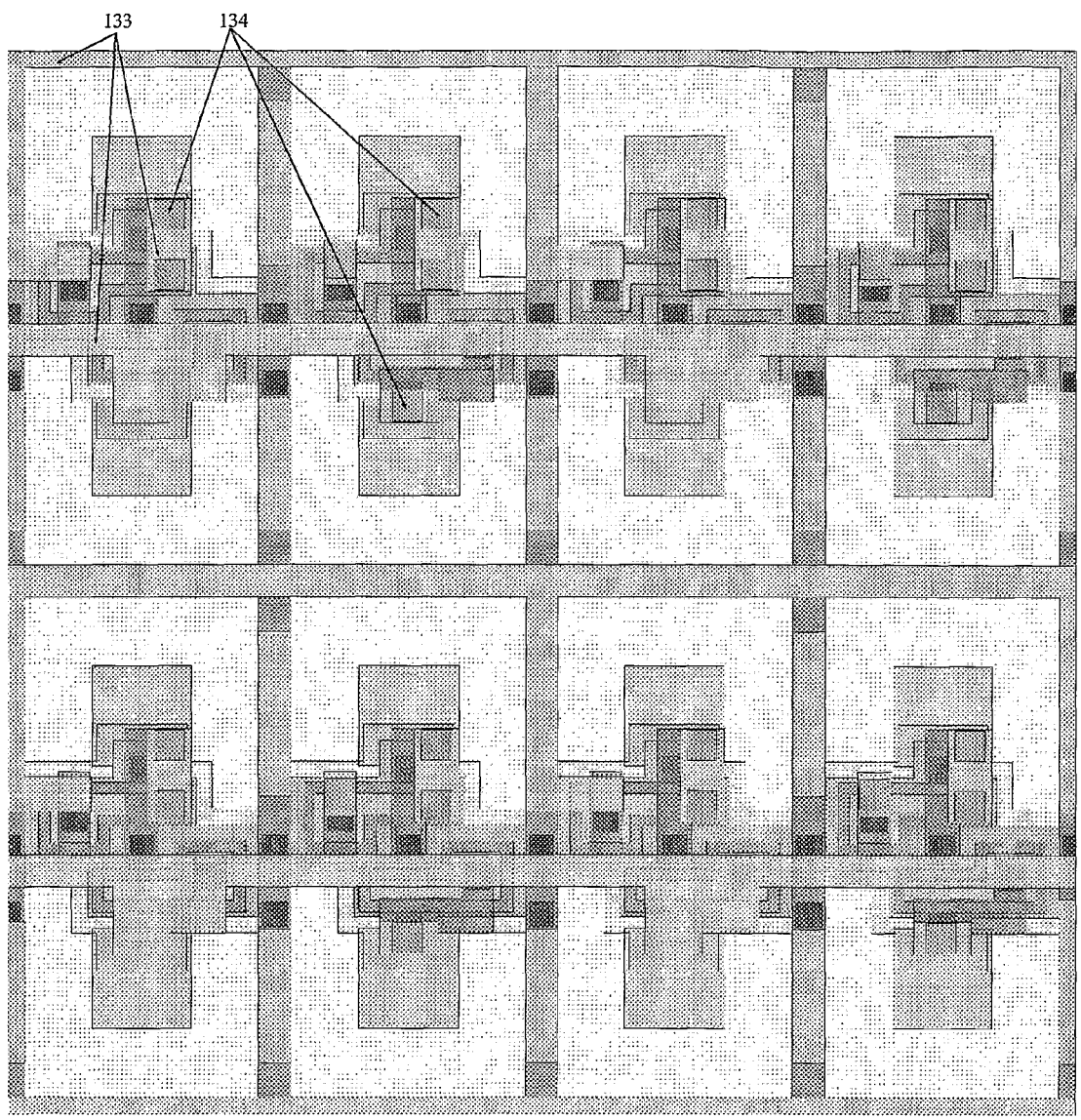
Figure 9G:
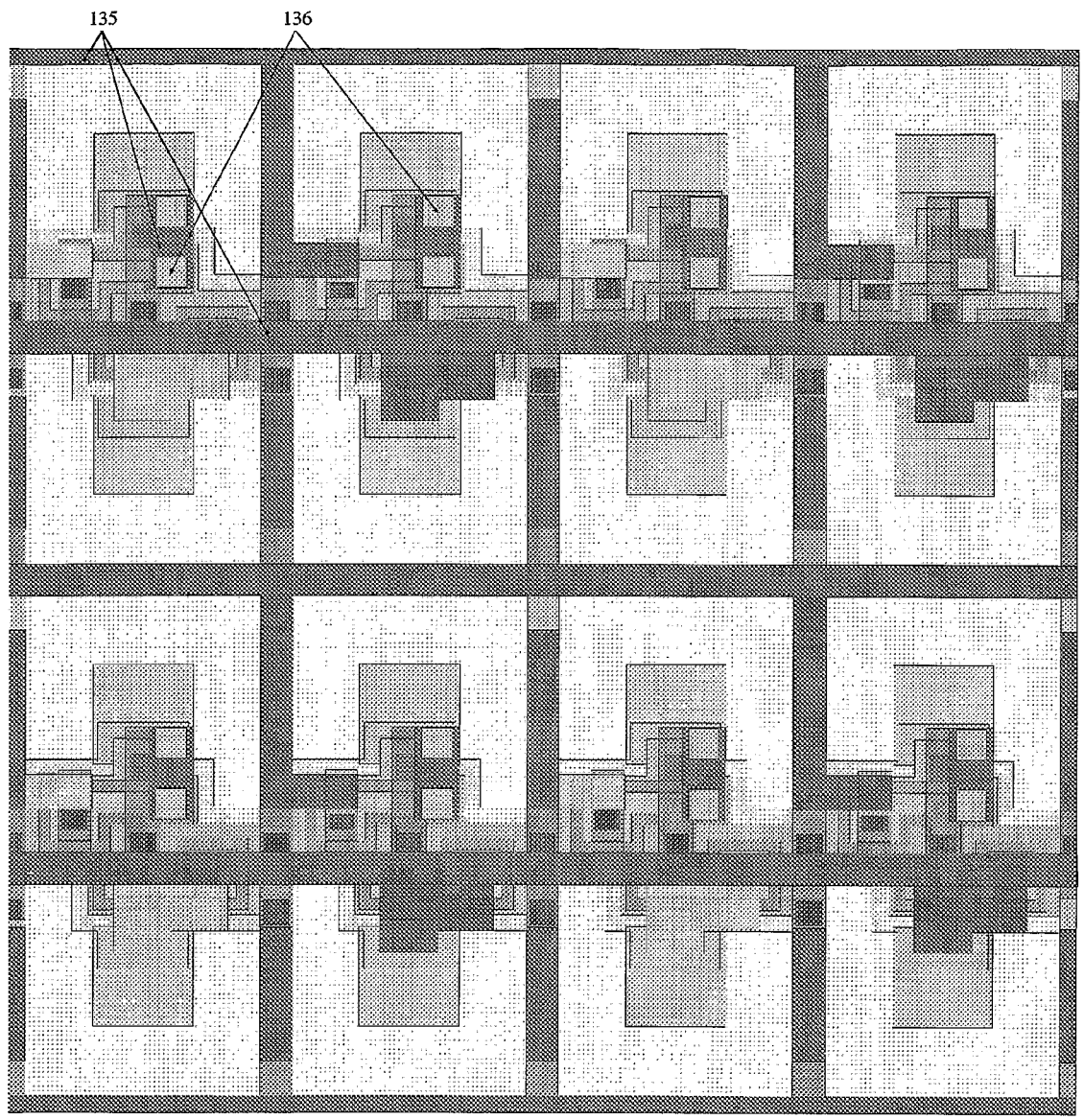
Figure 9H:
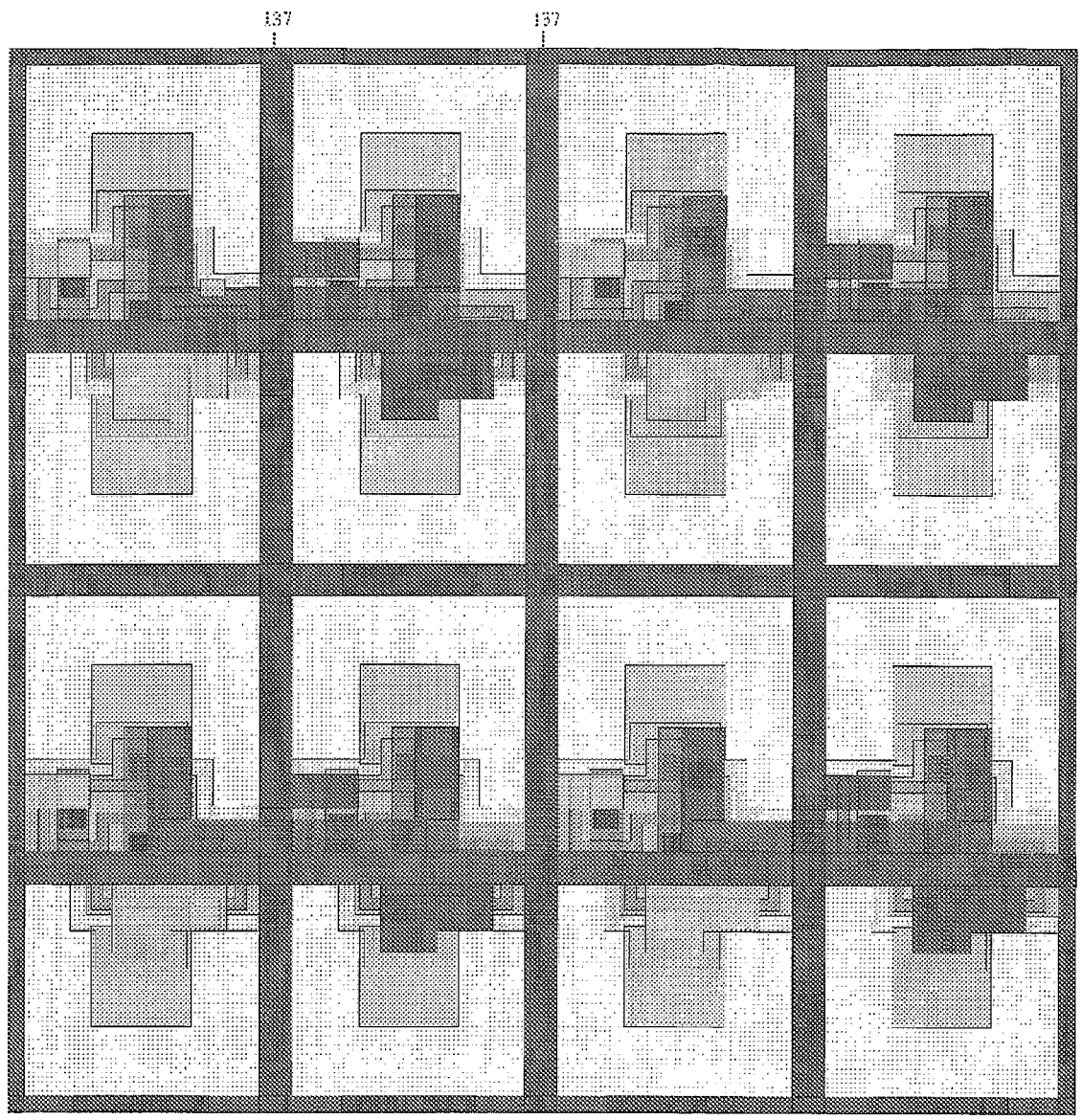

FIG. 9A—Top view of layout after definition of active, shallow trench, and deep trench regions.
FIG. 9B—Top view of layout after definition of poly gates and n-type implants.
FIG. 9C—Top view of layout before Silicide formation.
FIG. 9D—Top view of layout after Contacts.
FIG. 9E—Top view of layout after Metal-1 and Via-1.
FIG. 9F—Top view of layout after Metal-2 and Via-2.
FIG. 9G—Top view of layout after Metal-3 and Via-3.
FIG. 9H—Top view of layout after Metal-4.

Pixel/Lixel Design #10

This design is an implementation using Thin-Film SOI or GOI substrates.

The Pixel/Lixel designs #1 through #7 are meant for bulk substrates and process flows introduced in PCT/EP01/11817. PCT/EP03/10346 and PCT/EP03/13953 extend these device and process architecture concepts to sub-100 nm CMOS technology made on Thin-Film Silicon-On-Insulator (SOI) or Thin-Film Germanium-On-Insulator (GOI) substrates, with optoelectronic devices having active layers deposited on CMOS active areas.

Devices made on Thin-Film SOI or GOI substrates, also known as "fully depleted SOI" devices, do not have n- or p-Wells, and therefore the electrical path between the bottom electrode of the APD/ALED and the row-select transistor is done differently, as explicitly shown in FIGS. 13A and 13B, which is similar to FIGS. 3 and 4 of PCT/EP03/13953. All other aspects of Pixel/Lixel Design #9 can remain identical to those described in Pixel/Lixel designs #1 through #7.

FIGS. 10A, 10B, 10C, and 10D, provide top views of the layout for a Pixel/Lixel Design made on Thin-Film SOI (or GOI) corresponding to the cross sections of FIGS. 13A and 13B. It is based on Pixel/Lixel Design #6, and replaces the n-Well connection by the alternatives put forward in PCT/EP03/10346.

Figure 10A:
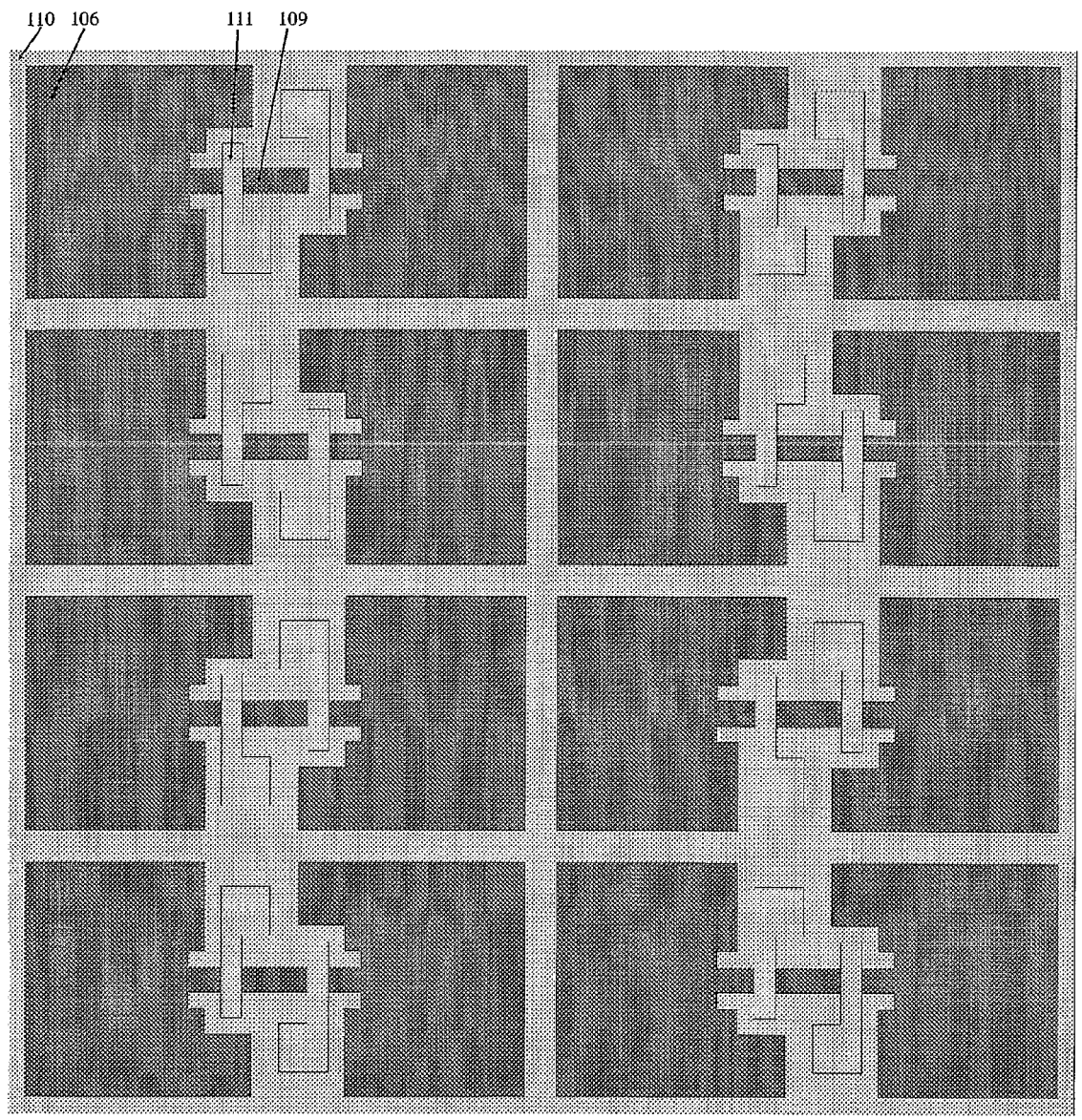
FIGS. 10A, 10B, and 10C provide top views of the layout of Pixel/Lixel Design #9, made on Thin-Film SOI or GOI substrates, corresponding to the cross section of FIGS. 13A and 13B, at different stages of the fabrication. An exemplary matrix with 4 rows and 4 columns is shown.
Figure 10B:
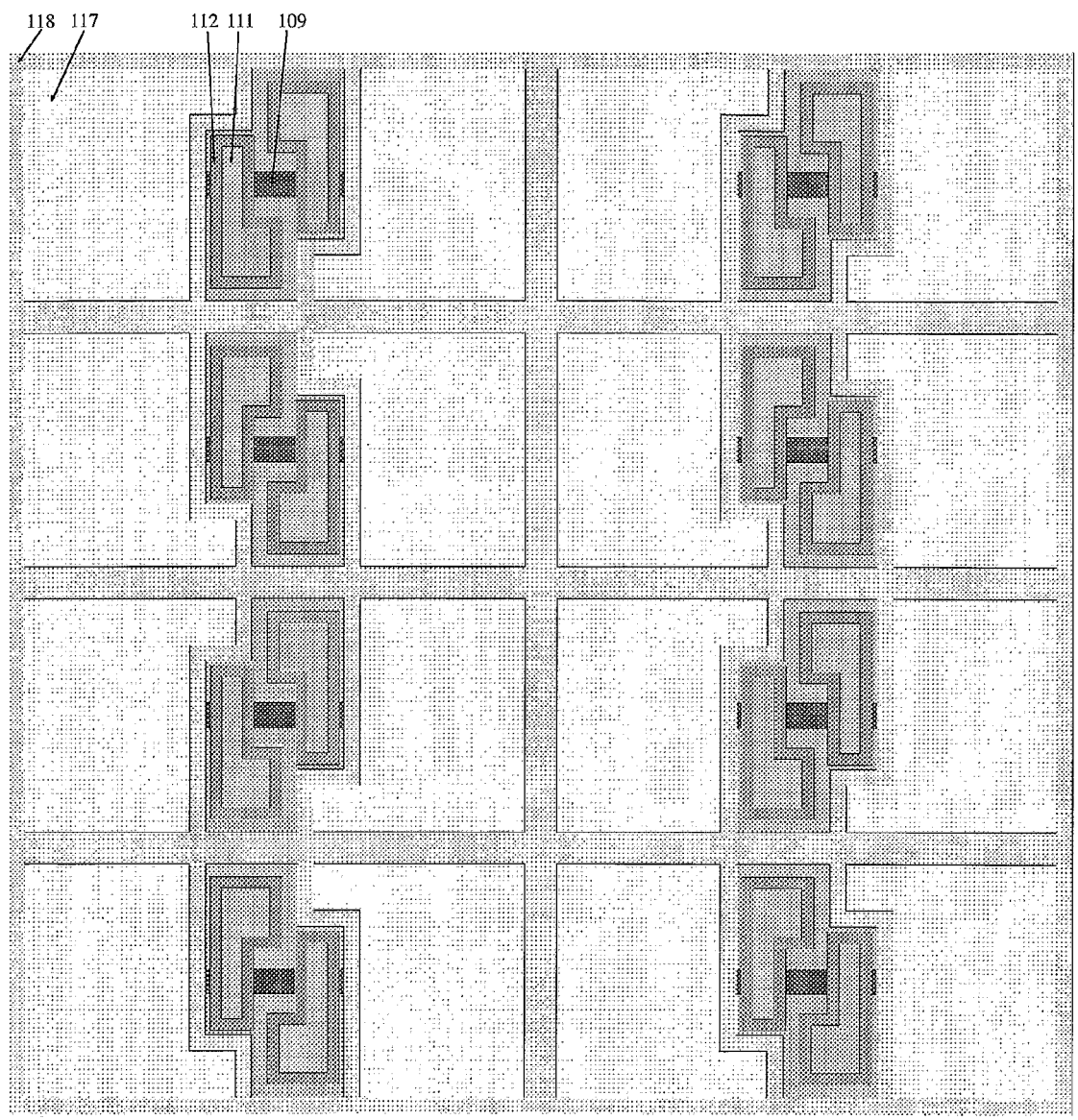
Figure 10C:
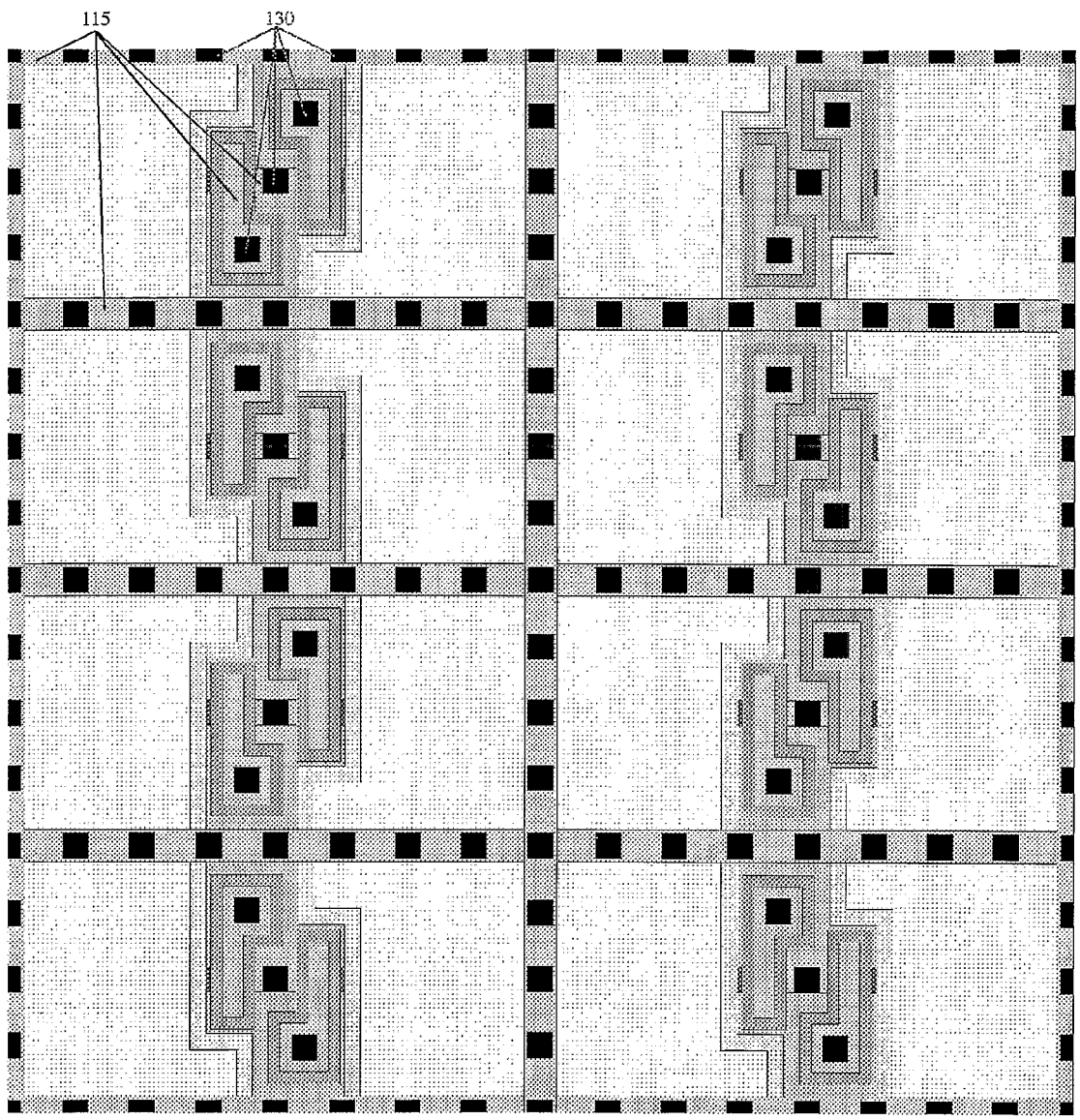

FIG. 10A—Top view of layout showing active areas and poly-Si gates
FIG. 10B—Top view of layout after patterning of hard mask (nitride) before epitaxy
FIG. 10C—Top view of layout after patterning of SiGeC epitaxial layers, and spacer formation FIG. 10D—Top view of layout after Silicide and Contacts The changes in layout with respect to Pixel/Lixel Design #6 could be seen as minor, but that is because many differences are in the epitaxial layer profiles (doping and heterojunction), which are considerably different for bulk substrates and Thin-Film SOI substrates. Essentially all significant differences in layout are for layers before the "Silicide", and therefore all the metallization layers can be identical to those shown in Pixel/Lixel Designs #1 through #7.

The Pixel/Lixel designs #1 through #7 can be made simultaneously, side by side, because they all share the same process flow on the same type of substrate, and the differences are only in terms of layout. The process flow to make these Pixel/Lixel designs can have a few minor variations, depending on the process technology in question. In what the APDs/ALEDs are specifically concerned, the active area under the epitaxial SiGeC film could have slightly different processing steps, which may or may not impact the thickness and profiles of the epitaxial films.

Figure 11A:
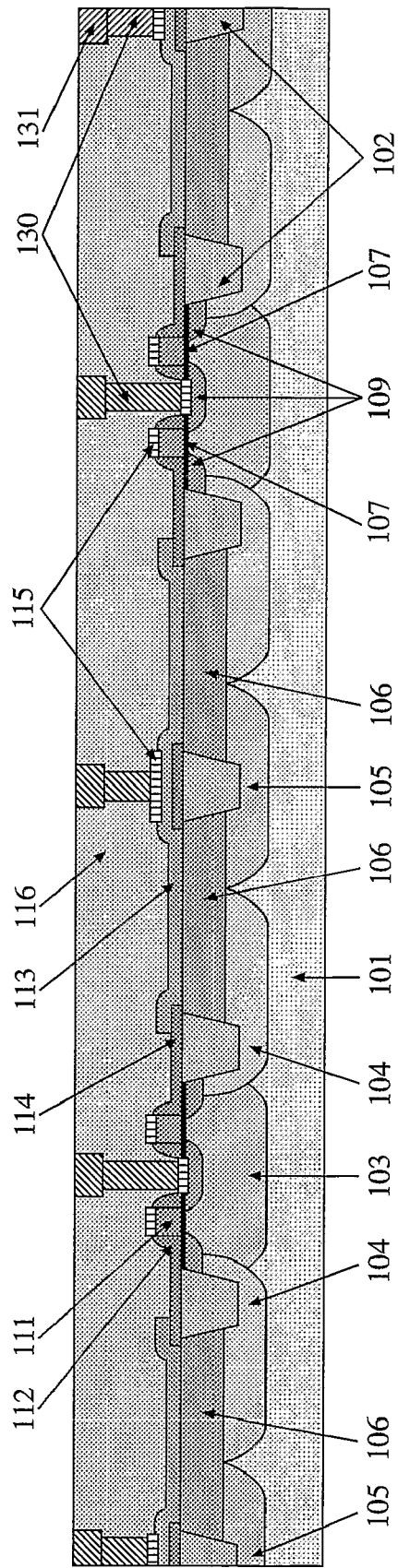
FIGS. 11A and 11B show cross section views of a first example of implant and epitaxial layer configuration of a 2-Pixel/Lixel cell, made on bulk substrates, with shared source contact at mid-distance between gates, such as those of Pixel/Lixel Design #2 and #3.
Figure 11B:
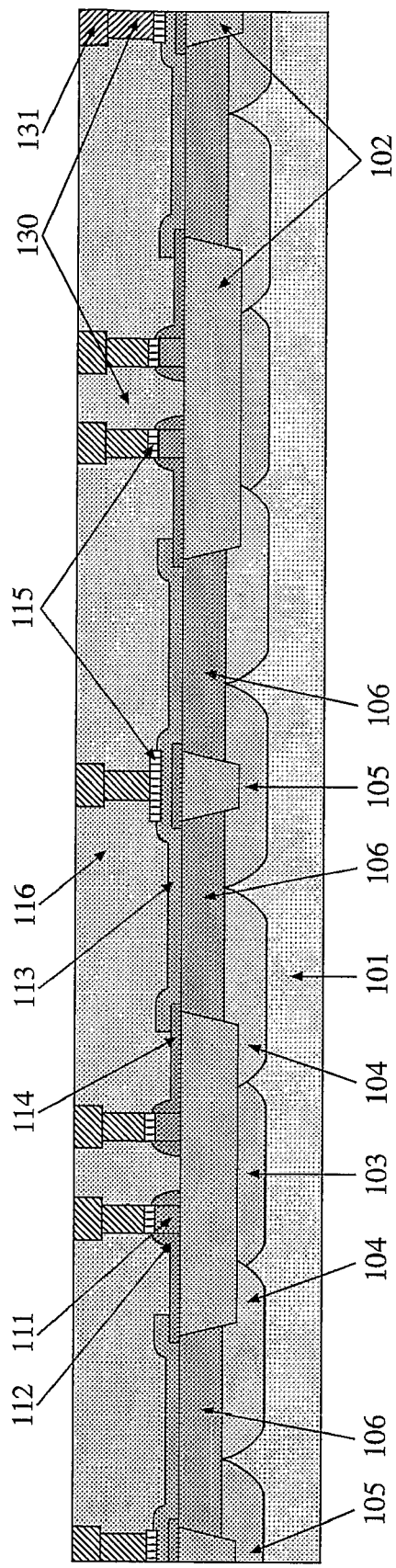

FIGS. 11A and 11B show cross section views of a first example of implant and epitaxial layer configuration of a 2-Pixel/Lixel cell with shared source contact at mid-distance between gates, such as those of Pixel/Lixel Design #2 and #3. In FIG. 11A the horizontal cut is through a region comprising a field area surrounding the two NMOS devices, while in FIG. 11B the horizontal cut is through a region comprising the active areas of the two NMOS devices.

FIGS. 12A and 12B show cross section views of a second example of implant and epitaxial layer configuration of a 2-Pixel/Lixel cell with shared source contact at mid-distance between gates, such as those of Pixel/Lixel Design #2 and #3. In FIG. 12A the horizontal cut is through a region comprising a field area surrounding the two NMOS devices, while in FIG. 12B the horizontal cut is through a region comprising the active areas of the two NMOS devices.

FIGS. 13A and 13B show cross section views of a third example of implant and epitaxial layer configuration of a 2-Pixel/Lixel cell with shared source contact at mid-distance between gates, such as those of Pixel/Lixel Design #2 and #3. In FIG. 13A the horizontal cut is through a region comprising a field area surrounding the two NMOS devices, while in FIG. 13B the horizontal cut is through a region comprising the active areas of the two NMOS devices.

Pixel/Lixel with Variable Size

This capability enables software selection of higher resolution or higher frame-rate, and ideally the number of rows and of columns are multiple integers of 4.

Pixel/Lixels Designs #2, #3 (a derivative of #2), #5, #6, and #7, #8, #9, #10, which are derived from #6, have in common a feature not found in conventional CMOS image sensors: during the interaction with the column circuitry, the output/input signals of four Pixels/Lixels, forming a square "Macro-Pixel/Lixel", can be combined (added) into a single electrical signal.

The "2-Pixel/Lixel" cell designs #2 and #6, can form a "Macro-Pixel/Lixel", when the four row-select signals from two "2-Pixel/Lixel" cells from adjacent rows, are turned ON simultaneously. Under these conditions, all 4 bottom electrodes of the four APDs/ALEDs are connected simultaneously to the data column line. The four APDs/ALEDs of one Macro-Pixel/Lixel are aligned with the same primary color filter.

For a sensor/emitter matrix consisting of Pixels/Lixels with the features just described, and assuming that the maximum frame rate is limited by the interaction between Pixels/Lixels and column circuitry, then the "Macro-Pixel/Lixel" feature can increase the frame rate by decreasing the resolution. It should be realized that this addressing method decreases the resolution, but does not discard any portion of the sensor/emitter matrix, receiving or forming an image. The full image, as formed by a lens system, is still acquired/generated, but just at a lower resolution.

The "Macro-Pixel/Lixel" addressing method has also advantages for low illumination intensity, when the signal from/to by each Pixel/Lixel is small. By adding the signals of four Pixels/Lixels, the decrease in resolution results in an increase of signal strength per "Macro-Pixel/Lixel", which may result in lower noise and higher dynamic range.

For image sensing in particular, these advantages are always true for the "photo-current" mode of operation (Electronic Rolling Shutter), and for the "accumulation of charges" mode of operation (Electronic Global Shutter), these advantages are also be true if the amount of charge stored in each Pixel/Lixel has not saturated the potential well of that Pixel/Lixel. For light emission said advantages are always true.

The "Macro-Pixel/Lixel" addressing method should not be confused with "windowing", which is a readout process used in conventional CMOS image sensors, that reduces the number of pixels during the readout process, by simply reading only a subset of the total number of pixels in the sensor matrix. The signals generated by the pixels that are not read, are simply discarded. Because this method consists in simply discarding the signals from some portions of the sensor matrix, it means that those portions of the image are also dropped from the acquisition process.

The "4-Pixel/Lixel" cell design #5 can also form a "Macro-Pixel/Lixel", when two Pixels/Lixels sharing an active area on a row from one cell, and the adjacent two Pixels/Lixels sharing an active area on a row from another cell, are connected to the same data column line and the respective row-select transistors are turned ON.

However, care must be taken with the layout of the data column lines. The other two active areas in the two cells involved, must be connected to data column lines separate from any of the three other active areas, that is, data column lines must skip 4 rows of Pixels/Lixels between groups of connected 4 Pixels/Lixels from two rows of adjacent cells, thereby requiring a total of 3 data column lines per 2 columns of Pixels/Lixels, or equivalently per column of "4-Pixel/Lixel" cells.

Such is only possible with at least 3 data column lines for each column of "4-Pixel/Lixel" cells. Therefore, for the same cell design until Metal-3, the operation with variable pixel size demands at least one extra metal level, that is, at least Metal-4. Given that Metal-4 allows 2 data column lines for each "4-Pixels/Lixels" cell, and since the variable pixel operation needs only 3 metal lines (two from Metal-3 level and one from Metal-4 level), the extra metal-4 line can be used to increase the bandwidth.

It should be noticed that in order to double the bandwidth, it is necessary to have 6 metal lines (the double the minimum required 3 lines), which can be implemented by using a metal-5 process, provided it has the right pitch.

Color Filter for Pixel/Lixel with Variable Size

Pixel/Lixels Designs #2, #3 (a derivative of #2), #5, #6, and #7, #8, #9, #10, enable the grouping of 4 Pixels/Lixels for readout. For Black & White imaging, the choice of the two rows of Pixels/Lixels that are grouped during the readout process, can be arbitrary. For color imaging, the choice of the two rows of Pixels/Lixels that are grouped during the readout process must take into account the pattern of the color filter mosaic.

A conventional color filter mosaic, such as the Bayer pattern, used for CCDs and CMOS image sensors, cannot be used with the readout method that combines the output of 4 Pixels/Lixels into a single output signal, because it would mix signals from four different primary colors. A new color filter pattern is disclosed in the present invention that enables color imaging with the conventional readout process and a new readout process that combines the output signal of 4 adjacent Pixels/Lixels forming a square, having all the same primary color.

The essential feature of the new color filter patterns is that the 4 Pixels/Lixels whose output signal is combined, must have the same (primary) color filter. A conventional Bayer filter has 3 colors (RGB), with the number of sites for the Green color being the double of sites for either Blue or Red.

Figures 14A, 14B:
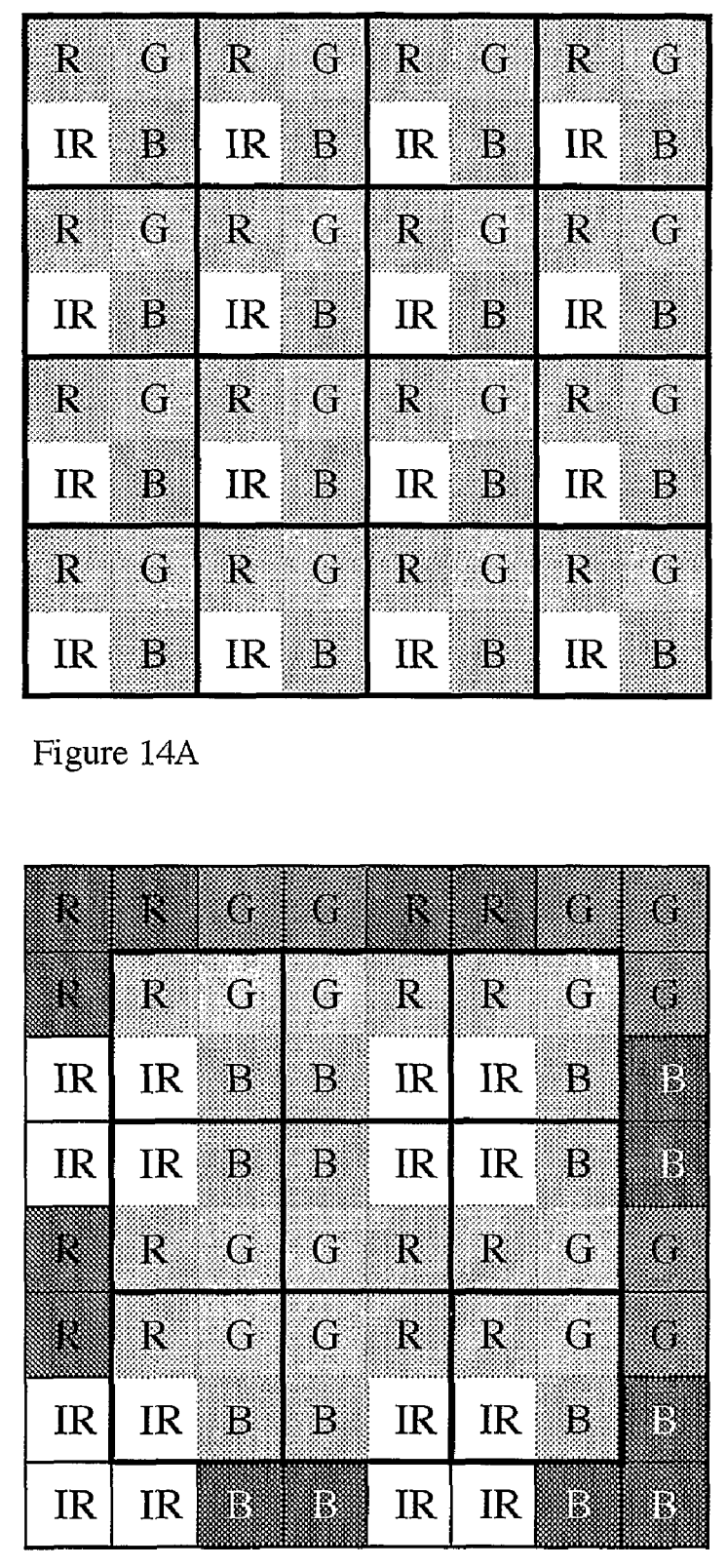

FIG. 14A shows conventional color filter pattern, showing 4 primary colors: Red (R), Green (G), Blue (B) and Infrared (IR). The geometric arrangement is similar to that of the Bayer pattern, except that the second site for Green, is replaced with a site for Infrared (IR).

The new color filter pattern as shown in FIG. 14B, has also advantages in terms of manufacturability and cost, as Pixel/Lixel pitch is aggressively scaled down. The advantage is that the pixel pitch in the new color filter is four times larger than the pixel pitch in the sensor matrix, and hence of a conventional color filter mosaic.

By replacing the IR filters in FIGS. 14A and 14B with a second Green filter, the Bayer pattern is obtained.

Demultiplexing, the Interconnects Between "Pixel/Lixel" Cells and Periphery

Increasing the bandwidth between the sensor/emitter matrix and the peripheral circuitry.

Pixel Design #4 has a unique feature in that each row-select line controls two horizontal rows of Pixels/Lixels. The horizontal rows of Pixels/Lixels are divided into groups of two rows whose Pixels/Lixels share the same row-select line. For any given vertical column of Pixels/Lixels, there are two column metal lines, each connecting to a separate, but identical, block of column circuitry at the periphery of the sensor/emitter matrix. Compared to Pixel/Lixel Design #1, and for a sensor/emitter matrix with the same number of Pixels/lixels, Pixel/Lixel Design #4 doubles the bandwidth between the sensor/emitter matrix and the periphery.

Pixel/Lixel Designs #3, #5, #6, and #7 have in common the fact that two Pixels/Lixels in the same horizontal row have their output multiplexed into a single column metal line. Normally multiplexing the output of two Pixels/Lixels into one column line, would cut in half the bandwidth between the sensor matrix and the peripheral circuitry. However, these Pixel/Lixel designs show how it is possible to use additional interconnect levels to increase the bandwidth between the sensor/emitter matrix and the peripheral circuitry.

Pixel/Lixel Design #6 shows that with a suitable Metal-4 layout, the bandwidth reduction caused by multiplexing the output of two Pixels/Lixels into the same column line, can be cancelled out. Such is achieved by constructing a Metal-4 layout in which the "basic cell" to be replicated, involves 4 horizontal rows and 2 vertical columns of Pixels/Lixels.

Pixel/Lixel Design #7, which is identical to Pixel/Lixel Design #6 until Metal-3, shows layouts for Via-3, Metal-4, Via-4 and Metal-5, in which the "basic cell" to be replicated, involves 8 horizontal rows and 2 vertical columns of Pixels/Lixels. This design results in a bandwidth between the sensor/emitter matrix and the peripheral circuitry that is the double of that achieved with Pixel/Lixel Design #6.

Pixel/Lixel Designs #6 and #7 show that the bandwidth between the sensor/emitter matrix and the peripheral circuitry can be double with every addition of one more metal layer. The Pixel/Lixel layout does not change until Metal-3. The layouts that need adjustment are Via-3, Metal-4, etc., until the last metal level. The adjustment of the layout comprises the doubling of the number of horizontal rows of Pixels/Lixels included in the "basic cell" to be replicated.

The scaling of CMOS technology enables the fabrication of smaller Pixels/Lixels. For a sensor/emitter matrix with constant area, which is tied to the size of the image circle produced by the lens system, halving the lateral size of a Pixel/Lixel results in 4 times more Pixels/Lixels. With conventional Pixel/Lixel designs the bandwidth available between the matrix and the peripheral circuitry does not change with scaling of the Pixels/Lixels.

For CMOS image sensors, with column-parallel readout, the time taken by the readout process increases linearly with the number of pixels in a given column. Assuming that the readout process is the main limitation for the frame-rate, increasing the number of pixels leads to slower frame-rates.

Conversely, wanting to keep the frame-rate as a constant (tied to video standards for example), increasing the number of Pixels/Lixels in the sensor/emitter matrix, can only be used for still imaging, and forces the use of "windowing" in order to maintain the total amount of time for readout to be a constant that is compatible with the minimum frame-rate required for video signals.

Pixel/Lixel Design #6 and #7 disclose how it is possible to simultaneously increase, by the same factor, the number of Pixels/Lixels and the bandwidth between the sensor/emitter matrix and the column circuitry.

This capability can be used to either: (1) Maintain the frame-rate and double the resolution; (2) Maintain the resolution and double the frame-rate; (3) A combination of 1 and 2.

The previously described software-controlled, "variable pixel size" method of Pixel/Lixel addressing, is independent any of the "hardware solutions" just discussed, and can be used simultaneously and in conjunction with any of them.

The invention claimed is:

1. An imaging device comprising a pixel matrix monolithically integrated with CMOS devices on a single-crystalline silicon-based semiconductor substrate, wherein:

the pixel matrix comprises a plurality of pixel cells, each cell consisting of one row-select transistor and one photonic device, said photonic device being disposed to alternatively absorb and emit light, depending on biasing conditions, in each pixel the row-select transistor and photonic device are formed on active areas, surrounded by isolation regions, on said substrate, each photonic device, comprising a plurality of epitaxial photonic device layers, a top electrode and a bottom electrode, is fabricated either on the same active area of the row-select transistor, or on an active area adjacent to, but separated from, the active area of the row-select transistor, in each pixel the row-select transistor comprises a source region connected to the photonic device and a drain region connected to metal interconnects, in each pixel the photonic device's top electrode is contacted through metal interconnects made over the entire pixel matrix, and the bottom electrode is connected to the source region of the row-select transistor, wherein the source region of the row-select transistor has the same doping polarity of the bottom electrode region of the photonic device, and said two regions are connected through a portion of the semiconductor substrate having the same doping polarity and which is electrically isolated from other pixels.

2. An imaging device according to claim 1, wherein the pixel matrix is formed on a bulk substrate, and wherein the isolation regions comprise shallow trench isolation structures and comprise deep trench isolation regions.

3. An imaging device according to claim 2, the row-select transistors inside pixels forming a row of the pixel matrix are fabricated on a row of potential wells that are all connected underneath shallow trench isolation, have a single contact from the edge of said row, at the periphery of the matrix, and are electrically isolated from the wells in adjacent rows, thereby enabling independent bias of rows of wells.

4. An imaging device according to claim 1, wherein the pixel matrix is formed on a thick-film SOI substrate, comprising a top silicon crystalline film, a buried insulator film, and a bottom silicon substrate, and wherein the isolation regions comprise shallow trench isolation structures and comprise deep trench isolation regions whose bottom reaches the SOI's buried oxide.

5. An imaging device according to claim 4, wherein the row-select transistors inside pixels forming a row of the pixel matrix are fabricated on a row of potential wells that are all connected underneath shallow trench isolation, have a single contact from the edge of said row, at the periphery of the pixel matrix, and are electrically isolated from the wells in adjacent rows, thereby enabling independent bias of rows of wells.

6. An imaging device according to claim 1, wherein for each column of pixel cells, multiple metal interconnect lines, in multiple levels of interconnects, can be used to provide multiple data column lines, connecting in parallel multiple pixel cells to multiple identical blocks of column-parallel circuitry, thereby enabling a reduction in the number of pixel cells connected to each data line, performing demultiplexing, resulting in increased bandwidth between the column of pixel cells and the periphery of the matrix of pixel cells.

7. The imaging device of claim 1 wherein the photonic device layers comprise epitaxial $Si_{1-x}Ge_x$, $Si_{1-y}C_y$, $Si_{1-y}Ge_xC_y$, $Ge_{1-y}C_y$, strained random alloys and/or superlattices.

8. An imaging device according to claim 7, wherein an externally applied electrical signal having an amplitude, a polarity and a phase that may be modulated and applied to the imaging device, wherein:
the polarity of said externally modulated electrical signal can be switched between positive and negative,
the amplitude of said externally modulated electrical signal can be larger than the operating voltage of the row-select transistor, and sufficient to trigger impact ionization inside the structure of said photonic device.

9. An imaging device according to claim 1, wherein an externally applied electrical signal having an amplitude, a polarity and a phase that may be modulated and applied to the imaging device, wherein:
the polarity of said externally modulated electrical signal can be switched between positive and negative,
the amplitude of said externally modulated electrical signal can be larger than the operating voltage of the row-select transistor, and sufficient to trigger impact ionization inside the structure of said photonic device.

10. An imaging device comprising a pixel matrix monolithically integrated with CMOS devices on a single-crystalline silicon-based semiconductor substrate, wherein:
the pixel matrix comprises a plurality of pixel cells, each cell consisting of one Row-select transistor and one photonic device, said photonic device being disposed to alternatively absorb and emit light, depending on biasing conditions,
in each pixel the row-select transistor and photonic device are formed on active areas, surrounded by isolation regions, on said substrate,
each photonic device, comprising a plurality of epitaxial photonic device layers, a top electrode and a bottom electrode, is fabricated either on the same active area of the row-select transistor, or on an active area adjacent to, but separated from, the active area of the row-select transistor,
in each pixel the row-select transistor comprises a source region connected to the photonic device and a drain region connected to metal interconnects,
in each pixel the photonic device's top electrode is contacted through metal interconnects made over the entire pixel matrix, and the bottom electrode is connected to the source region of the row-select transistor,
wherein the source region of the row-select transistor has the same doping polarity of the bottom electrode region of the photonic device, and said two regions are connected through a portion of the semiconductor substrate having the same doping polarity and which is electrically isolated from other pixels,
wherein the pixel matrix is formed on a bulk substrate, and wherein the isolation regions comprise shallow trench isolation structures and comprise deep trench isolation regions,
wherein the bulk substrate is doped with an impurity of a first polarity, the source and drain regions of the transistor are doped with impurities of a second polarity, and the active area on which the epitaxial photonic device layers are deposited is doped with impurities of the second polarity, wherein:
the region of the active area doped with impurities of the second polarity on which the epitaxial photonic device layers are deposited, is part of the bottom electrode of said photonic device, and is electrically connected through a conductive path to the drain region of said transistor, said conductive path being formed underneath a shallow trench isolation region by an implant to form a well doped with impurities of the second polarity,
for each pixel cell, the bottom electrode of the photonic device and said well region connecting it to the source/drain of said transistor are surrounded by regions doped with impurities of the first polarity, and thus electrically isolated from adjacent pixel cells,
the electrical isolation between adjacent pixel cells, in addition to said shallow trench isolation region further comprises substrate regions between adjacent pixel cells implanted with impurities of the first polarity, said substrate regions extending from the bottom of said shallow trench isolation regions deeper into the substrate, whereby said substrate regions form potential barriers for charge carriers of the second polarity between adjacent pixel cells, thereby blocking the transport of said charge carriers underneath the shallow trench isolation regions, and thus effectively suppressing crosstalk,
the top electrode of each photonic device is electrically contacted using metal interconnects over the entire pixel matrix.

11. An imaging device comprising a pixel matrix monolithically integrated with CMOS devices on a single-crystalline silicon-based semiconductor substrate, wherein:
the pixel matrix comprises a plurality of pixel cells, each cell consisting of one row-select transistor and one photonic device, said photonic device being disposed to alternatively absorb and emit light, depending on biasing conditions, in each pixel the row-select transistor and photonic device are formed on active areas, surrounded by isolation regions, on said substrate, each photonic device, comprising a plurality of epitaxial photonic device layers, a top electrode and a bottom electrode, is fabricated either on the same active area of the row-select transistor, or on an active area adjacent to, but separated from, the active area of the row-select transistor, in each pixel the row-select transistor comprises a source region connected to the photonic device and a drain region connected to metal interconnects, in each pixel the photonic device's top electrode is contacted through metal interconnects made over the entire pixel matrix, and the bottom electrode is connected to the source region of the row-select transistor, wherein the source region of the row-select transistor has the same doping polarity of the bottom electrode region of the photonic device, and said two regions are connected through a portion of the semiconductor substrate having the same doping polarity and which is electrically isolated from other pixels wherein the pixel matrix is formed on a thick-film SOI substrate, comprising a top silicon crystalline film, a buried insulator film, and a bottom silicon substrate, and wherein the isolation regions comprise shallow trench isolation structures and comprise deep trench isolation regions whose bottom reaches the SOI's buried oxide, wherein the top crystalline silicon film is doped with an impurity of a first polarity, the source and drain regions of the transistor are doped with impurities of a second polarity, and the active area on which the epitaxial photonic device layers are deposited is doped with impurities of the second polarity, wherein:

the region of the active area doped with impurities of the second polarity, on which the epitaxial photonic device layers are deposited, is part of the bottom electrode of said photonic device, and is electrically connected through a conductive path to the source/drain region of said transistor, said conductive path being formed underneath an isolation region by an implant to form a well doped with impurities of the second polarity, for each pixel cell, the bottom electrode of the photonic device, and said well region connecting it to the source/drain of said transistor, are surrounded by regions doped with impurities of the first polarity and thus electrically isolated from adjacent pixel cells, the electrical isolation between adjacent pixel cells, in addition to shallow trench isolation, further comprises deep trench isolation structures between adjacent pixel cells, extending from the top surface to the buried insulator of the SOI substrate, thereby effectively suppressing crosstalk, the top electrode of each photonic device is electrically contacted using metal interconnects over the entire pixel matrix.

12. An imaging device comprising a pixel matrix monolithically integrated with CMOS devices on a single-crystalline silicon-based semiconductor substrate, wherein:

the pixel matrix comprises a plurality of pixel cells, each cell consisting of one row-select transistor and one photonic device, said photonic device being disposed to alternatively absorb and emit light, depending on biasing conditions, in each pixel the row-select transistor and photonic device are formed on active areas, surrounded by isolation regions, on said substrate, each photonic device, comprising a plurality of epitaxial photonic device layers, a top electrode and a bottom electrode, is fabricated either on the same active area of the row-select transistor, or on an active area adjacent to, but separated from, the active area of the row-select transistor, in each pixel the row-select transistor comprises a source region connected to the photonic device and a drain region connected to metal interconnects, in each pixel the photonic device's top electrode is contacted through metal interconnects made over the entire pixel matrix, and the bottom electrode is connected to the source region of the row-select transistor, wherein the source region of the row-select transistor has the same doping polarity of the bottom electrode region of the photonic device, and said two regions are connected through a portion of the semiconductor substrate having the same doping polarity and which is electrically isolated from other pixels, wherein the pixel matrix is formed on a thin-film Silicon-On-Insulator (SOI) or Germanium-On-Insulator (GOI) substrate, comprising a top silicon or top germanium crystalline film, respectively, further comprising a buried insulator film and a bottom silicon substrate.

13. An imaging device according to claim 12, wherein the top crystalline silicon film of the thin-film SOI or thin-film GOI substrate is doped with an impurity of a first polarity, the source and drain regions of the transistor are doped with impurities of a second polarity, and the active area on which the photonic device layers are deposited is doped with impurities of the second polarity, wherein:

the region of the active area doped with impurities of the second polarity, on which the epitaxial photonic device layers are deposited, is part of the bottom electrode of said photonic device, which is contiguous to the source/drain region of said transistor, for each pixel cell, the bottom electrode of the photonic device, and the contiguous source/drain of said transistor are surrounded laterally by field isolation regions that reach the buried insulator, and underneath by the buried insulator of the SOI or GOI substrate, and are thus electrically isolated from adjacent pixel cells by regions of dielectric materials, the top electrode of each photonic device is electrically contacted using metal interconnects over the entire pixel matrix.

14. An imaging device according to claim 13, wherein after all process steps for the metal interconnects and passivation layer are finished on the front-side of the SOI or GOI semiconductor substrate, the semiconductor substrate providing mechanical support to the buried insulator and top crystalline semiconductor film is removed, allowing the fabrication of color filters on the thusly exposed back-side of the buried insulator of said SOI or GOI substrate, which is optionally subsequently attached to a new transparent substrate, thereby enabling color filtering of light sensing and/or light emission through the back-side.

15. An imaging device comprising a pixel matrix monolithically integrated with CMOS devices on a single-crystalline silicon-based semiconductor substrate, wherein:

the pixel matrix comprises a plurality of pixel cells, each cell consisting of one row-select transistor and one photonic device, said photonic device being disposed to alternatively absorb and emit light, depending on biasing conditions, in each pixel the row-select transistor and photonic device are formed on active areas, surrounded by isolation regions, on said substrate, each photonic device, comprising a plurality of epitaxial photonic device layers, a top electrode and a bottom electrode, is fabricated either on the same active area of the row-select transistor, or on an active area adjacent to, but separated from, the active area of the row-select transistor, in each pixel the row-select transistor comprises a source region connected to the photonic device and a drain region connected to metal interconnects, in each pixel the photonic device's top electrode is contacted through metal interconnects made over the entire pixel matrix, and the bottom electrode is connected to the source region of the row-select transistor, wherein the source region of the row-select transistor has the same doping polarity of the bottom electrode region of the photonic device, and said two regions are connected through a portion of the semiconductor substrate having the same doping polarity and which is electrically isolated from other pixels wherein a pixel cell comprises four adjacent pixels, located on two adjacent rows and on two adjacent columns, the four adjacent pixels being connected to a single block of column-parallel circuitry through a single metal line, and wherein row-select lines corresponding to the four adjacent pixels can be actuated simultaneously, thereby resulting in a 2×2 pixel binning.

16. An imaging device according to claim 15, wherein the pixel cells allowing 2×2 pixel binning are aligned with a 2-dimensional color filter array, to provide color capability for the imaging device, said color filter array comprising:

four or less primary colors, wherein filters of each primary color are arranged into cells of four adjacent filters, located on two adjacent rows and on two adjacent columns, and wherein said color filter array is aligned with a pixel matrix such that each of the primary color filters in a filter cell, is aligned with a pixel in a pixel cell that allows 2×2 pixel binning.

17. An imaging device comprising a pixel matrix monolithically integrated with CMOS devices on a single-crystalline bulk silicon semiconductor substrate, wherein:

the pixel matrix comprises a plurality of pixel cells, each cell consisting of one row-select transistor and one photonic device, said photonic device being disposed to alternatively absorb and emit light, depending on biasing conditions, in each pixel the row-select transistor and photonic device are formed on active areas, surrounded by isolation regions, on said substrate, each photonic device, comprising a plurality of epitaxial photonic device layers, a top electrode and a bottom electrode, is fabricated on an active area adjacent to, but separated from, the active area of the row-select transistor, in each pixel the row-select transistor comprises a source region connected to the photonic device and a drain region connected to metal interconnects, in each pixel the photonic device's top electrode is contacted through metal interconnects made over the entire pixel matrix, and the bottom electrode is connected to the source region of the row-select transistor, wherein the source region of the row-select transistor has the same doping polarity of the bottom electrode region of the photonic device, and said two regions are connected through a portion of the semiconductor substrate having the same doping polarity and which is electrically isolated from other pixels, such as an independently-biased CMOS well, in each pixel the row-select transistor comprises a source region connected to the photonic device and a drain region connected to metal interconnects, in each pixel the photonic device's top electrode is contacted through metal interconnects made over the entire pixel matrix, and the bottom electrode is connected to the source region of the row-select transistor, wherein the layout of the masking layers for the contact layer, for each different via layer, and each different metal-layer, incorporate dummy shapes aligned and centered on the boundaries between adjacent pixels, thereby building optically reflective walls around each pixel and thus suppress optical crosstalk between adjacent pixels, while preserving electrical functionality.

18. The imaging device of claim 17 wherein in each row the pixels are grouped into 2-pixel cells in which the row-select transistors from each pixel are made on the same active region, share a common drain region and share the contact and metal interconnects to said drain region, and in which the gates of each row-select transistor, disposed symmetrically with respect to a vertical line of symmetry, are connected to the periphery of the pixel matrix by separate metal interconnect lines.

19. The imaging device of claim 18, in which groups of rows in the pixel matrix are formed by having separate metal interconnect lines to the contact to the drain of the row-select transistor in each pixel, thereby de-multiplexing the electrical connections of pixels in the same column of the pixel matrix, into multiple separate metal lines.

20. The imaging device of claim 17 wherein in each column the pixels are grouped into 2-pixel cells in which the row-select transistors from each pixel are made on separate active regions but share the same gate contact and metal interconnects to said gate contact, and in which the drains of each row-select transistor are connected to the periphery of the pixel matrix by separate metal interconnect lines.

21. The imaging device of claim 17 wherein for the 2 pixels in the same row the row-select transistors from each pixel are made on the same active region, share a common drain region and share the contact and metal interconnects to said drain region, and in which the gates of each row-select transistor are connected to the periphery of the pixel matrix by separate metal interconnect lines, wherein for the 2 pixels in the same column the row-select transistors from each pixel are made on separate active regions but share the same gate contact and metal interconnects to said gate contact, and in which the drains of each row-select transistor are connected to the periphery of the pixel matrix by separate metal interconnect lines.

22. The imaging device of claim 19, in which the gates of the row-select transistors in the same cell are symmetrically disposed with respect to vertical and horizontal lines of symmetry running between said gates, with the contacts to each gate being on opposite sides of the shared active region.

23. The imaging device of claim 22, in which additional metal interconnect lines, provided by an additional interconnect level, enables further demultiplexing of the electrical connections of pixels in the same column of the pixel matrix, into additional separate metal lines for each column of the pixel matrix.

24. An imaging device comprising a pixel matrix monolithically integrated with CMOS devices on a single-crystalline thick-film silicon-on-insulator (SOI) semiconductor substrate, wherein:

the pixel matrix comprises a plurality of pixel cells, each cell consisting of one row-select transistor and one photonic device, said photonic device being disposed to alternatively absorb and emit light, depending on biasing conditions, in each pixel the row-select transistor and photonic device are formed on active areas, surrounded by isolation regions, on said substrate, each photonic device, comprising a plurality of epitaxial photonic device layers, a top electrode and a bottom electrode and, is fabricated on an active area adjacent to, but separated from, the active area of the row-select transistor, in each pixel the row-select transistor comprises a source region connected to the photonic device and a drain region connected to metal interconnects, in each pixel the photonic device's top electrode is contacted through metal interconnects made over the entire pixel matrix, and the bottom electrode is connected to the source region of the row-select transistor, wherein the source region of the row-select transistor has the same doping polarity of the bottom electrode region of the photonic device, and said two regions are connected through a portion of the semiconductor substrate having the same doping polarity and which is electrically isolated from other pixels, including an independently-biased CMOS well, in each pixel the row-select transistor comprises a source region connected to the photonic device and a drain region connected to metal interconnects, in each pixel the photonic device's top electrode is contacted through metal interconnects made over the entire pixel matrix, and the bottom electrode is connected to the source region of the row-select transistor, wherein the layout of the masking layers for the contact layer, for each different via layer, and each different metal-layer, incorporate dummy shapes aligned and centered on the boundaries between adjacent pixels, thereby building optically reflective walls around each pixel and thus suppress optical crosstalk between adjacent pixels, while preserving electrical functionality, wherein in each row the pixels are grouped into 2-pixel cells in which the row-select transistors from each pixel are made on the same active region, share a common drain region and share the contact and metal interconnects to said drain region, and in which the gates of each row-select transistor, disposed symmetrically with respect to vertical and horizontal lines of symmetry, are connected to the periphery of the pixel matrix by separate metal interconnect lines, wherein deep trench isolation, reaching the insulator region underneath the top silicon crystalline film, electrically isolate the cells of pixels formed on pair of adjacent columns, from other cells of pixels formed in other pairs of adjacent columns, all row-select transistors from pixel cells formed in one pair of adjacent columns share the same potential well, that is isolated from the potential wells of other pairs of adjacent columns of pixel cells by deep trench isolation and that is contacted through a well contact made at the periphery of the pixel matrix, thereby enabling the independent biasing of said potential wells on a column-by-column basis.

25. An imaging device comprising a pixel matrix monolithically integrated with CMOS devices on a single-crystalline thick-film silicon-on-insulator (SOI) semiconductor substrate, wherein:

the pixel matrix comprises a plurality of pixel cells, each cell consisting of one row-select transistor and one photonic device, said photonic device being disposed to alternatively absorb and emit light, depending on biasing conditions, in each pixel the row-select transistor and photonic device are formed on active areas, surrounded by isolation regions, on said substrate, each photonic device, comprising a plurality of epitaxial photonic device layers, a top electrode and a bottom electrode, is fabricated on an active area adjacent to, but separated from, the active area of the row-select transistor, in each pixel the row-select transistor comprises a source region connected to the photonic device and a drain region connected to metal interconnects, in each pixel the photonic device's top electrode is contacted through metal interconnects made over the entire pixel matrix, and the bottom electrode is connected to the source region of the row-select transistor, wherein the source region of the row-select transistor has the same doping polarity of the bottom electrode region of the photonic device, and said two regions are connected through a portion of the semiconductor substrate having the same doping polarity and which is electrically isolated from other pixels, including an independently-biases CMOS well, in each pixel the row-select transistor comprises a source region connected to the photonic device and a drain region connected to metal interconnects, in each pixel the photonic device's top electrode is contacted through metal interconnects made over the entire pixel matrix, and the bottom electrode is connected to the source region of the row-select transistor, wherein the layout of the masking layers for the contact layer, for each different via layer, and each different metal-layer, incorporate dummy shapes aligned and centered on the boundaries between adjacent pixels, thereby building optically reflective walls around each pixel and thus suppress optical crosstalk between adjacent pixels, while preserving electrical functionality, wherein in each row the pixels are grouped into 2-pixel cells in which the row-select transistors from each pixel are made on the same active region, share a common drain region and share the contact and metal interconnects to said drain region, and in which the gates of each row-select transistor, disposed symmetrically with respect to vertical and horizontal lines of symmetry, are connected to the periphery of the pixel matrix by separate metal interconnect lines, wherein deep trench isolation, reaching the insulator region underneath the top silicon crystalline film, electrically isolate the cells of pixels formed on pair of adjacent rows, from other cells of pixels formed in other pairs of adjacent rows, all row-select transistors from pixel cells formed in one pair of adjacent rows share the same potential well, that is isolated from the potential wells of other pairs of adjacent rows of pixel cells by deep trench isolation and that is contacted through a well contact made at the periphery of the pixel matrix, thereby enabling the independent biasing of said potential wells on a row-by-row basis.

26. An imaging device comprising a pixel matrix monolithically integrated with CMOS devices on a single-crystalline thin-film silicon-on-insulator (SOI) or thin-film germanium-on-insulator (GOI or GeOI) semiconductor substrate, wherein:

the pixel matrix comprises a plurality of pixel cells, each cell consisting of one row-select transistor and one photonic device, said photonic device being disposed to alternatively absorb and emit light, depending on biasing conditions, in each pixel the row-select transistor and photonic device are formed on active areas, surrounded by isolation regions, on said substrate, each photonic device, comprising a plurality of epitaxial photonic device layers, a top electrode and a bottom electrode, is fabricated on the same active area of the row-select transistor, in each pixel the row-select transistor comprises a source region connected to the photonic device and a drain region connected to metal interconnects, in each pixel the photonic device's top electrode is contacted through metal interconnects made over the entire pixel matrix, and the bottom electrode is connected to the source region of the row-select transistor, wherein the source region of the row-select transistor has the same doping polarity of the bottom electrode region of the photonic device, and said two regions are connected through a portion of the semiconductor substrate having the same doping polarity and which is electrically isolated from other pixels, in each pixel the row-select transistor comprises a source region connected to the photonic device and a drain region connected to metal interconnects, in each pixel the photonic device's top electrode is contacted through metal interconnects made over the entire pixel matrix, and the bottom electrode is connected to the source region of the row-select transistor, wherein the layout of the masking layers for the contact layer, for each different via layer, and each different metal-layer, incorporate dummy shapes aligned and centered on the boundaries between adjacent pixels, thereby building optically reflective walls around each pixel and thus suppress optical crosstalk between adjacent pixels, while preserving electrical functionality, wherein in each row the pixels are grouped into 2-pixel cells in which the row-select transistors from each pixel are made on the same active region, share a common drain region and share the contact and metal interconnects to said drain region, and in which the gates of each row-select transistor, disposed symmetrically with respect to vertical and horizontal lines of symmetry, are connected to the periphery of the pixel matrix by separate metal interconnect lines.

* * * * *